(12) United States Patent
Facchetti et al.

(10) Patent No.: US 9,035,004 B2
(45) Date of Patent: May 19, 2015

(54) SEMICONDUCTING COMPOUNDS AND DEVICES INCORPORATING SAME

(75) Inventors: Antonio Facchetti, Chicago, IL (US); Chun Huang, Skokie, IL (US); Hualong Pan, Skokie, IL (US)

(73) Assignee: Polyera Corporation, Skokie, IL (US)

( * ) Notice: Subject to any disclaimer, the term of this patent is extended or adjusted under 35 U.S.C. 154(b) by 125 days.

(21) Appl. No.: 13/564,664

(22) Filed: Aug. 1, 2012

(65) Prior Publication Data
US 2013/0035464 A1 Feb. 7, 2013

Related U.S. Application Data

(60) Provisional application No. 61/513,874, filed on Aug. 1, 2011.

(51) Int. Cl.
| | | |
|---|---|---|
| C08F 28/06 | (2006.01) | |
| C08G 61/12 | (2006.01) | |
| H01L 51/00 | (2006.01) | |
| H01L 51/05 | (2006.01) | |
| H01L 51/42 | (2006.01) | |

(52) U.S. Cl.
CPC ............ *C08G 61/123* (2013.01); *C08G 61/124* (2013.01); *C08G 61/126* (2013.01); *C08G 2261/1412* (2013.01); *C08G 2261/1424* (2013.01); *C08G 2261/3223* (2013.01); *C08G 2261/3243* (2013.01); *C08G 2261/3246* (2013.01); *C08G 2261/344* (2013.01); *C08G 2261/411* (2013.01); *C08G 2261/512* (2013.01); *C08G 2261/59* (2013.01); *H01L 51/0043* (2013.01); *H01L 51/0558* (2013.01); *H01L 51/4253* (2013.01)

(58) Field of Classification Search
USPC ............. 136/263; 526/256; 257/40, E51.005, 257/E51.018; 528/377, 380
See application file for complete search history.

(56) References Cited

U.S. PATENT DOCUMENTS

2012/0264906 A1* 10/2012 Marks et al. .................... 528/86

* cited by examiner

*Primary Examiner* — Shane Fang
(74) *Attorney, Agent, or Firm* — Karen K. Chan

(57) ABSTRACT

Disclosed are molecular and polymeric compounds having desirable properties as semiconducting materials. Such compounds can exhibit desirable electronic properties and possess processing advantages including solution-processability and/or good stability.

15 Claims, 10 Drawing Sheets

SEMICONDUCTING COMPOUNDS AND DEVICES INCORPORATING SAME

CROSS REFERENCE TO RELATED APPLICATIONS

This application claims priority to and the benefit of U.S. Provisional Patent Application Ser. No. 61/513,874, filed on Aug. 1, 2011, the disclosure of which is incorporated by reference herein in its entirety.

BACKGROUND

A new generation of electronic, optical, and optoelectronic devices such as organic thin film transistors (OTFTs), organic light-emitting transistors (OLETs), organic light-emitting diodes (OLEDs), and organic photovoltaics (OPVs) are fabricated using organic semiconductors as their active components. To be commercially relevant, these organic semiconductor-based devices should be processable in a cost-effective manner.

Several p- and n-channel TFT organic semiconductors have achieved acceptable device performance. For example, OTFTs based on acenes and oligothiophenes (p-channel) and perylenes (n-channel) exhibit carrier mobilities ($\mu$)>0.5 cm²/V·s in ambient conditions. Furthermore, a variety of polymeric and molecular semiconductor materials incorporating one or more fused thiophene rings have been synthesized and/or proposed as organic semiconductor building blocks. Although many of these materials exhibit acceptable carrier mobilities, some improvement such as processability via printing methodologies is required for commercial feasibility. For example, pentacene exhibits high hole mobility >5 cm²/V·s with its highly crystalline nature, but cannot be processed via printing methodologies due to its insolubility.

Accordingly, the art desires new polymeric and molecular semiconductors, particularly those having well-balanced semiconducting properties and processing properties.

SUMMARY

In light of the foregoing, the present teachings provide polymeric and molecular semiconductors that can address various deficiencies and shortcoming of the prior art, including those outlined above. Also provided are associated devices and related methods for the preparation and use of these semiconductors. The present semiconductors can exhibit properties such as excellent charge transport characteristics, low temperature processability, satisfactory solubility in common solvents, and processing versatility (e.g., printability). As a result, field effect devices such as thin film transistors that incorporate one or more of the present semiconductors can exhibit high performance, for example, demonstrating one or more of large hole mobility, large electron mobility, low threshold voltages, and high current on-off ratios. Similarly, other organic semiconductor-based devices such as OPVs, OLETs, and OLEDs can be fabricated efficiently using the organic semiconductor materials described herein.

Generally, the present teachings provide polymeric semiconducting compounds having a repeating unit represented by formula (I):

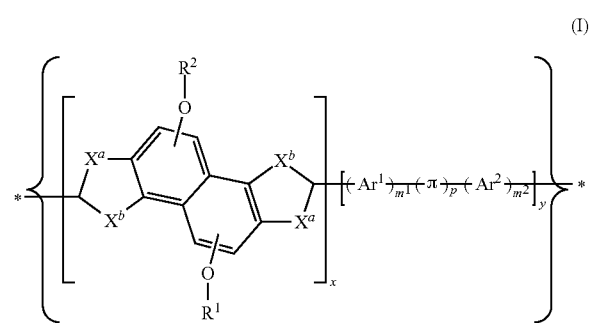

and molecular semiconducting compounds represented by formula (II):

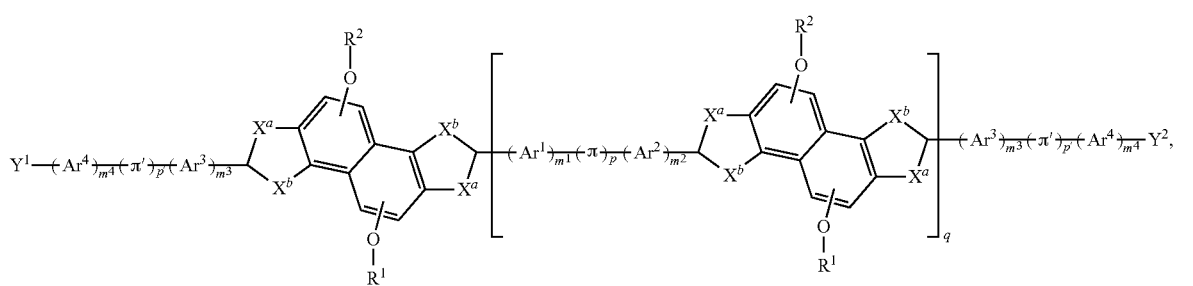

wherein $R^1$, $R^2$, $Ar^1$, $Ar^2$, $Ar^3$, $Ar^4$, $X^a$, $X^b$, $Y^1$, $Y^2$, $\pi$, $\pi'$, $m^1$, $m^2$, $m^3$, $m^4$, p, p', q, x and y are as defined herein.

The present teachings also provide methods of preparing semiconductor materials using such polymeric and molecular semiconducting compounds, as well as various compositions, composites, and devices that incorporate the polymeric and molecular semiconducting compounds disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
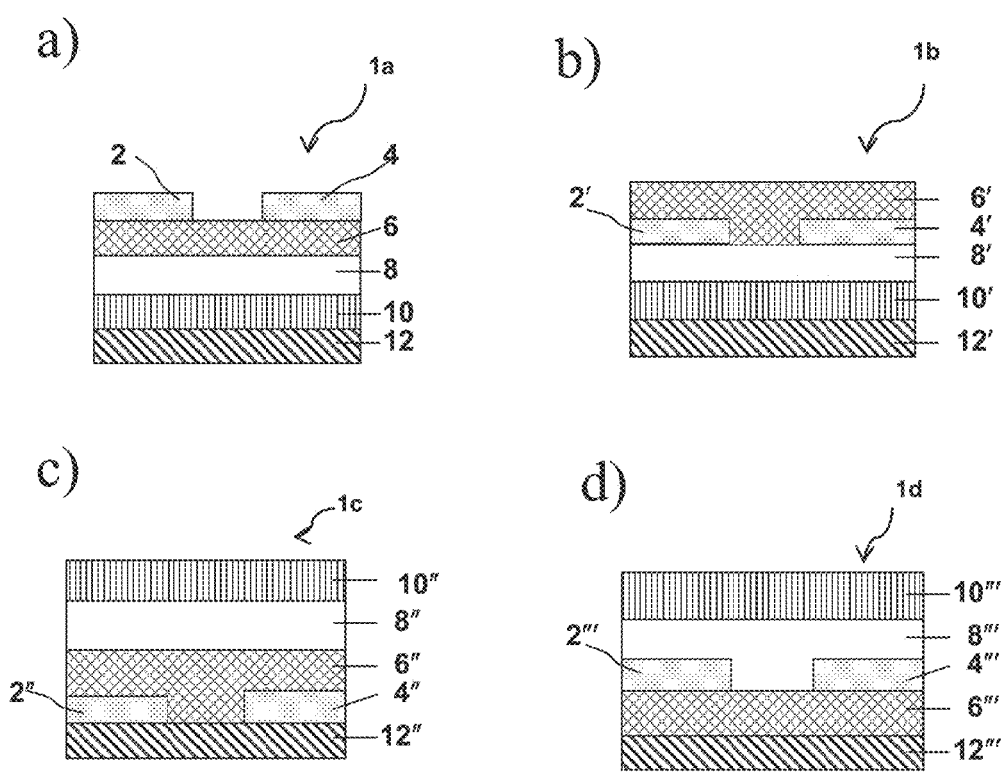
FIG. 1 illustrates four different configurations of thin film transistors: bottom-gate top contact (a), bottom-gate bottom-contact (b), top-gate bottom-contact (c), and top-gate top-contact (d); each of which can be used to incorporate compounds of the present teachings.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymeric compound" (or "polymer") refers to a molecule including a plurality of one or more repeating units connected by covalent chemical bonds. As used herein, a repeating unit in a polymer must repeat itself at least twice (as specified by its degree of polymerization) in the polymer. A polymer can be represented by the general formula:

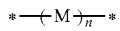

wherein M is the repeating unit or monomer. The degree of polymerization (n) can range from 2 to greater than 10,000, typically in the range from 5 to about 10,000. The polymer can have only one type of repeating unit as well as two or more types of different repeating units. When a polymer has only one type of repeating unit, it can be referred to as a homopolymer. When a polymer has two or more types of different repeating units, the term "copolymer" can be used instead. The polymer can be linear or branched. Branched polymers can include dendritic polymers, such as dendronized polymers, hyperbranched polymers, brush polymers (also called bottle-brushes), and the like. Unless specified otherwise, the assembly of the repeating units in a copolymer can be head-to-tail, head-to-head, or tail-to-tail. In addition, unless specified otherwise, the copolymer can be a random copolymer, an alternating copolymer, or a block copolymer. For example, the general formula:

can be used to represent a copolymer of A and B having x mole fraction of A and y mole fraction of B in the copolymer, where the manner in which comonomers A and B is repeated can be alternating, random, regiorandom, regioregular, or in blocks.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

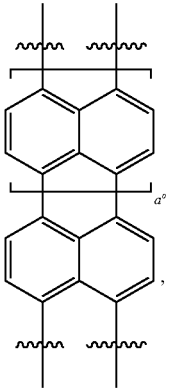

where $a^o$ can be an integer in the range of 0-3; coronenes (or analogs thereof containing one or more heteroatoms) having the formula:

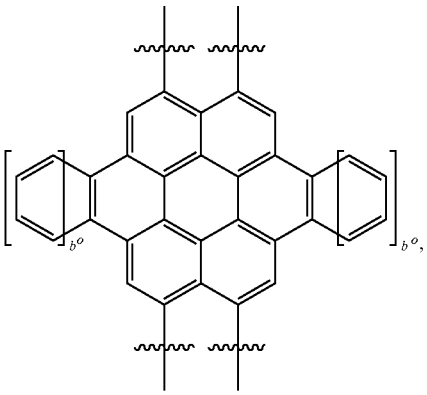

where $b^o$ can be an integer in the range of 0-3; linear acenes (or analogs thereof containing one or more heteroatoms) having the formula:

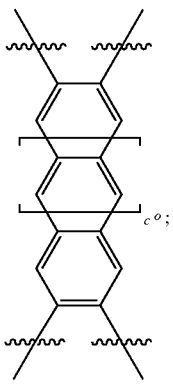

where $c^o$ can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_sH_{2s+1-t}X^o{}_t$, where $X^o$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxy, hexoxy groups, and the like. The alkyl group in the —O-alkyl group can be substituted as described herein. For example, an —O-haloalkyl group is considered within the definition of "alkoxy" as used herein.

As used herein, "alkylthio" refers to an —S-alkyl group (which, in some cases, can be expressed as —S(O)$_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is defined as a divalent alky group that can be optionally substituted as described herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O-O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

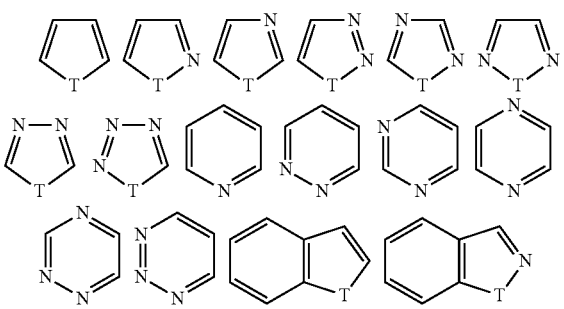

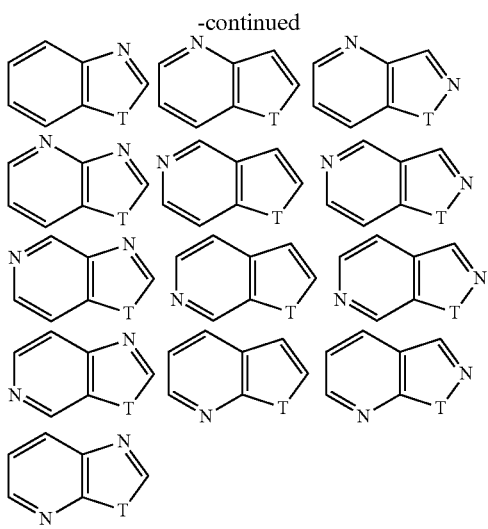

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent C$_{1-20}$ alkyl group (e.g., a methylene group), a divalent C$_{2-20}$ alkenyl group (e.g., a vinylyl group), a divalent C$_{2-20}$ alkynyl group (e.g., an ethynylyl group). a divalent C$_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —NO$_2$, CN, —NC, —S(R$^0$)$_2^+$, —N(R$^0$)$_3^+$, —SO$_3$H, —SO$_2$R$^0$, —SO$_3$R$^0$, —SO$_2$NHR$^0$, —SO$_2$N(R$^0$)$_2$, —COOH, —COR$^0$, —COOR$^0$, —CONHR$^0$, —CON(R$^0$)$_2$, C$_{1-40}$ haloalkyl groups, C$_{6-14}$ aryl groups, and 5-14 membered electron-poor heteroaryl groups; where R$^0$ is a C$_{1-20}$ alkyl group, a C$_{2-20}$ alkenyl group, a C$_{2-20}$ alkynyl group, a C$_{1-20}$ haloalkyl group, a C$_{1-20}$ alkoxy group, a C$_{6-14}$ aryl group, a C$_{3-14}$ cycloalkyl group, a 3-14 membered cycloheteroalkyl group, and a 5-14 membered heteroaryl group, each of which can be optionally substituted as described herein. For example, each of the C$_{1-20}$ alkyl group, the C$_{2-20}$ alkenyl group, the C$_{2-20}$ alkynyl group, the C$_{1-20}$ haloalkyl group, the C$_{1-20}$ alkoxy group, the C$_{6-14}$ aryl group, the C$_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —NO$_2$, —CN, —NC, —S(R$^0$)$_2^+$, —N(R$^0$)$_3^+$, —SO$_3$H, —SO$_2$R$^0$, —SO$_3$R$^0$, —SO$_2$NHR$^0$, —SO$_2$N(R$^0$)$_2$, —COOH, —COR$^0$, —COOR$^0$, —CONHR$^0$, and —CON(R$^0$)$_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR$^0$, —NH$_2$, —NHR$^0$, —N(R$^0$)$_2$, and 5-14 membered electron-rich heteroaryl groups, where R$^0$ is a C$_{1-20}$ alkyl group, a C$_{2-20}$ alkenyl group, a C$_{2-20}$ alkynyl group, a C$_{6-14}$ aryl group, or a C$_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "C$_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

As used herein, fill factor (FF) is the ratio (given as a percentage) of the actual maximum obtainable power, ($P_m$ or $V_{mp}*J_{mp}$), to the theoretical (not actually obtainable) power, ($J_{sc} \times V_{oc}$). Accordingly, FF can be determined using the equation:

$$FF = (V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

Throughout the specification, structures may or may not be presented with chemical names. Where any question arises as to nomenclature, the structure prevails.

The present teachings provide organic semiconductor materials that include polymeric and molecular semiconducting compounds and associated compositions, composites, and/or devices. Organic semiconductor materials of the present teachings can exhibit semiconducting behavior such as high carrier mobility and/or good current modulation characteristics in a field-effect device, light absorption/charge separation in a photovoltaic device, and/or charge transport/recombination/light emission in a light-emitting device. In addition, the present materials can possess certain processing advantages such as solution-processability. The materials of the present teachings can be used to fabricate various organic electronic articles, structures and devices, including field-effect transistors, unipolar circuitries, complementary circuitries, photovoltaic devices, and light emitting devices.

Although traditional π-conjugated polymers have been used as semiconductors in both organic thin film transistor (OTFT) and organic photovoltaic (OPV) cell applications, large-scale commercial exploitation remains a challenge. For example, with respect to OPV applications, although various alternating copolymers comprising electron-rich (donor) and electron-deficient (acceptor) heteroaromatic units have been reported, significant PCE improvement is necessary to meet large scale commercialization requirements. Examples of electron-rich heteroaromatic units include dithiophene, dialkylbenzodithiophene (Alk-TBT), dialkoxybenzodithiophene (AlkO-TBT), dialkoxyanthracenes (AlkO-ANT), cyclopentadithiophene, carbazole, dibenzo(thieno)silole, and fluorene, whereas examples of electron-deficient heteroaromatic units include benzothiadiazole, quinoxaline, thienoimide (thieno[3,4-c]pyrrole-4,6-dione), and diketopyrrolo-pyrrole (DPP).

Another key requirement for commercially relevant applications, particularly for the OPV semiconductors, is chemical stability during operation, considering that the material is exposed simultaneously to both air ($O_2$) and light. Typical benzo/thieno-fused donor units such as TBT, ANT, as well as other n-acenes react with singlet oxygen to give cycloadducts creating π-insulating linkage points in the unit:

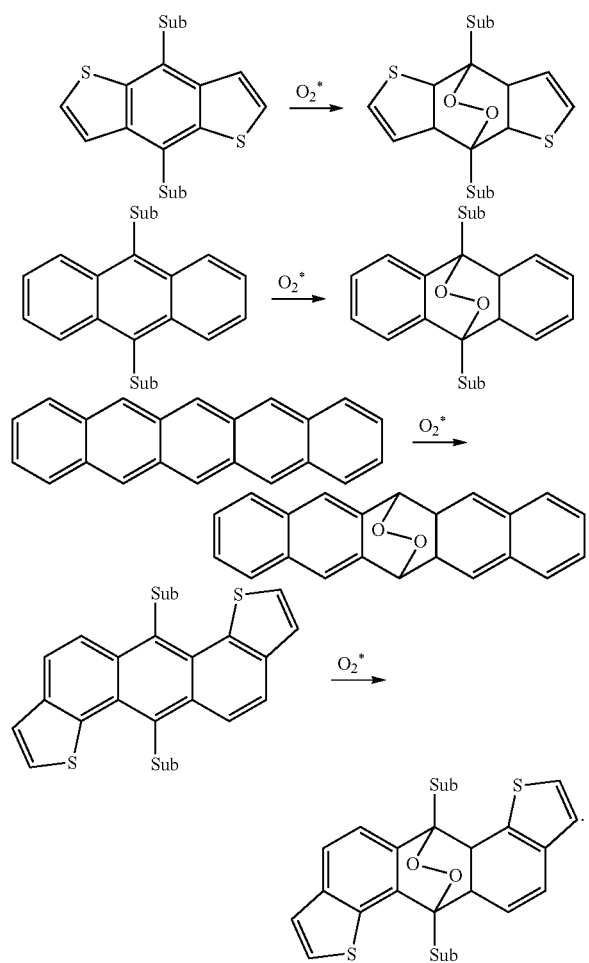

See e.g., Yamada et al., "Photochemical synthesis of pentacene and its derivatives," *Chemistry* (Weinheim an der Bergstrasse, Germany), 11(21): 6212-20 (2005); Vollmer et al., "The effect of oxygen exposure on pentacene thin film electronic structure," *Materials Research Society Symposium Proceedings*, 871E (Organic Thin-Film Electronics) (2005); Venedictov et al., "The effect of solvent on tetracene oxidation by singlet molecular oxygen: aspects of specific solvation," *Tetrahedron Letters*, 44(15): 3215-3216 (2003); Chien et al., "Theoretical Study of the Diels-Alder Reactions between Singlet Oxygen and Acenes," *Journal of Physical Chemistry A*, 109(33): 7509-7518 (2005); Monroe, Bruce M., "Rates of reaction of singlet oxygen with olefins," *Journal of Physical Chemistry*, 82(1): 15-18 (1978); Schmitz et al., "A new access to the anthracene core. Synthesis of two water-soluble singlet oxygen traps derived from 1,3-diphenyl-isobenzofuran and 9,10-diphenylanthracene," *Tetrahedron*, 38(10): 1425-30 (1982); Reddy et al., "Diels-Alder reaction of acenes with singlet and triplet oxygen—theoretical study of two-state reactivity," *Chemical Communications* (Cambridge, United Kingdom), (11): 1179-1181 (2006); and Fudickar et al., "Reversible Light and Air-Driven Lithography by Singlet Oxygen," *Journal of the American Chemical Society*, 127(26): 9386-9387 (2005).

Accordingly, an objective of the present teachings includes providing organic semiconductor materials that can exhibit improved photostability compared to state-of-the-art benzo-fused aromatic units such as benzodithiophenes.

Without wishing to be bound to any particular theory, the inventors have discovered that by providing π-conjugated units having a bent molecular architecture, the photostability of the π-conjugated core can be improved as the core becomes less susceptible to reactions with dioxygen and other dienophiles. Particularly, the use of a naphtho unit fused with two thiophene ring at the a,d (a,d-NDT) positions results in a structure where cycloaddition of dioxygen can be strongly reduced. In fact, unlike, for instance, AlkO-TBT, where upon cycloaddition of $O_2$, only the aromaticity of one ring is lost, in the case of a,b-NDT, two rings would lose the aromaticity. As such, the large activation energy required generally prevents the reaction to occur:

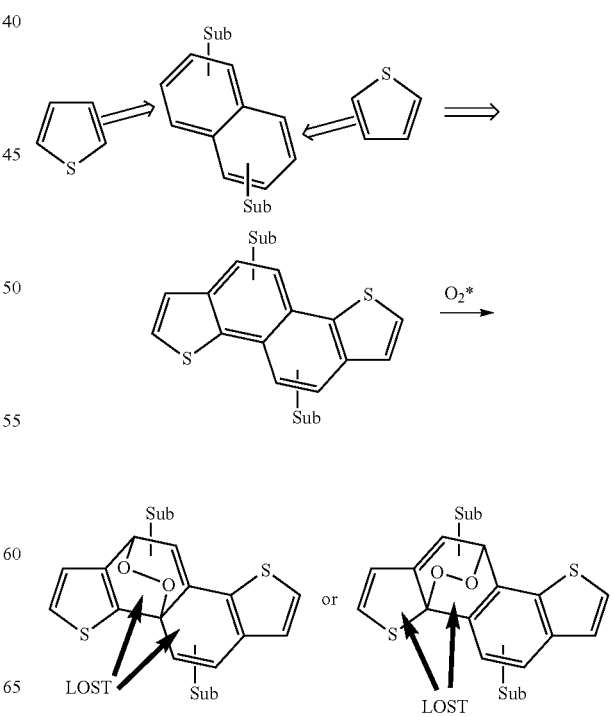

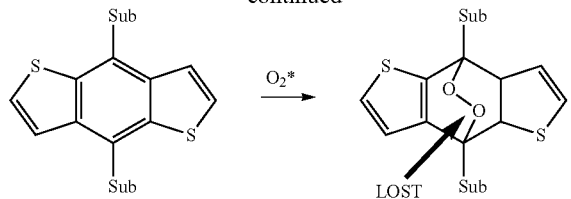

In addition, substituting the NDT bent cores with alkoxy groups also results in a favorable adjustment of the highest occupied molecular orbital (HOMO) energy level, which is particularly important for OTFT applications.

Accordingly, in one aspect, the present teachings relate to polymeric semiconducting compounds, as well as the use of these compounds in electronic, optoelectronic, or optical devices. The polymeric compounds (or polymers) according to the present teachings generally have a repeating unit that can be represented by formula (I):

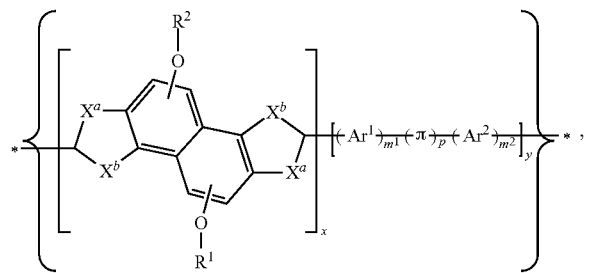

wherein:
$X^a$ and $X^b$ are CH or S, provided that only $X^a$ or $X^b$ is S;
$R^1$ and $R^2$, at each occurrence, independently are a $C_{1-20}$ alkyl group or a $C_{1-20}$ haloalkyl group;
$Ar^1$ and $Ar^2$, at each occurrence, independently are an optionally substituted $C_{6-14}$ aryl group or an optionally substituted 5-14 membered heteroaryl group;
π, at each occurrence, independently is an optionally substituted polycyclic aryl group, an optionally substituted polycyclic heteroaryl group, or an optionally substituted conjugated linear linker;
$m^1$ and $m^2$, at each occurrence, independently are 0, 1, 2, 3 or 4;
p, at each occurrence, independently is 0 or 1;
x and y are real numbers representing mole fractions, wherein 0≤x≤1, 0≤y≤1, and the sum of x and y is about 1; and
the polymers have a degree of polymerization (n) in the range of 3 to 10,000.

To illustrate, polymeric compounds according to the present teachings can include polymers of a repeating unit M1, where the repeating unit M1 has the formula:

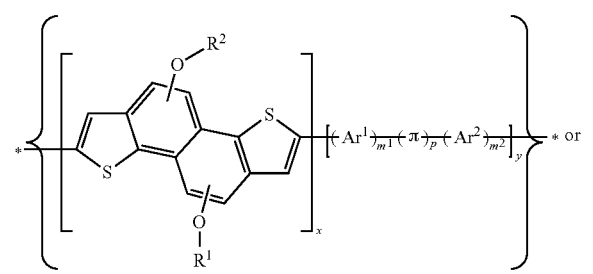

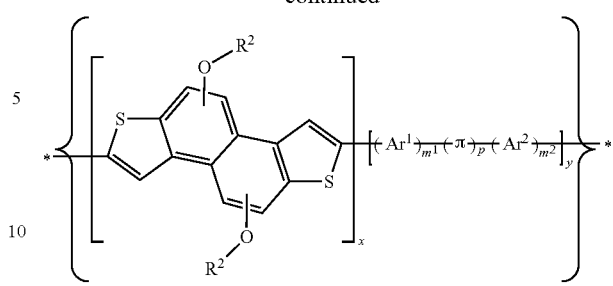

wherein $R^1$, $R^2$, $Ar^1$, $Ar^2$, π, $m^1$, $m^2$, p, x and y are as defined herein.

To illustrate, each of $R^1$ and $R^2$ independently can be a linear or branched $C_{1-20}$ alkyl groups such as methyl, ethyl, n-propyl, isopropyl, n-butyl, iso-butyl, sec-butyl, tert-butyl, n-pentyl, iso-pentyl, sec-pentyl, neo-pentyl, n-hexyl, n-dodecyl,

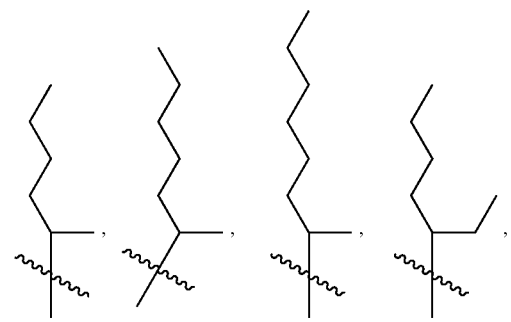

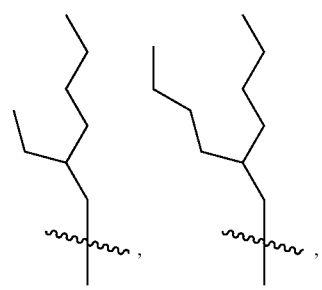

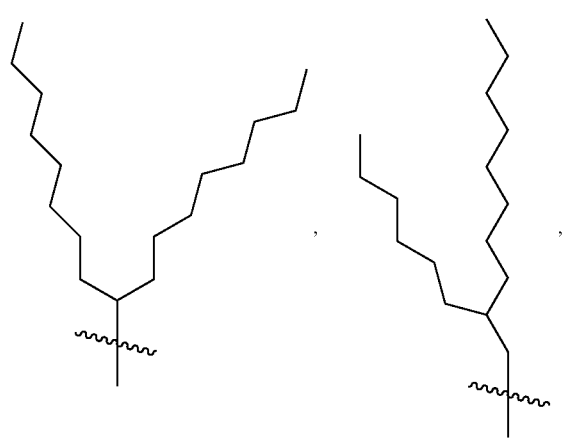

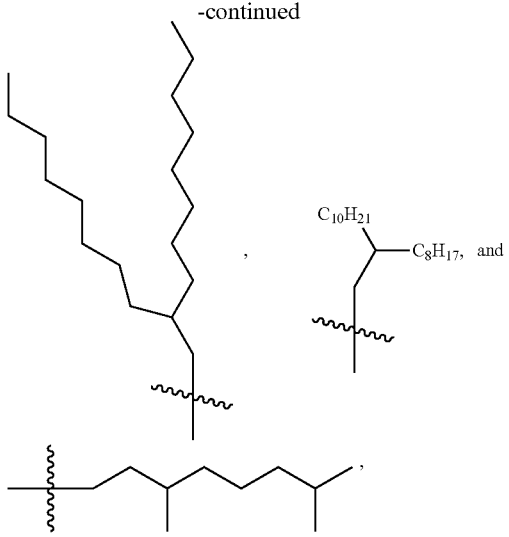

or a linear or branched $C_{1-20}$ haloalkyl groups where one or more hydrogen atoms in, for example, the $C_{1-20}$ alkyl groups shown above, are replaced by a halogen such as F.

Examples of $Ar^1$ and $Ar^2$ include various conjugated monocyclic and polycyclic moieties which can be optionally substituted as described herein. For example, each of $Ar^1$ and $Ar^2$ optionally can be substituted with 1-6 Rd groups, where $R^d$, at each occurrence, independently is selected from a) halogen, b) —CN, c) —NO$_2$, d) —N(R$^e$)$_2$, e) oxo, f) —OH, g) =C(R$^f$)$_2$, h) —C(O)R$^e$, i) —C(O)OR$^e$, j) —C(O)N(R$^e$)$_2$, k) —SH, l) —S(O)$_2$—R$^e$, m) —S(O)$_2$OR$^e$, n) —(OCH$_2$CH$_2$)$_t$OR$^e$, o) —(OCF$_2$CF$_2$)$_t$OR$^e$, p) —(OCH$_2$CF$_2$)$_t$OR$^e$, q) —(OCF$_2$CH$_2$)$_t$OR$^e$, r) —(CH$_2$CH$_2$O)$_t$R$^e$, s) —(CF$_2$CF$_2$O)$_t$R$^e$, t) —(CH$_2$CF$_2$O)$_t$R$^e$, u) —(CF$_2$CH$_2$O)$_t$R$^e$, v) a $C_{1-40}$ alkyl group, w) a $C_{2-40}$ alkenyl group, x) a $C_{2-40}$ alkynyl group, y) a $C_{1-40}$ alkoxy group, z) a $C_{1-40}$ alkylthio group, aa) a $C_{1-40}$ haloalkyl group, ab) a —Y—$C_{3-10}$ cycloalkyl group, ac) a —Y—$C_{6-14}$ aryl group, ad) a —Y—$C_{6-14}$ haloaryl group, ae) a —Y-3-12 membered cycloheteroalkyl group, and af) a —Y-5-14 membered heteroaryl group, wherein each of the $C_{1-40}$ alkyl group, the $C_{2-40}$ alkenyl group, the $C_{2-40}$ alkynyl group, the $C_{1-40}$ alkoxy group, the $C_{1-40}$ alkylthio group, the $C_{1-40}$ haloalkyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^e$, at each occurrence, independently is selected from H, a $C_{1-40}$ alkyl group, a $C_{1-40}$ haloalkyl group, and a —Y—$C_{6-14}$ aryl group;

$R^f$, at each occurrence, independently is selected from a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-20}$ alkyl, m) —S(O)$_2$OH, n) —S(O)$_2$—OC$_{1-20}$ alkyl, o) —S(O)$_2$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_w$NH$_2$, ai) —S(O)$_w$NH(C$_{1-20}$ alkyl), aj) —S(O)$_w$ N(C$_{1-20}$ alkyl)$_2$, ak) —S(O)$_w$ NH(C$_{6-14}$ aryl), al) —S(O)$_w$ N(C$_{1-20}$ alkyl)-C$_{6-14}$ aryl, am) —S(O)$_w$ N(C$_{6-14}$ aryl)$_2$, an) —SiH$_3$, ao) —SiH(C$_{1-20}$ alkyl)$_2$, ap) —SiH$_2$ (C$_{1-20}$ alkyl), aq) —Si (C$_{1-20}$ alkyl)$_3$, ar) a C$_{1-20}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 3-12 membered cycloheteroalkyl group, or bb) a 5-14 membered heteroaryl group;

Y, at each occurrence, independently is selected from a divalent $C_{1-10}$ alkyl group, a divalent $C_{1-10}$ haloalkyl group, and a covalent bond;

t is 1, 2, 3, 4, 5, 6, 7, 8, 9 or 10; and w, at each occurrence, independently is 0, 1, or 2.

Examples of monocyclic (hetero)aryl groups include a phenyl group or a 5- or 6-membered heteroaryl group such as a pyrrolyl group, a furyl group, a thienyl group, a pyridyl group, a pyrimidyl group, a pyridazinyl group, a pyrazinyl group, a triazolyl group, a tetrazolyl grop, a pyrazolyl group, an imidazolyl group, an isothiazolyl group, a thiazolyl group, and a thiadiazolyl group. For example, at least one of the $Ar^1$ and/or the $Ar^2$ groups can include at least one 5-membered heteroaryl group that includes at least one sulfur ring atom. Examples of such sulfur-containing 5-membered heteroaryl group include a thienyl group, a thiazolyl group, an isothiazolyl group, and a thiadiazolyl group, each of which optionally can be substituted as disclosed herein.

Examples of bicyclic 8-14 membered (hetero)aryl groups include a naphthyl group and various bicyclic (e.g., 5-5 or 5-6) heteroaryl moieties that include at least one sulfur ring atom. Examples of such sulfur-containing bicyclic heteroaryl moieties include a thienothiophenyl group (e.g., a thieno[3,2-b]thiophenyl group or a thieno[2,3-b]thiophenyl group), a benzothienyl group, a benzothiazolyl group, a benzisothiazolyl group, and a benzothiadiazolyl group, each of which optionally can be substituted as disclosed herein.

By way of example, $Ar^1$ and $Ar^2$, at each occurrence, independently can be selected from:

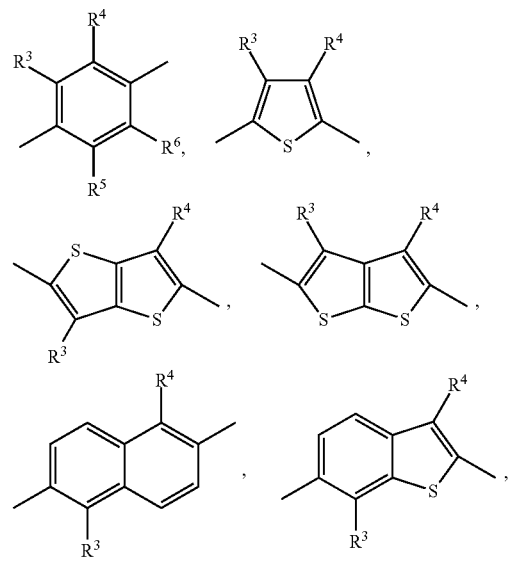

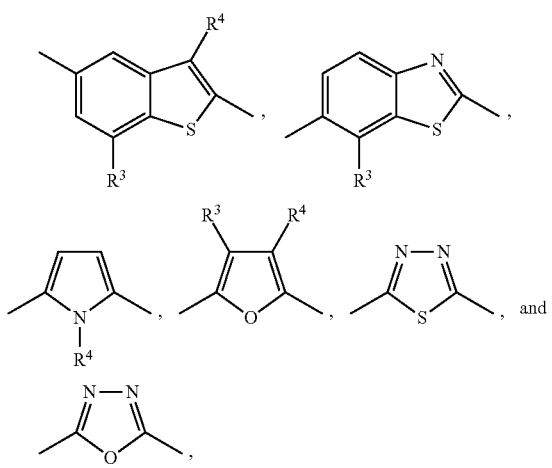

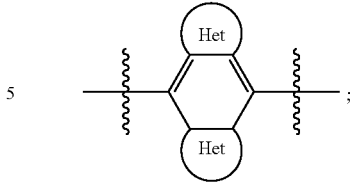

where $R^3$, $R^4$, $R^5$, and $R^6$ independently can be selected from H and $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group.

Examples of π include optionally substituted conjugated linear linkers such as an organic group consisting of one or more of the following unsaturated bonds:

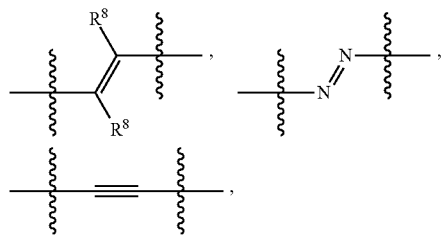

where $R^8$, at each occurrence, independently can be H or $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group.

Additional examples of π include optionally substituted heteroaryl groups including:

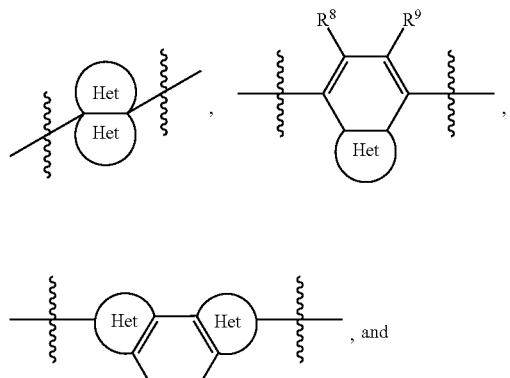

wherein Het, at each occurrence, can be a monocyclic moiety including at least one heteroatom in its ring and optionally substituted with 1-3 $R^9$ groups, wherein $R^9$, at each occurrence, independently can be selected from a halogen, CN, an oxo group, a $C_{1-20}$ alkyl group, a $C_{1-20}$ haloalkyl group, a $C_{1-20}$ alkoxy group, and a $C_{1-20}$ alkylthio group.

In various embodiments, —O—$R^1$ and —O—$R^2$ can be positioned in symmetrical positions. For example, the present polymeric compounds can include polymers having a repeating unit M1 represented by a formula selected from (Ia), (Ib), (Ic), (Id), and combinations thereof:

Ia

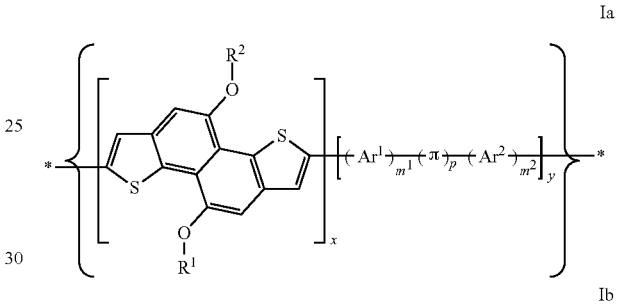

Ib

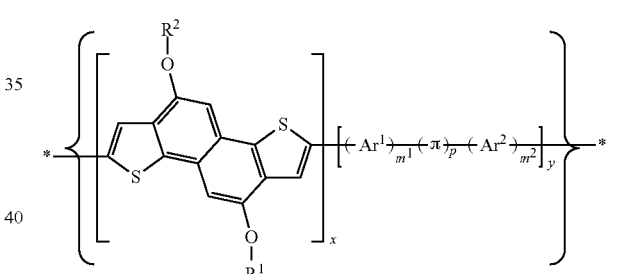

Ic

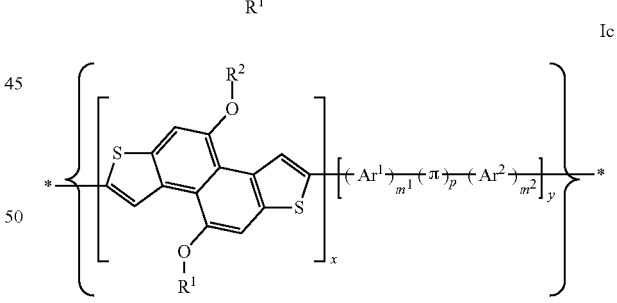

Id

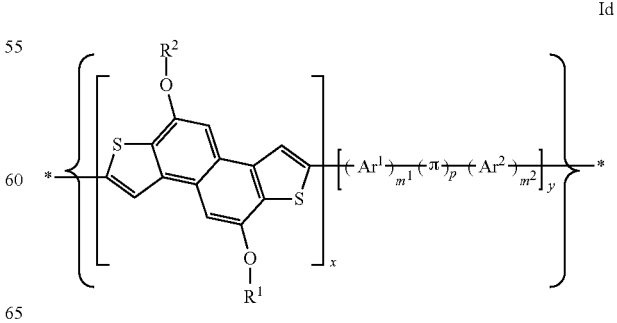

wherein $R^1$, $R^2$, $Ar^1$, $Ar^2$, π, $m^1$, $m^2$, p, x and y are as defined herein.

In certain embodiments, each of $m^1$ and $m^2$ can be 1; and $Ar^1$ and $Ar^2$, at each occurrence, independently can be an optionally substituted thienyl group or an optionally substituted bicyclic heteroaryl group comprising a thienyl group fused with a 5-membered heteroaryl group. In particular embodiments, the present polymers can have a repeating unit of the formula:

wherein:

$R^3$, $R^4$, $R^5$, and $R^6$ independently can be selected from H and $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group; and x and y are real numbers representing mole fractions, wherein $0<x<1$, $0<y<1$, and the sum of x and y is about 1; and $R^1$, $R^2$, π, and p are as defined herein.

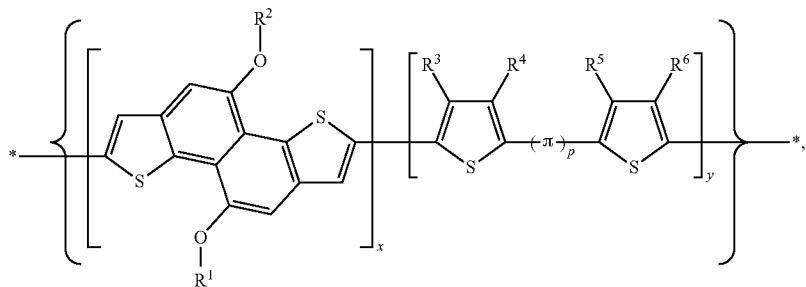

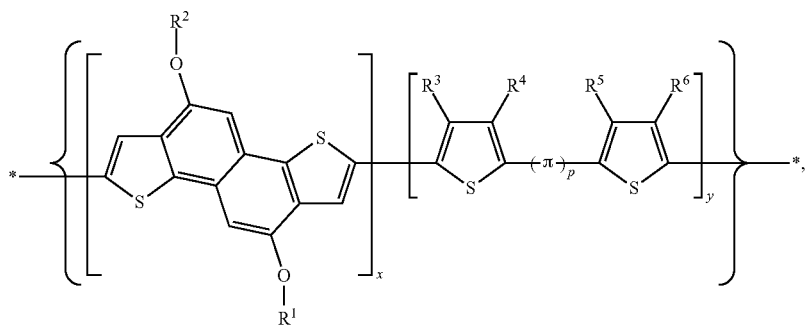

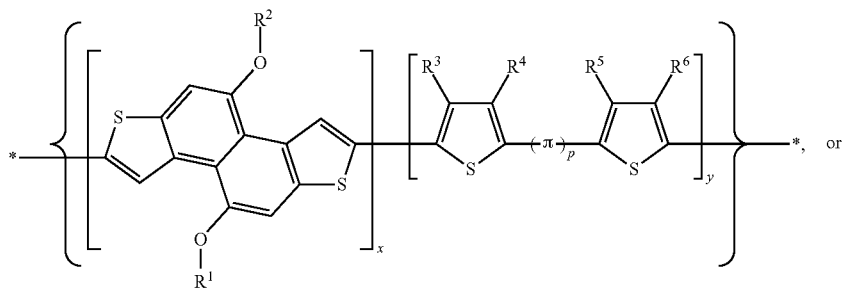, or

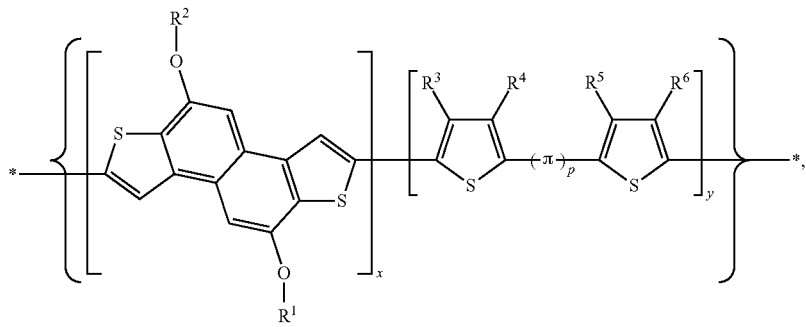

In certain embodiments, p can be 0. Examples of such embodiments can include polymers having the formulae:
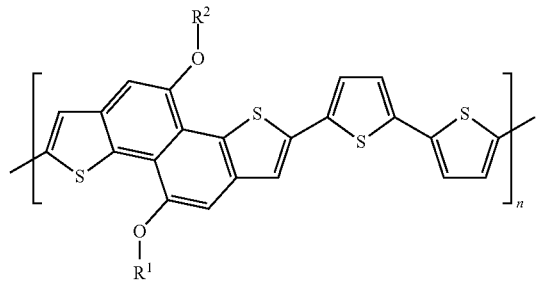 and 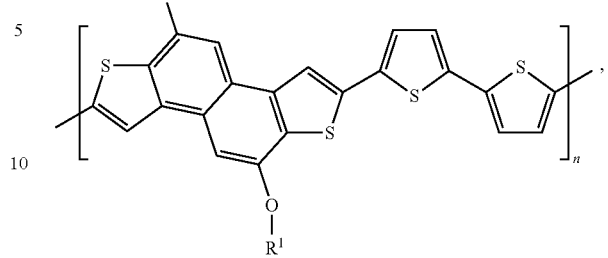
where $R^1$ and $R^2$ independently can be a $C_{1-20}$ alkyl group; and n is an integer ranging from 5 to 10,000.
In certain embodiments, p can be 1. Examples of such embodiments can include polymers having the formula:
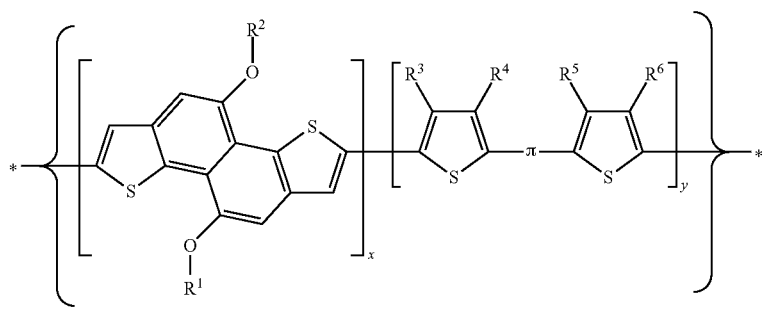
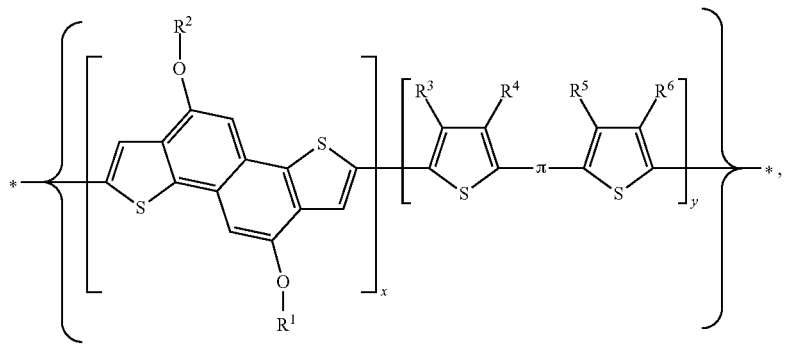
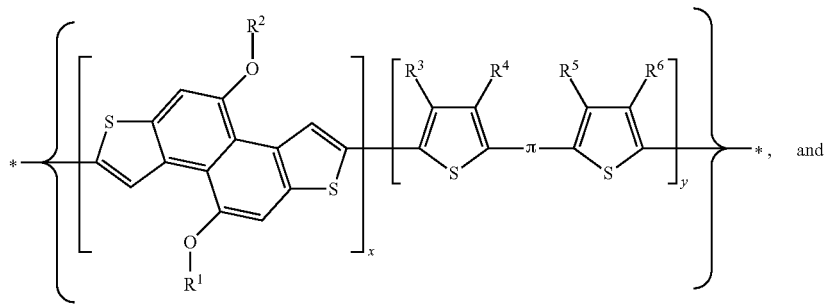 and -continued

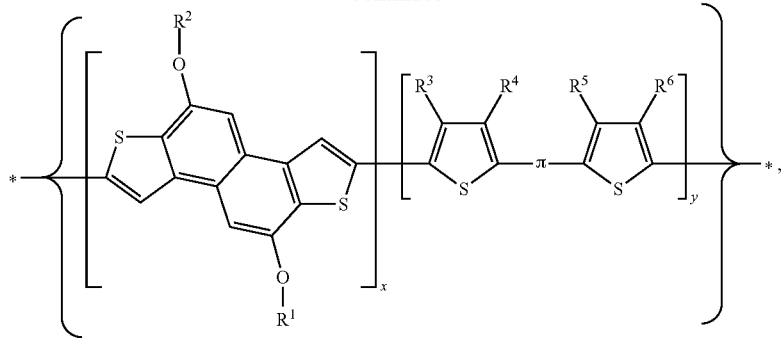

where π can be an optionally substituted conjugated linear linker or an optionally substituted heteroaryl group, and $R^1$, $R^2$, $R^3$, $R^4$, $R^5$, $R^6$, x and y are as defined herein. For example, π can be —CH=CH—, a polycyclic $C_{8-24}$ aryl group, or a polycyclic 8-24 membered heteroaryl group, where each of these groups can be optionally substituted with 1-6 $R^d$ groups, where $R^d$ is as defined herein. In certain embodiments, π can include at least one electron-withdrawing group. In certain embodiments, it can include one or more solubilizing groups. For example, π can include one or more solubilizing groups selected from a $C_{1-40}$ alkyl group, a $C_{1-40}$ alkoxy group, a $C_{1-40}$ alkylthio group, a $C_{1-40}$ haloalkyl group, —(OCH$_2$CH$_2$)$_t$OR$^e$, —(OCF$_2$CF$_2$)$_t$OR$^e$, —(OCH$_2$CF$_2$)$_t$OR$^e$, —(OCF$_2$CH$_2$)$_t$OR$^e$, —(CH$_2$CH$_2$O)$_t$—R$^e$, —(CF$_2$CF$_2$O)$_t$R$^e$, —(CH$_2$CF$_2$O)$_t$R$^e$, or —(CF$_2$CH$_2$O)$_t$R$^e$; where t is 1, 2, 3, 4, 5, 6, 7, 8, 9 or 10; and $R^e$ is a $C_{1-20}$ alkyl group or a $C_{1-20}$ haloalkyl group.

In certain embodiments, π can be selected from:

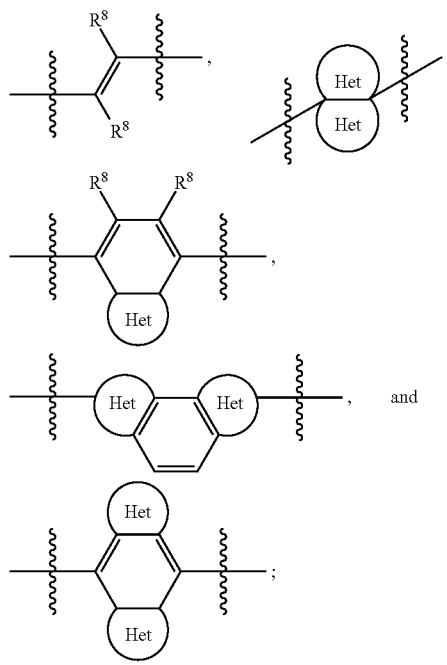

where $R^8$, at each occurrence, independently can be H or $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group; Het, at each occurrence, can be a monocyclic moiety including at least one heteroatom in its ring and optionally substituted with 1-3 $R^9$ groups, wherein $R^9$, at each occurrence, independently can be selected from a halogen, CN, an oxo group, a $C_{1-20}$ alkyl group, a $C_{1-20}$ haloalkyl group, a $C_{1-20}$ alkoxy group, and a $C_{1-20}$ alkylthio group.

In particular embodiments, at least one of $R^3$, $R^4$, $R^5$, and $R^6$ can be selected from a halogen, CN, a $C_{1-20}$ alkyl group, a $C_{1-20}$ haloalkyl group, a $C_{1-20}$ alkoxy group, and a $C_{1-20}$ alkylthio group. For example, certain polymers according to the present teachings can have the formula:

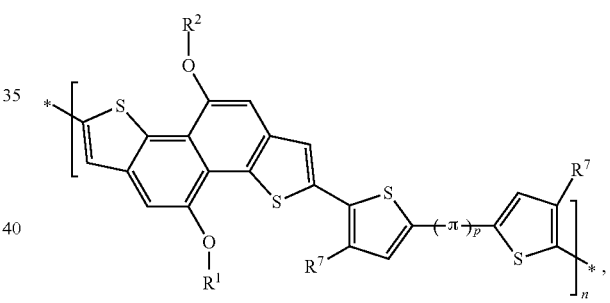

where $R^1$ and $R^2$ independently can be a $C_{1-20}$ alkyl group; each $R^7$ can be selected from F, Cl, a $C_{1-20}$ alkyl group, a $C_{1-20}$ haloalkyl group, a $C_{1-20}$ alkoxy group, and a $C_{1-20}$ alkylthio group; n can be an integer ranging from 5 to 10,000; and π and p are as defined herein.

For example, π can be selected from:

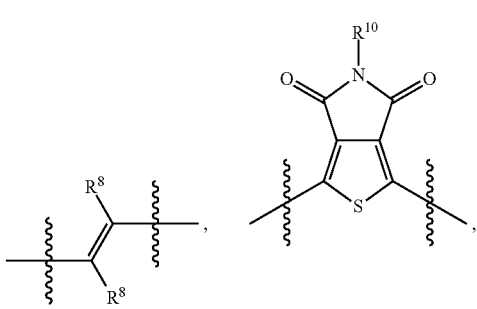

-continued

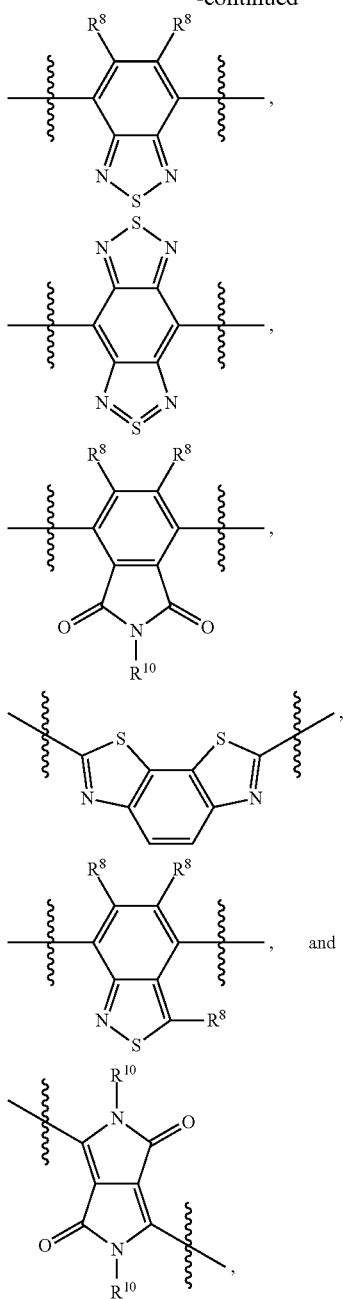

where R$^8$, at each occurrence, independently can be H, a halogen, CN, a C$_{1-20}$ alkyl group, a C$_{1-20}$ haloalkyl group, a C$_{1-20}$ alkoxy group, and a C$_{1-20}$ alkylthio group; and R$^{10}$, at each occurrence, independently can be a C$_{1-20}$ alkyl group or a C$_{1-20}$ haloalkyl group.

To illustrate, examples of the unit:

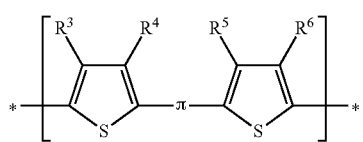

can include

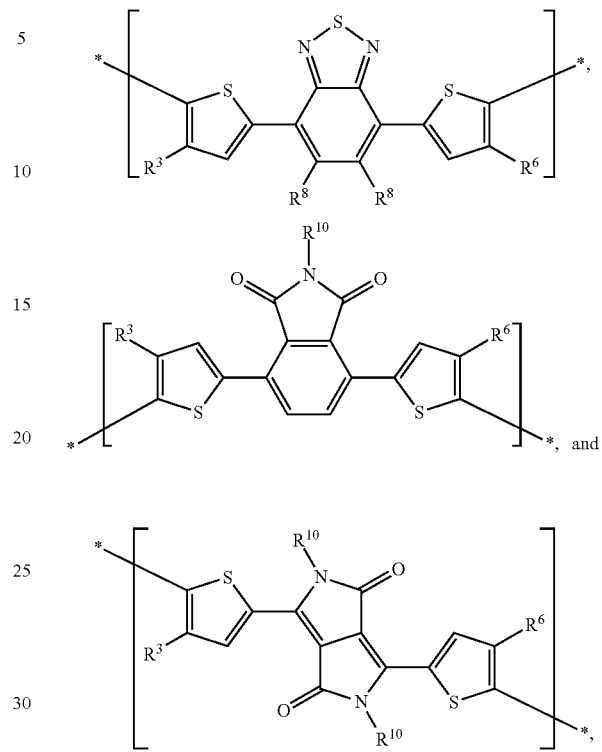

wherein R$^3$ and R$^6$ can be selected from H, a C$_{1-20}$ alkyl group, and a C$_{1-20}$ alkoxy group; R$^8$, at each occurrence, independently can be selected from H, a halogen, CN, a C$_{1-20}$ alkyl group, a C$_{1-20}$ haloalkyl group, a C$_{1-20}$ alkoxy group, and a C$_{1-20}$ alkylthio group; and R$^{10}$, at each occurrence, independently can be a C$_{1-20}$ alkyl group.

Certain embodiments of the present compounds include polymers of a repeating unit represented by formula (Ia), (Ib), (Ic), or (Id) such as:

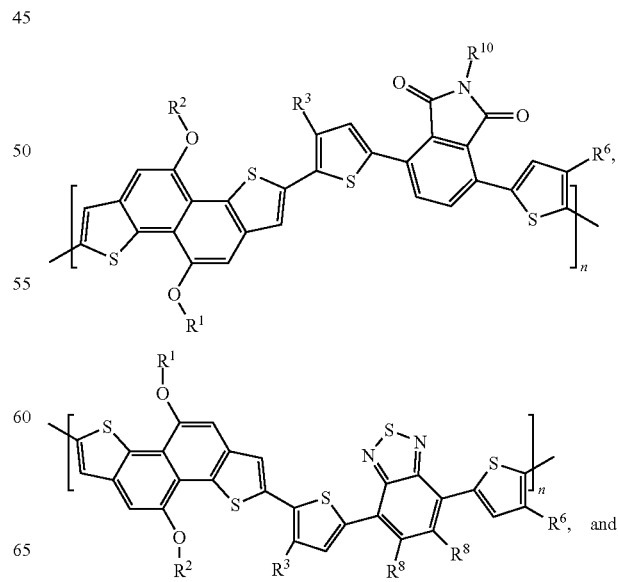

-continued

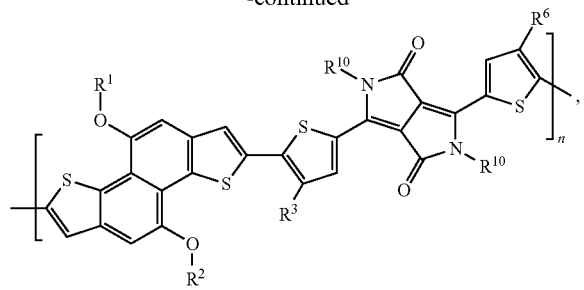

where $R^1$, $R^2$ and $R^{10}$ independently can be a $C_{1-20}$ alkyl group; $R^3$ and $R^6$ independently can be selected from H, a $C_{1-20}$ alkyl group, and a $C_{1-20}$ alkoxy group; $R^8$, at each occurrence, independently can be selected from H, a halogen, CN, a $C_{1-20}$ alkyl group, a $C_{1-20}$ haloalkyl group, a $C_{1-20}$ alkoxy group, and a $C_{1-20}$ alkylthio group; and n is an integer ranging from 5 to 10,000.

In certain embodiments, polymers of the present teachings can have two or more different repeating units, where each repeating unit can be represented by formula (Ia), (Ib), (Ic) or (Id). For example, such polymers can have a first repeating unit M1 represented by formula (Ia) and a second repeating unit M2 represented by formula (Id). In other examples, the polymers can have a first repeating unit M1 and a second repeating unit M2, each represented by formula (Ia), (Ib), (Ic) or (Id), where the definition of at least one of $R^1$, $R^2$, $Ar^1$, $Ar^2$, $\pi$, $m^1$, $m^2$, p, x and y in the first repeating unit M1 is different from that in the second repeating unit M2. For example, $Ar^1$, $Ar^2$, and/or $\pi$ can be the same moiety in both repeating units M1 and M2 but the same moieties can be differently substituted.

To illustrate, examples of polymers having two different repeating units represented by formula (Ia), (Ib), (Ic) and/or (Id) include those having the formula:

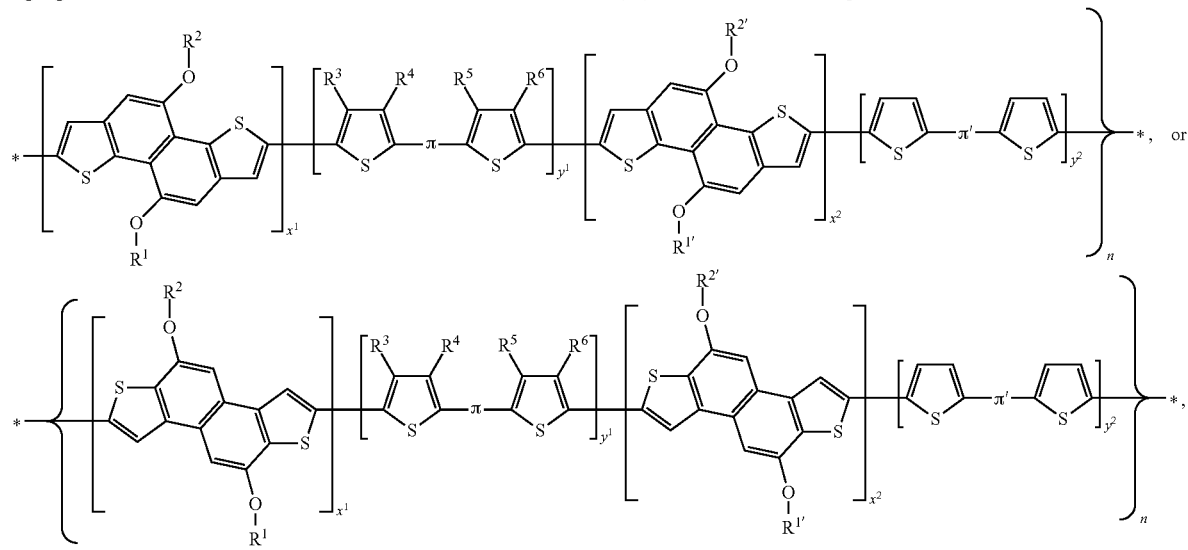

wherein:
$R^1$, $R^{1'}$, $R^2$, and $R^{2'}$ independently are a $C_{1-20}$ alkyl group or a $C_{1-20}$ haloalkyl group;
$\pi$ and $\pi'$ independently are an optionally substituted polycyclic aryl group, an optionally substituted polycyclic heteroaryl group, or an optionally substituted conjugated linear linker;
$x^1$, $x^2$, $y^1$, and $y^2$ are real numbers representing mole fractions, wherein $0<x^1<1$, $0<x^2<1$, $0<y^1<1$, $0<y^2<1$, $x^1+x^2=x$, $y^1+y^2=y$, and $x+y=1$; and
n is an integer ranging from 5 to 10,000, provided that at least one of the following is true: $R^1$ and $R^2$ are different from $R^{1'}$ and $R^{2'}$, $\pi$ is different from $\pi'$, and at least one of $R^3$, $R^4$, $R^5$, and $R^6$ is not H.

A further example is a polymer having the formula:

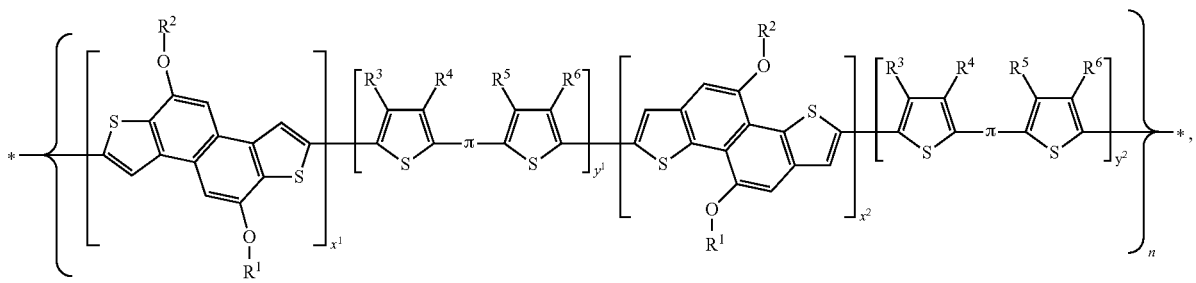

wherein:

$R^1$ and $R^2$, at each occurrence, independently can be a $C_{1-20}$ alkyl group or a $C_{1-20}$ haloalkyl group;

$R^3$, $R^4$, $R^5$, and $R^6$, at each occurrence, independently can be selected from H and $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group π, at each occurrence, independently can be an optionally substituted polycyclic aryl group, an optionally substituted polycyclic heteroaryl group, or an optionally substituted conjugated linear linker;

$x^1$, $x^2$, $y^1$, and $y^2$ are real numbers representing mole fractions, wherein $0<x^1<1$, $0<x^2<1$, $0<y^1<1$, $0<y^2<$, $x^1+x^2=x$, $y^1+y^2=y$, and $x+y=1$; and n is an integer ranging from 5 to 10,000.

Illustrative examples according to these embodiments include:

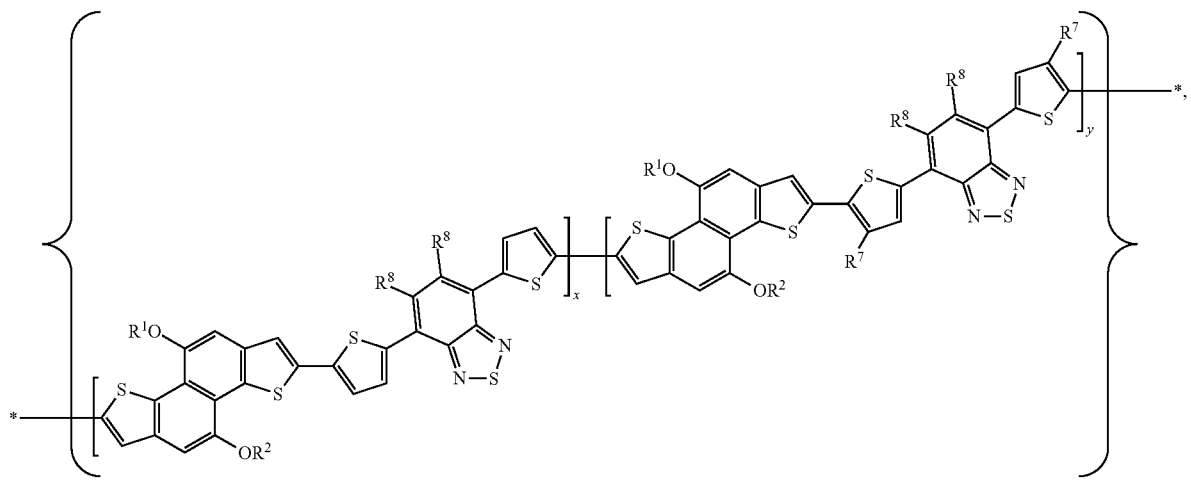

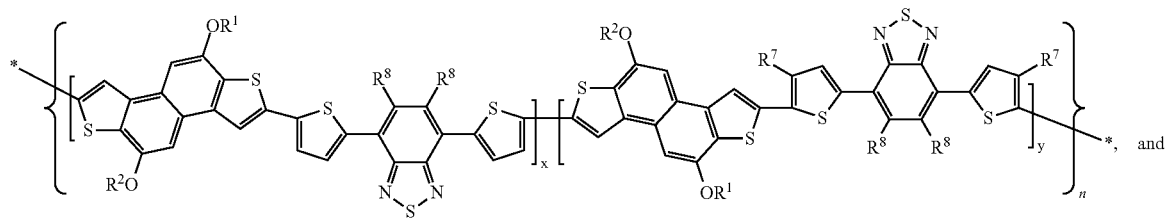

, and

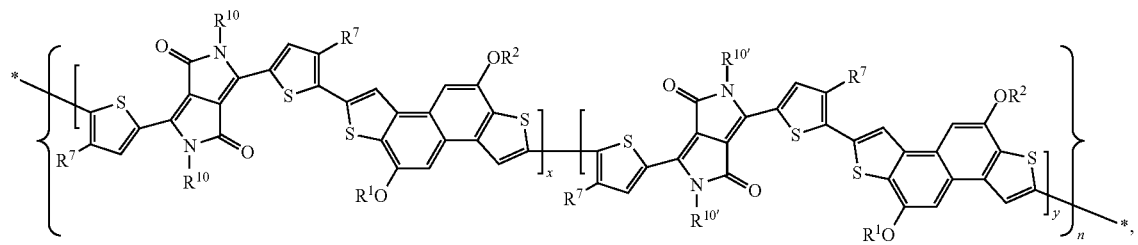

, where $R^1$ and $R^2$ independently can be a $C_{1-20}$ alkyl group; $R^7$ can be a $C_{1-20}$ alkyl group or a $C_{1-20}$ alkoxy group; $R^8$, at each occurrence, independently can be selected from H, a halogen, CN, a $C_{1-20}$ alkyl group, a $C_{1-20}$ haloalkyl group, a $C_{1-20}$ alkoxy group, and a $C_{1-20}$ alkylthio group; $R^{10}$ and $R^{10'}$ are different $C_{1-20}$ alkyl groups; x and y are real numbers representing mole fractions where $0.2<x<0.8$ and $0.2<y<0.8$, provided that the sum of x and y is about 1; and n is an integer ranging from 5 to 10,000.

In certain embodiments, each of $m^1$ and $m^2$ can be 0 and p can be 1. Accordingly, certain polymers of the present teachings can have a repeating unit represented by the formula:

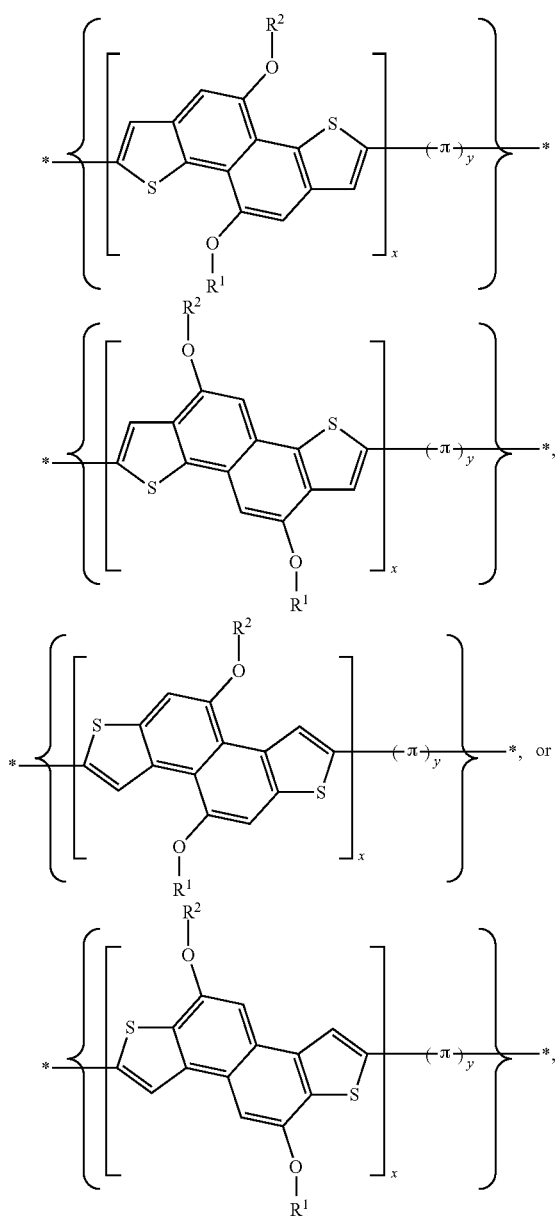

where π can be an optionally substituted conjugated linear linker or an optionally substituted heteroaryl group, and $R^1$, $R^2$, x and y are as defined herein. For example, π can be —CH=CH—, a polycyclic $C_{8-24}$ aryl group, or a polycyclic 8-24 membered heteroaryl group, where each of these groups can be optionally substituted with 1-6 $R^d$ groups, where $R^d$ is as defined herein. In certain embodiments, π can include at least one electron-withdrawing group. In certain embodiments, π can include one or more solubilizing groups. For example, π can include one or more solubilizing groups selected from a $C_{1-40}$ alkyl group, a $C_{1-40}$ alkoxy group, a $C_{1-40}$ alkylthio group, a $C_{1-40}$ haloalkyl group, —(OCH$_2$CH$_2$)$_t$OR$^e$, —(OCF$_2$CF$_2$)$_t$OR$^e$, —(OCH$_2$CF$_2$)$_t$OR$^e$, —(OCF$_2$CH$_2$)$_t$OR$^e$, —(CH$_2$CH$_2$O)$_t$—R$^e$, —(CF$_2$CF$_2$O)$_t$R$^e$, —(CH$_2$CF$_2$O)$_t$R$^e$, or —(CF$_2$CH$_2$O)$_t$R$^e$; where t is 1, 2, 3, 4, 5, 6, 7, 8, 9 or 10; and $R^e$ is a $C_{1-20}$ alkyl group or a $C_{1-20}$ haloalkyl group.

In certain embodiments, π can be selected from:

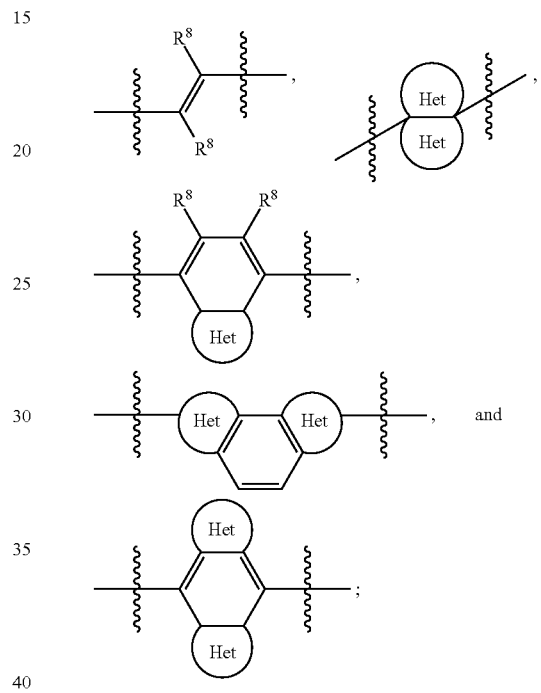

where $R^8$, at each occurrence, independently can be H or $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group; Het, at each occurrence, can be a monocyclic moiety including at least one heteroatom in its ring and optionally substituted with 1-3 $R^9$ groups, wherein $R^9$, at each occurrence, independently can be selected from a halogen, CN, an oxo group, a $C_{1-20}$ alkyl group, a $C_{1-20}$ haloalkyl group, a $C_{1-20}$ alkoxy group, and a $C_{1-20}$ alkylthio group.

For example, π can be selected from:

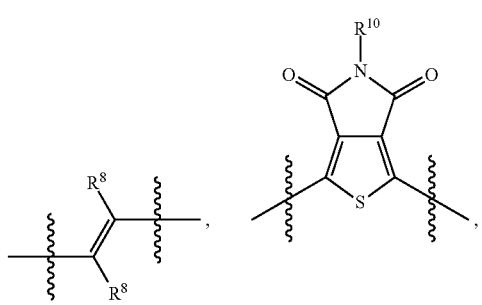

-continued

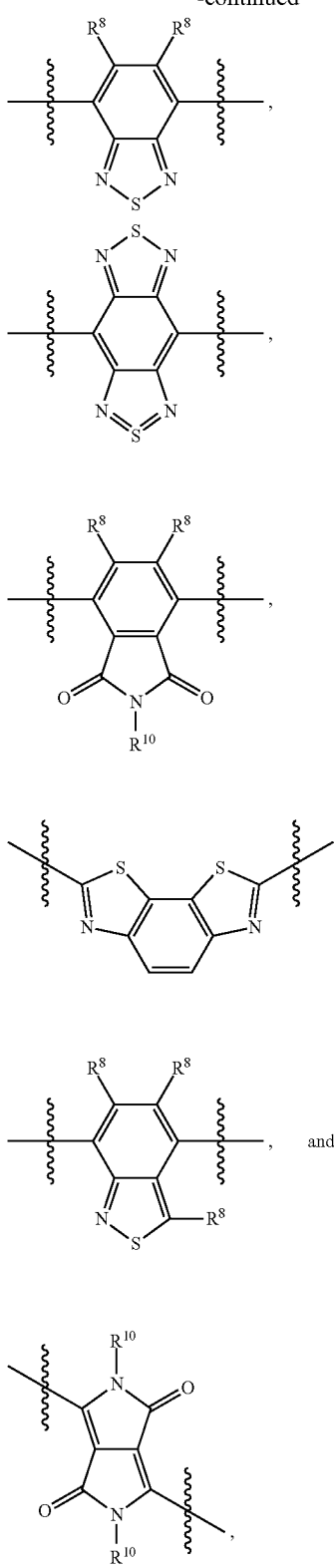

where $R^8$, $R^9$, and $R^{10}$ at each occurrence, independently can becan be H, a halogen, CN, a $C_{1-20}$ alkyl group, a $C_{1-20}$ haloalkyl group, a $C_{1-20}$ alkoxy group, and a $C_{1-20}$ alkylthio group; and $R^{10}$, at each occurrence, independently can be a $C_{1-20}$ alkyl group or a $C_{1-20}$ haloalkyl group.

To illustrate, examples of these embodiments can include those having the formula:

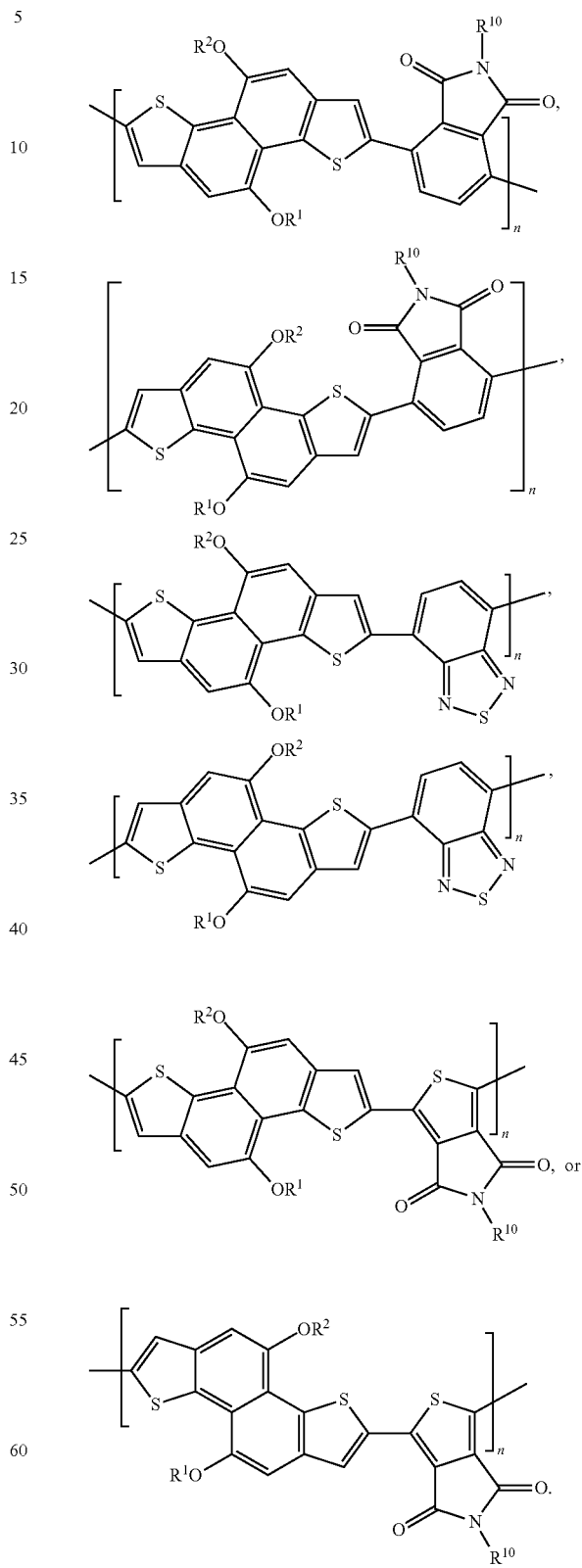

where $R^1$, $R^2$, $R^{10}$, and n are as defined herein.

Other examples include those polymers having a first repeating unit represented by a formula selected from:

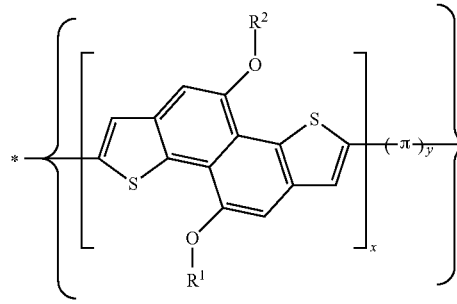

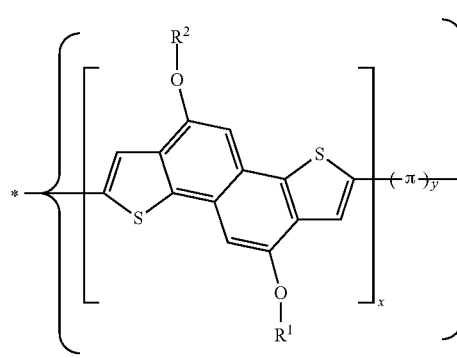

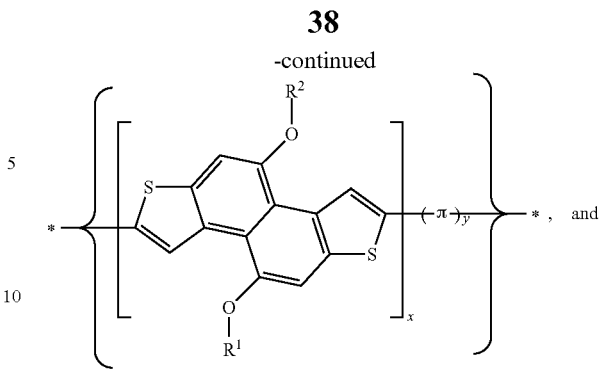

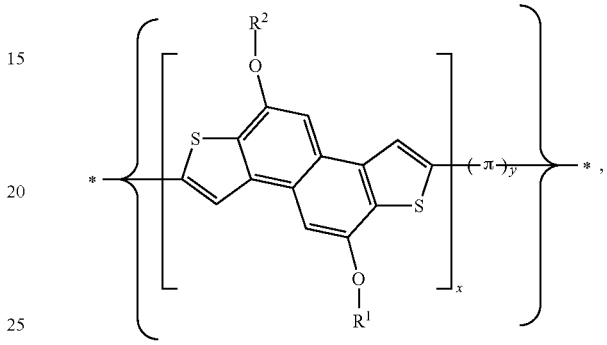

where $R^1$, $R^2$, $\pi$, x and y are as defined herein, and a second repeating unit different from the first repeating unit. For example, the second repeating unit can be different from the first repeating unit but yet still be represented by one of the formulae above. In certain embodiments, the second repeating unit can have a formula selected from:

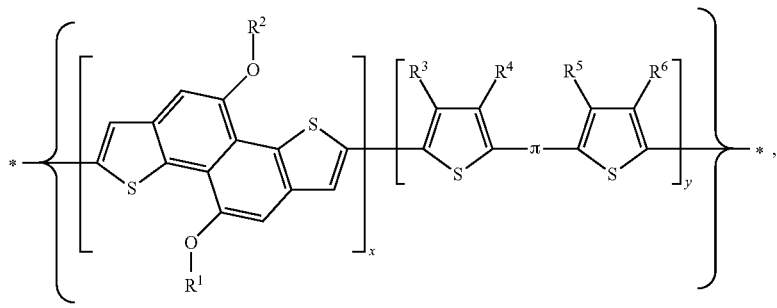

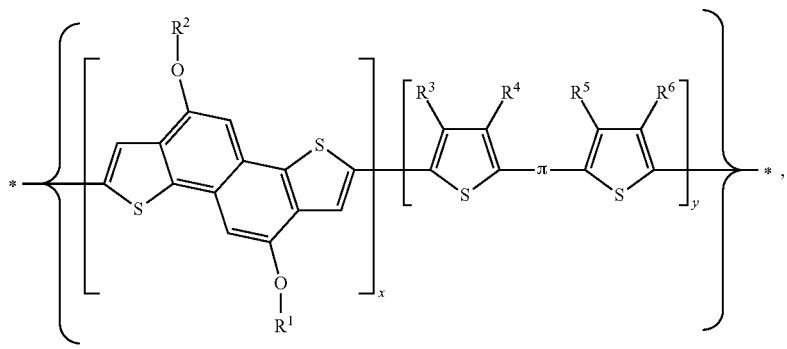

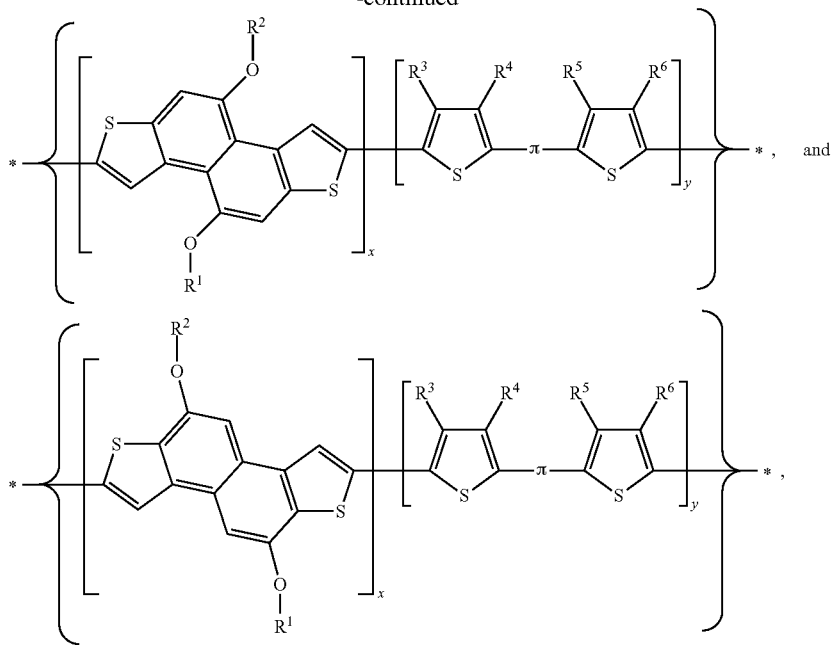

where $R^1$, $R^2$, $R^3$, $R^4$, $R^5$, $R^6$, π, x and y are as defined herein.

Further examples of the present polymers include those polymers having a first repeating unit represented by a formula selected from Formula (Ia), (Ib), (Ic), and (Id) and a second repeating unit that does not include the moiety:

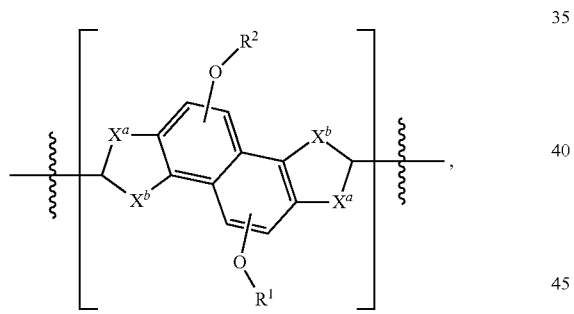

where $R^1$, $R^2$, $X^a$, and $X^b$ are as defined herein. Example of such embodiments includes polymers having the formula:

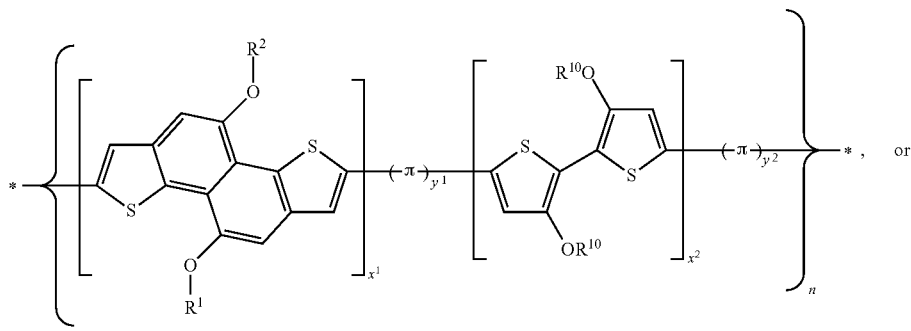

-continued

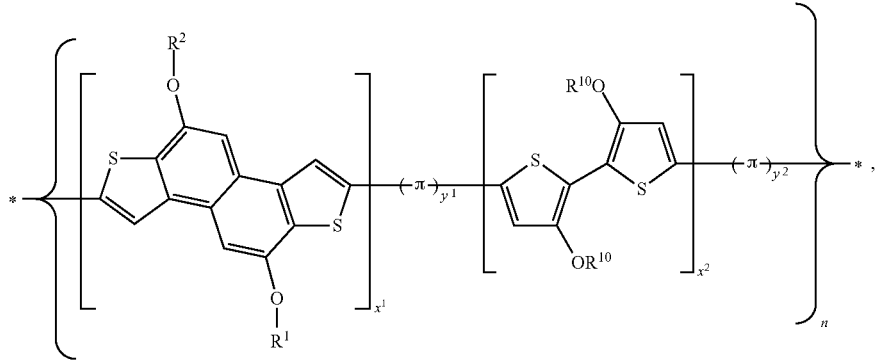

wherein:

$R^1$, $R^2$ and $R^{10}$ independently are a $C_{1-20}$ alkyl group;

π, at each occurrence, independently is an optionally substituted heteroaryl group represented by a formula selected from:

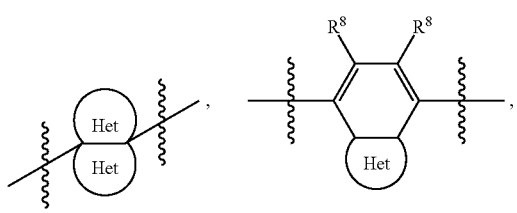

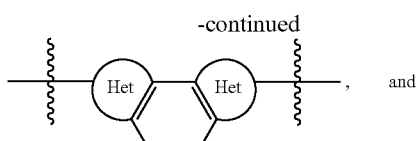

wherein $R^8$, at each occurrence, independently is H or $R^7$, wherein $R^7$, at each occurrence, independently is selected from a halogen, CN, a $C_{1-20}$ alkyl group, a $C_{1-20}$ haloalkyl group, a $C_{1-20}$ alkoxy group, and a $C_{1-20}$ alkylthio group; Het, at each occurrence, is a monocyclic moiety including at least one heteroatom in its ring and optionally substituted with 1-3 $R^9$ groups, wherein $R^9$, at each occurrence, independently is selected from a halogen, CN, an oxo group, a $C_{1-20}$ alkyl group, a $C_{1-20}$ haloalkyl group, a $C_{1-20}$ alkoxy group, and a $C_{1-20}$ alkylthio group;

$x^1$, $x^2$, $y^1$, and $y^2$ are real numbers representing mole fractions, wherein $x^2>0$ and $x^1+x^2=x$, and $y^2>0$ and $y^1+y^2=y$; and n is an integer ranging from 5 to 10,000.

In one aspect, the present teachings relate to molecular semiconducting compounds, as well as the use of these compounds in electronic, optoelectronic, or optical devices. These molecular compounds can be represented by formula II):

(II)

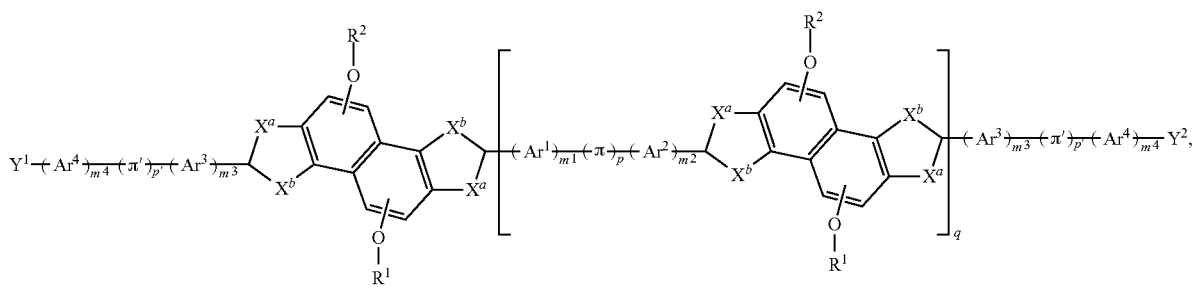

wherein:

$X^a$ and $X^b$ are CH or S, provided that only $X^a$ or $X^b$ is S;

$Y^1$ and $Y^2$ independently are H, a $C_{1-20}$ alkyl group, a $C_{1-20}$ haloalkyl group, or a reactive group;

$R^1$ and $R^2$ independently are a $C_{1-20}$ alkyl group or a $C_{1-20}$ haloalkyl group;

$Ar^1$, $Ar^2$, $Ar^3$, and $Ar^4$, at each occurrence, independently are an optionally substituted $C_{6-14}$ aryl group or an optionally substituted 5-14 membered heteroaryl group;

π and π' independently are an optionally substituted polycyclic aryl group, an optionally substituted polycyclic heteroaryl group, or an optionally substituted conjugated linear linker;

$m^1$, $m^2$, $m^3$, and $m^4$, at each occurrence, independently are 0, 1, 2, 3 or 4;

p and p', at each occurrence, independently is 0 or 1; and q is 0 or 1; provided that when q is 0, at least one of $m^3$, $m^4$ and p' is not 0; and when q is 1, at least one of $m^1$, $m^2$ and p is not 0.

To illustrate, certain molecular compounds according to the present teachings can be represented by formula (IIa):
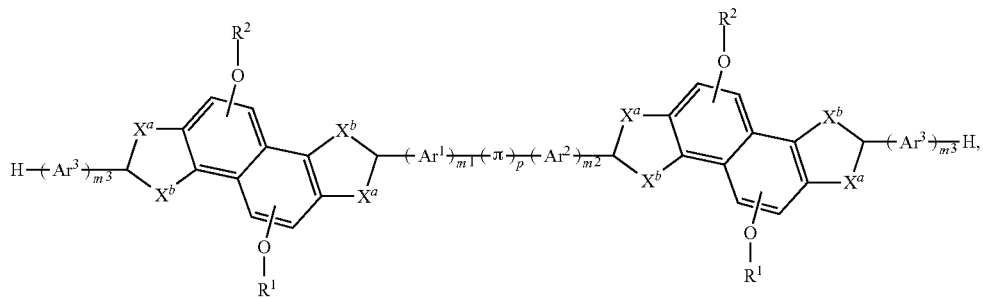
wherein $R^1$, $R^2$, $Ar^1$, $Ar^2$, $Ar^3$, $X^a$, $X^b$, $X$, $m^1$, $m^2$, $m^3$, and p are as defined herein. For example, these embodiments can be represented by the formula:
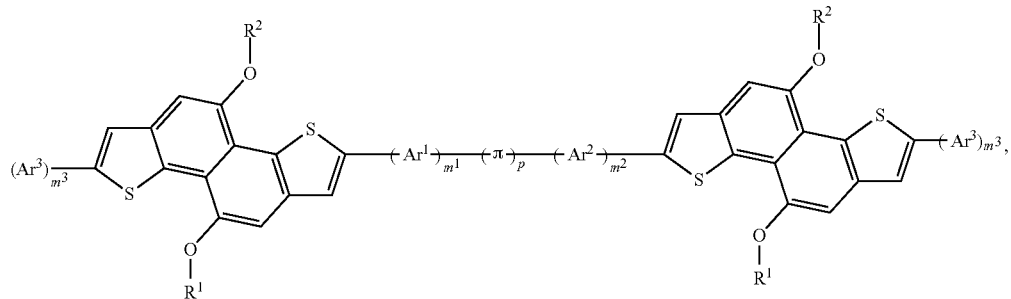
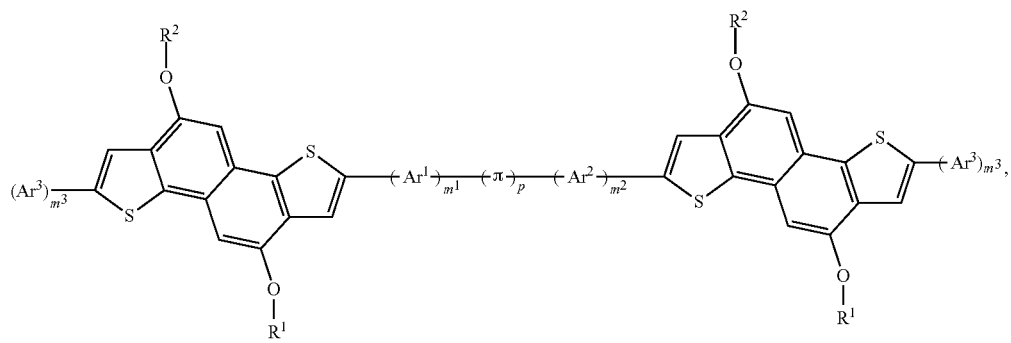
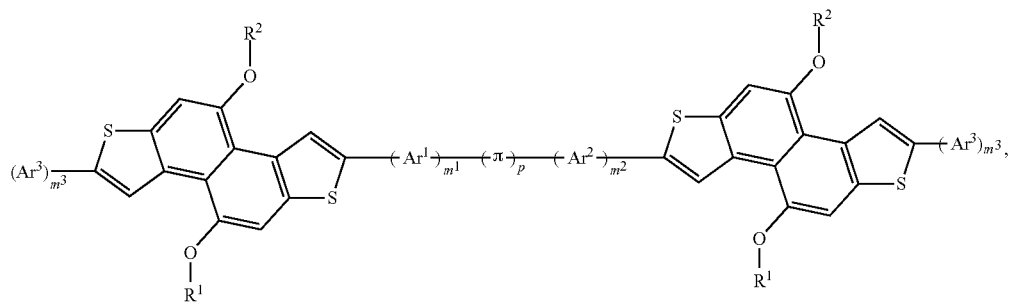

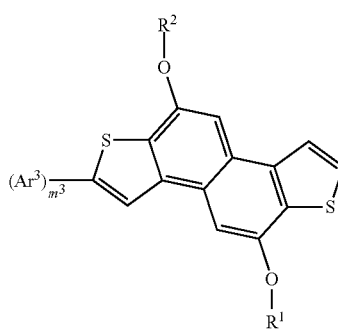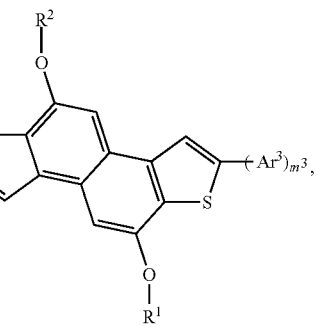

wherein:
R[1] and R[2], at each occurrence, independently are a $C_{1-20}$ alkyl group or a $C_{1-20}$ haloalkyl group
Ar[1], Ar[2] and Ar[3], at each occurrence, independently are an optionally substituted $C_{6-14}$ aryl group or an optionally substituted 5-14 membered heteroaryl group;
π is an optionally substituted polycyclic aryl group, an optionally substituted polycyclic heteroaryl group, or an optionally substituted conjugated linear linker;
m[1], m[2], and m[3] independently are 0, 1, 2, 3 or 4; and
p is 0 or 1, provided that at least one of m[1], m[2], m[3], and p is not 0.

In certain embodiments, molecular compounds according to the present teachings can be represented by formula (IIb):

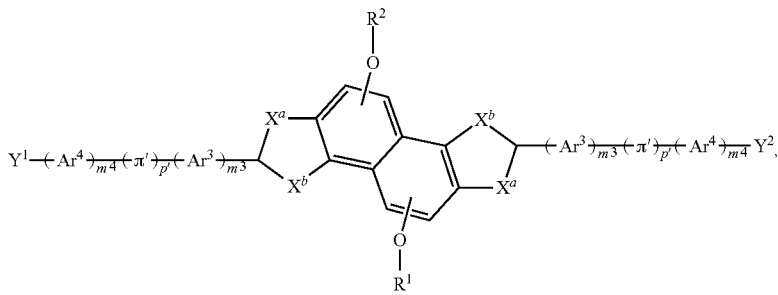

wherein R[1], R[2], Ar[3], Ar[4], X[a], X[b], Y[1], Y[2], π', m[3], m[4], and p' are as defined herein, provided that at least one of m[3], m[4], and p' is not 0. For example, these embodiments can be represented by the formula:

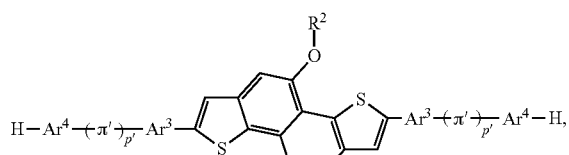

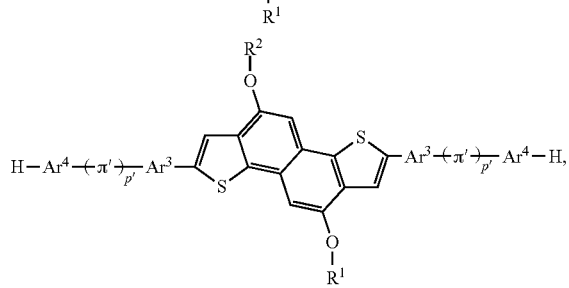

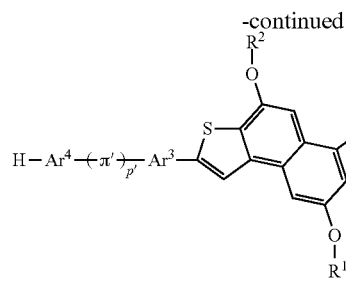

wherein R[1], R[2], Ar[3], Ar[4], π' and p' are as defined herein.

Examples of Ar[1], Ar[2], Ar[3], and Ar[4] include various conjugated monocyclic and polycyclic moieties which can be optionally substituted as described herein.

Examples of monocyclic (hetero)aryl groups include a phenyl group or a 5- or 6-membered heteroaryl group such as a pyrrolyl group, a furyl group, a thienyl group, a pyridyl group, a pyrimidyl group, a pyridazinyl group, a pyrazinyl group, a triazolyl group, a tetrazolyl grop, a pyrazolyl group, an imidazolyl group, an isothiazolyl group, a thiazolyl group, and a thiadiazolyl group. For example, at least one of Ar[1], Ar[2], Ar[3], and Ar[4] can include at least one 5-membered heteroaryl group that includes at least one sulfur ring atom. Examples of such sulfur-containing 5-membered heteroaryl group include a thienyl group, a thiazolyl group, an isothiazolyl group, and a thiadiazolyl group, each of which optionally can be substituted as disclosed herein.

Examples of bicyclic 8-14 membered (hetero)aryl groups include a naphthyl group and various bicyclic (e.g., 5-5 or 5-6) heteroaryl moieties that include at least one sulfur ring atom. Examples of such sulfur-containing bicyclic heteroaryl moieties include a thienothiophenyl group (e.g., a thieno[3,2-b]thiophenyl group or a thieno[2,3-b]thiophenyl group), a benzothienyl group, a benzothiazolyl group, a benzisothiazolyl group, and a benzothiadiazolyl group, each of which optionally can be substituted as disclosed herein.

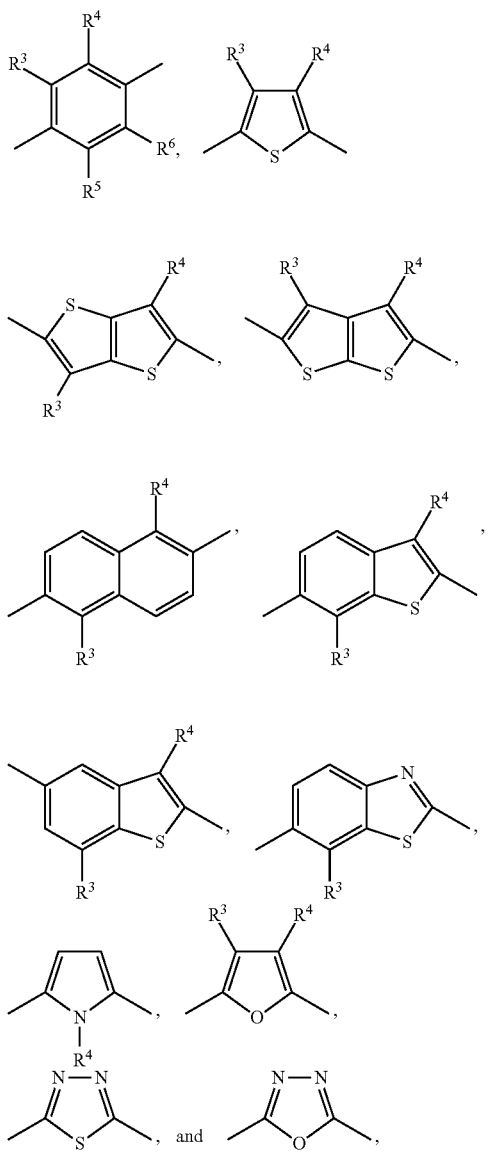

where $R^3$, $R^4$, $R^5$, and $R^6$ independently can be selected from H and $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group.

Examples of π include optionally substituted conjugated linear linkers such as an organic group consisting of one or more of the following unsaturated bonds:

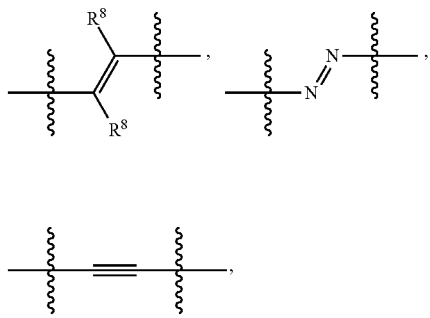

where $R^8$, at each occurrence, independently can be H or $R^7$, wherein $R^7$, at each occurrence, independently can be selected from a halogen, CN, a $C_{1-20}$ alkyl group, a $C_{1-20}$ haloalkyl group, a $C_{1-20}$ alkoxy group, and a $C_{1-20}$ alkylthio group.

Additional examples of π' include optionally substituted heteroaryl groups including:

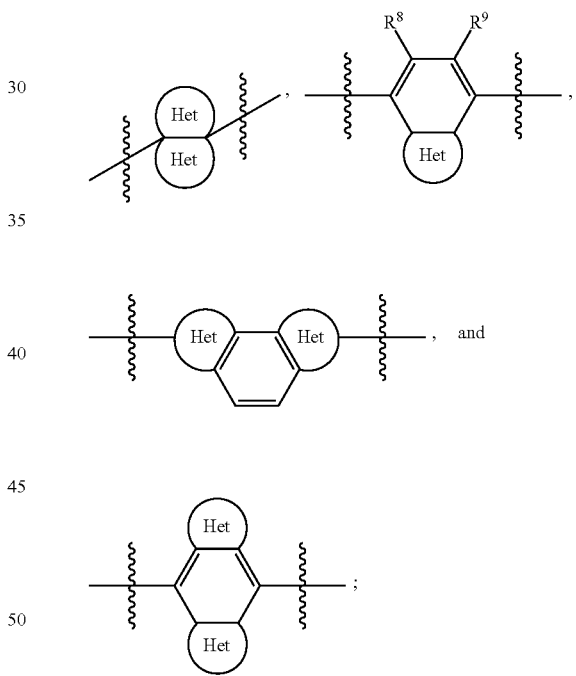

wherein Het, at each occurrence, can be a monocyclic moiety including at least one heteroatom in its ring and optionally substituted with 1-3 $R^9$ groups, wherein $R^9$, at each occurrence, independently can be selected from a halogen, CN, an oxo group, a $C_{1-20}$ alkyl group, a $C_{1-20}$ haloalkyl group, a $C_{1-20}$ alkoxy group, and a $C_{1-20}$ alkylthio group.

In particular embodiments, $Ar^1$, $Ar^2$, $Ar^3$, and $Ar^4$, at each occurrence, independently can be an optionally substituted thienyl group or an optionally substituted bicyclic heteroaryl group comprising a thienyl group fused with a 5-membered heteroaryl group. For example, certain embodiments of the molecular semiconducting compounds according to formula (IIa) can have the formula:

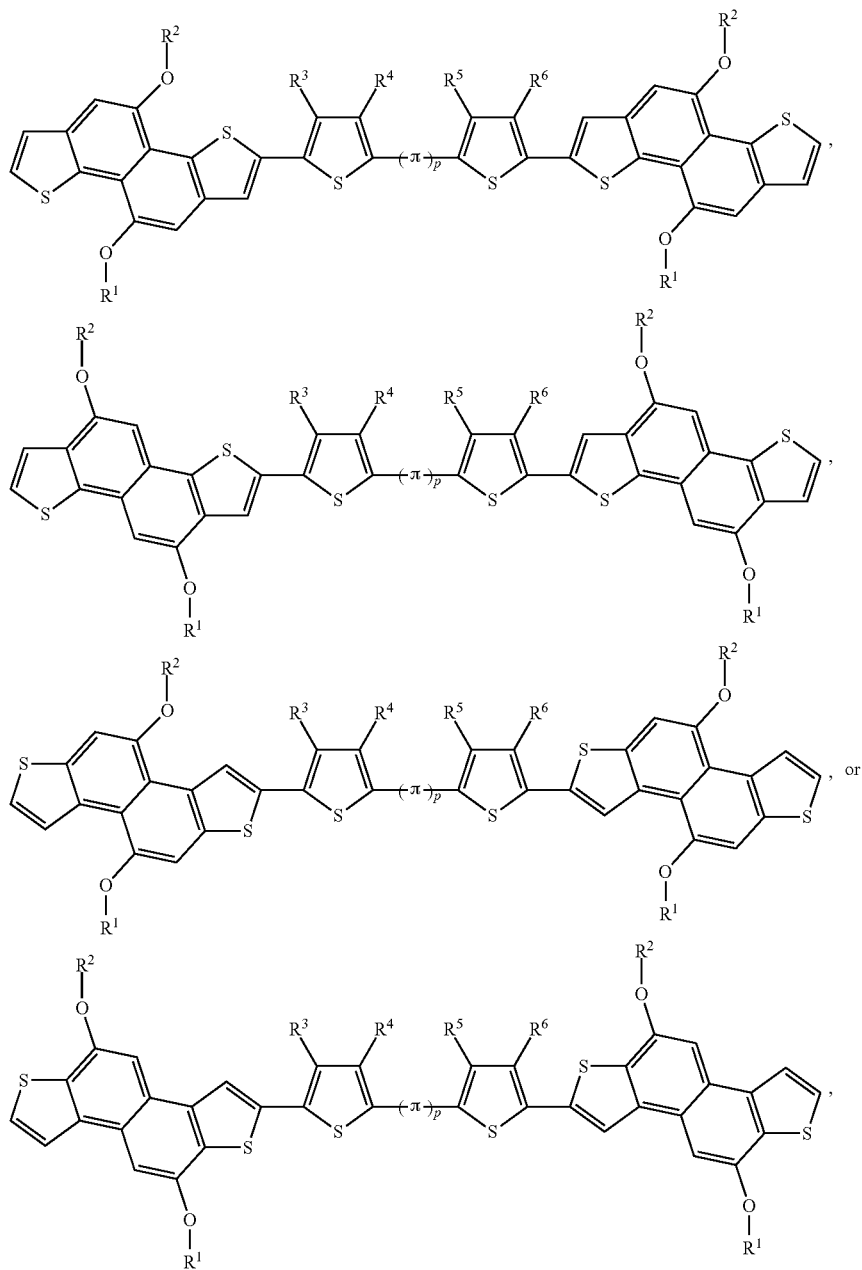

wherein:

R³, R⁴, R⁵, and R⁶, at each occurrence, independently are selected from H and R⁷, wherein R⁷, at each occurrence, independently is selected from a halogen, CN, a $C_{1-20}$ alkyl group, a $C_{1-20}$ haloalkyl group, a $C_{1-20}$ alkoxy group, and a $C_{1-20}$ alkylthio group; and R¹, R², π, and p are as defined herein. Similarly, in certain embodiments of the molecular semiconducting compounds according to formula (IIb), the moiety:

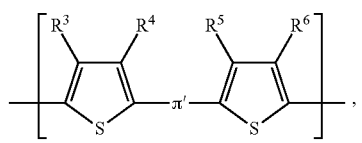

can be

[structure shown]

where R³, R⁴, R⁵, R⁶, and π' are as defined herein.

To illustrate, in particular embodiments of formula (IIa), p can be 1. In particular embodiments of formula (IIb), p' can be 1. In these embodiments, π or π' can be selected from:

To illustrate further, examples of the moiety:

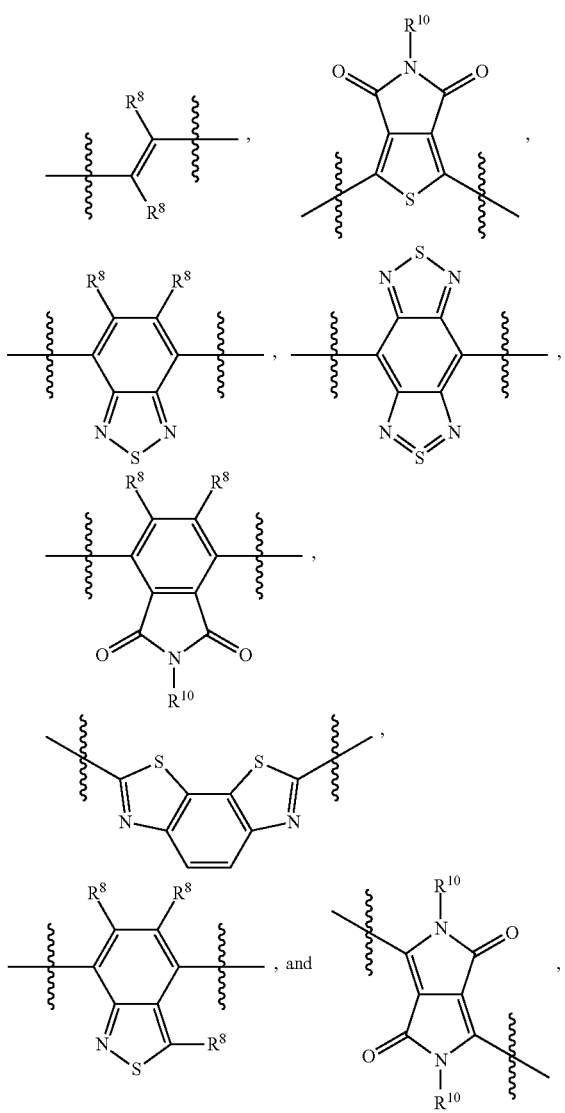

can include where $R^8$, $R^9$, and $R^{10}$ at each occurrence, independently can becan be H, a halogen, CN, a $C_{1-20}$ alkyl group, a $C_{1-20}$ haloalkyl group, a $C_{1-20}$ alkoxy group, and a $C_{1-20}$ alkylthio group; and $R^{10}$, at each occurrence, independently can be a $C_{1-20}$ alkyl group or a $C_{1-20}$ haloalkyl group.

wherein $R^3$ and $R^6$ can be selected from H, a $C_{1-20}$ alkyl group, and a $C_{1-20}$ alkoxy group; $R^8$, at each occurrence, independently can be selected from H, F, and Cl; and $R^{10}$, at each occurrence, independently can be a $C_{1-20}$ alkyl group.

Examples of a molecular semiconducting compound according to formula (IIb) include those having the formula:

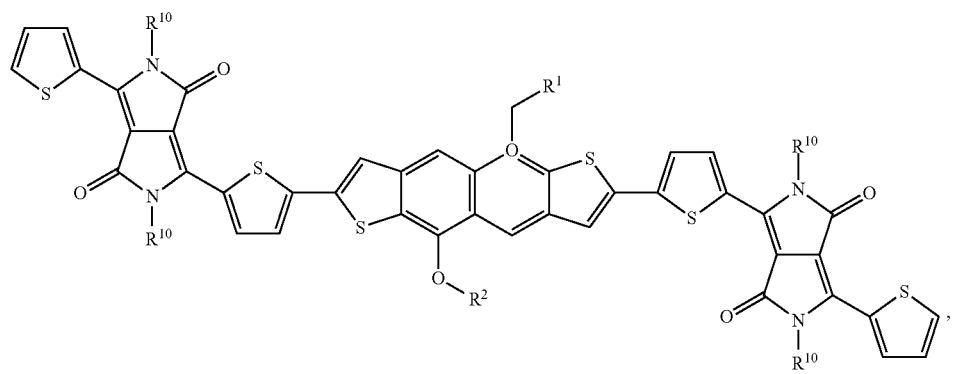

wherein $R^1$, $R^2$ and $R^{10}$ independently can be a $C_{1-20}$ alkyl group.

Compounds of the present teachings can be prepared according to procedures analogous to those described in the Examples. In particular, Stille coupling can be used to prepare polymeric compounds according to the present teachings with high molecular weight and in high yield (≥75%) and purity, as confirmed by $^1$H NMR spectra, elemental analysis, and GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable under ambient conditions ("ambient stable"), soluble in common solvents, and in turn solution-processable into various articles, structures, or devices. Accordingly, compounds of the present teachings can be used to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission. In various embodiments, one or more compounds of the present teachings can be solution-processed into a semiconducting thin film, which can function as an active component in an organic semiconductor device.

As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a polymer according to the present teachings can be described as ambient stable if its carrier mobility or reduction potential does not vary more than 20% or more than 10% from its initial value after exposure to ambient conditions, including, air, humidity and temperature, over a 3 day, 5 day, or 10 day period. Without wishing to be bound by any particular theory, it is believed that the strong electron-depleted electronic structure of the thienocoronene moiety, and in the case of the polymers, the regioregular highly n-conjugated polymeric backbone, can make the present compounds ambient-stable n-channel semiconductor materials without requiring additional n-core functionalization (i.e., core substitution of the thienocoronene moiety) with strong electron-withdrawing functionalities.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

As used herein, "solution-processable" refers to compounds (e.g., thienocoronene-imide copolymers), materials, or compositions that can be used in various solution-phase processes including spin-coating, printing (e.g., inkjet printing, screen printing, pad printing, offset printing, gravure printing, flexographic printing, lithographic printing, massprinting and the like), spray coating, electrospray coating, drop casting, dip coating, and blade coating.

The present teachings, therefore, further provide methods of preparing a semiconductor material. The methods can include preparing a composition that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the compounds disclosed herein are within the scope of the present teachings as are methods of making the same. The present compounds can offer processing and operation advantages in the fabrication and/or the use of these devices.

For example, articles of manufacture such as the various devices described herein can be an electronic or optoelectronic device including a first electrode, a second electrode, and a semiconducting component in contact with the first electrode and the electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

FIG. 1 illustrates the four common types of OFET structures: (a) bottom-gate top-contact structure, (b) bottom-gate bottom-contact structure, (c) top-gate bottom-contact structure, and (d) top-gate top-contact structure. As shown in FIG. 1, an OFET can include a gate dielectric component (e.g., shown as 8, 8', 8", and 8'''), a semiconducting component or semiconductor layer (e.g., shown as 6, 6', 6", and 6'''), a gate electrode or contact (e.g., shown as 10, 10', 10", and 10'''), a substrate (e.g., shown as 12, 12', 12", and 12'''), and source and drain electrodes or contacts (e.g., shown as 2, 2', 2", 2''', 4, 4', 4", and 4'''). As shown, in each of the configurations, the semiconducting component is in contact with the source and drain electrodes and the gate dielectric component.

In certain embodiments, OTFT devices can be fabricated with the present compounds on doped silicon substrates, using $SiO_2$ as the dielectric, in top-contact geometries. In particular embodiments, the active semiconductor layer which incorporates at least a compound of the present teachings can be deposited at room temperature or at an elevated temperature. In other embodiments, the active semiconductor layer which incorporates at least one compound of the present teachings can be applied by spin-coating or printing as described herein. For top-contact devices, metallic contacts can be patterned on top of the films using shadow masks.

In certain embodiments, OTFT devices can be fabricated with the present compounds on plastic foils, using polymers as the dielectric, in top-gate bottom-contact geometries. In particular embodiments, the active semiconducting layer which incorporates at least a compound of the present teachings can be deposited at room temperature or at an elevated temperature. In other embodiments, the active semiconducting layer which incorporates at least a compound of the present teachings can be applied by spin-coating or printing as described herein. Gate and source/drain contacts can be made of Au, other metals, or conducting polymers and deposited by vapor-deposition and/or printing.

In various embodiments, a semiconducting component incorporating compounds of the present teachings can exhibit semiconducting activity, for example, a carrier mobility of $10^{-4}$ cm$^2$/V-sec or greater and/or a current on/off ratio ($I_{on}/I_{off}$) of $10^3$ or greater.

Other articles of manufacture in which compounds of the present teachings are useful are photovoltaics or solar cells. Compounds of the present teachings can exhibit broad optical absorption and/or a tuned redox properties and bulk carrier mobilities, making them desirable for such applications. Accordingly, the compounds described herein can be used as a donor (p-type) semiconductor material in a photovoltaic design, which includes an adjacent n-type semiconductor material that forms a p-n junction. The compounds can be in the form of a thin film semiconductor, which can be deposited on a substrate to form a composite. Exploitation of compounds of the present teachings in such devices is within the knowledge of a skilled artisan.

In various embodiments, a semiconducting component incorporating compounds of the present teachings can enable photovoltaic cells with power conversion efficiency of about 1% or greater.

Figure 2:
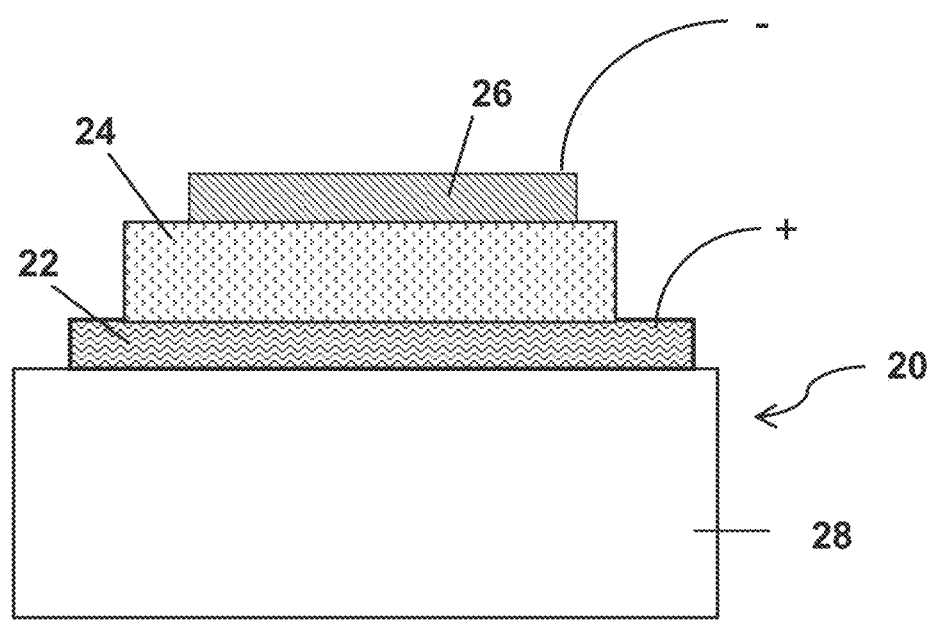
FIG. 2 illustrates a representative structure of a bulk-heterojunction organic photovoltaic device (also known as solar cell), which can incorporate one or more compounds of the present teachings as the donor and/or acceptor materials.
Figure 3:
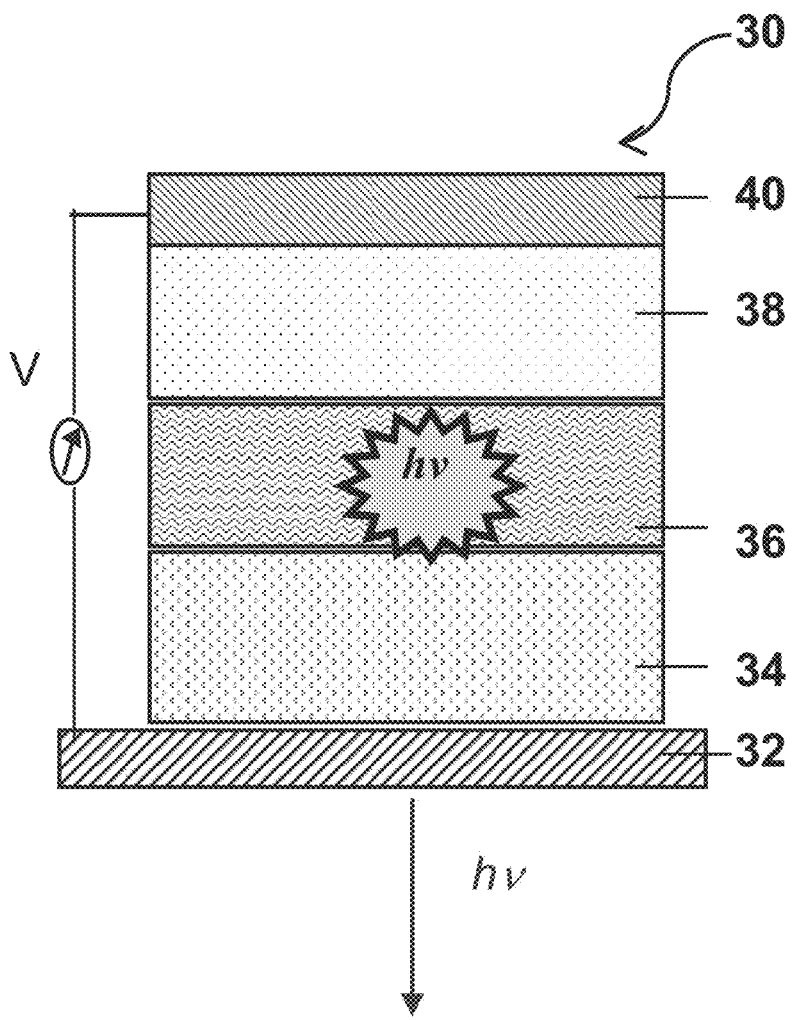
FIG. 3 illustrates a representative structure of an organic light-emitting device, which can incorporate one or more compounds of the present teachings as electron-transporting and/or emissive and/or hole-transporting materials.
Figure 4:
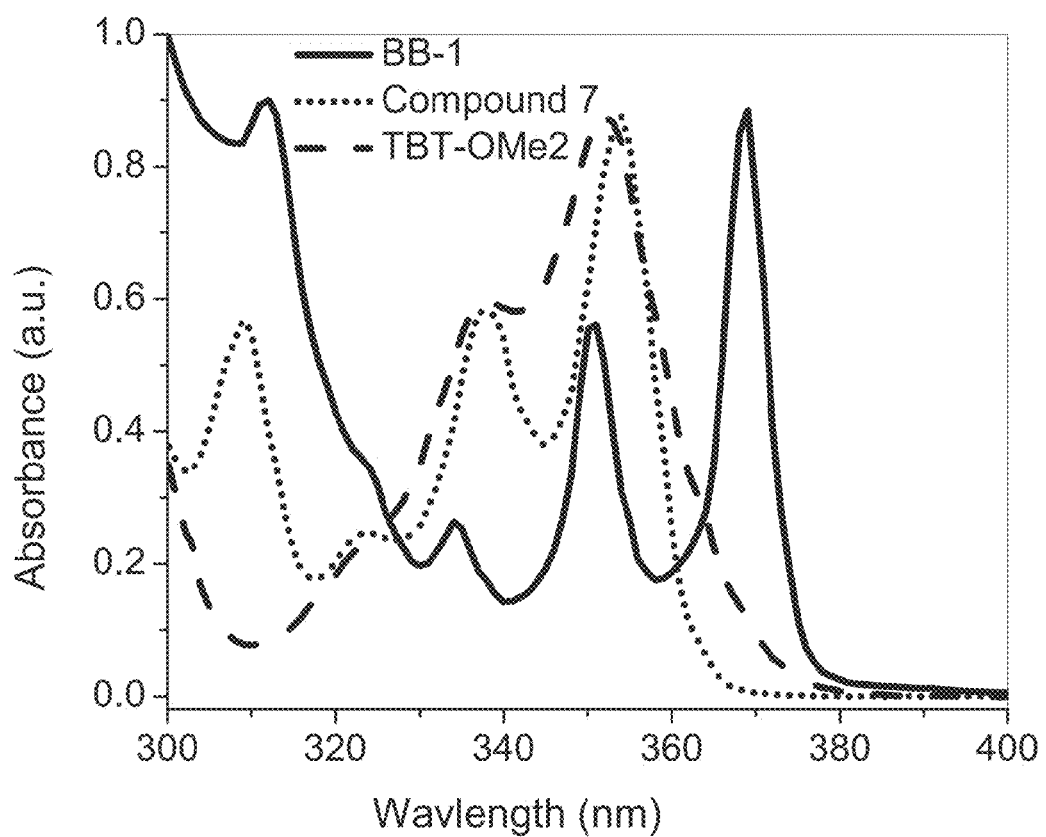
FIG. 4 shows the UV-Vis spectra of Compound 7, TBT-OMe$_2$, and BB-1 in dichloromethane.
Figure 5:
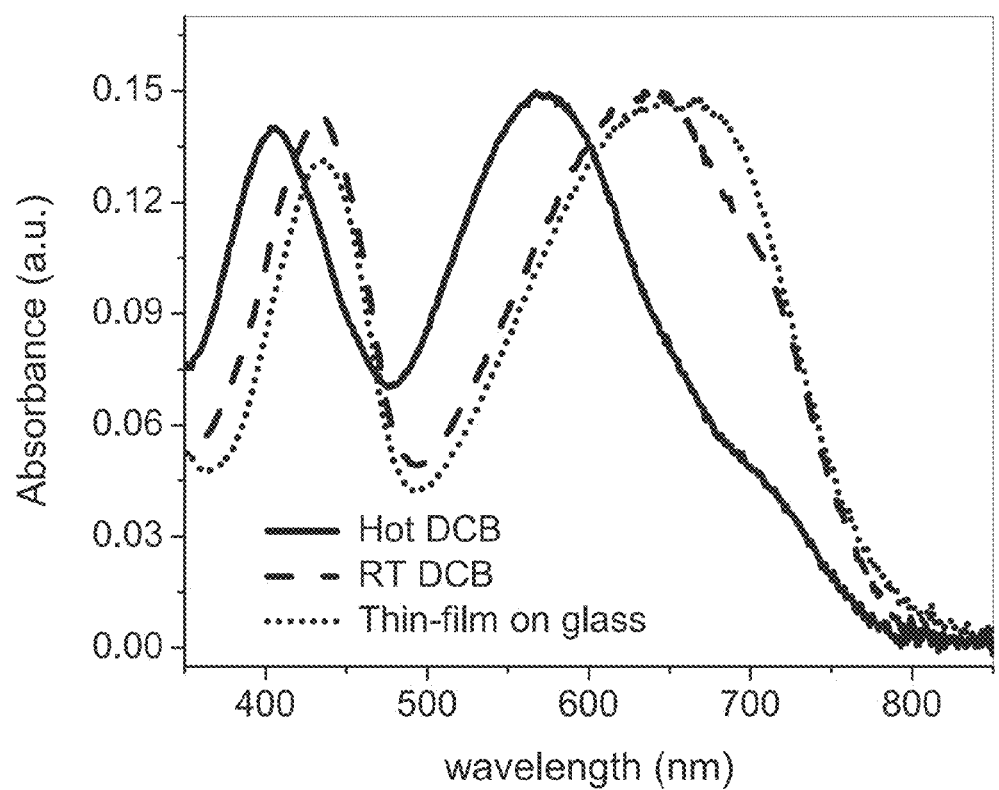
FIG. 5 shows the UV-Vis spectra of POL-1 in hot dichlorobenzene (DCB), in room-temperature DCB (RT DCB), and as a thin film on glass.

Accordingly, another aspect of the present teachings relates to methods of fabricating an organic light-emitting transistor, an organic light-emitting diode (OLED), or an organic photovoltaic device that incorporates one or more semiconductor materials of the present teachings. FIG. 2 illustrates a representative structure of a bulk-heterojunction organic photovoltaic device (also known as solar cell) which can incorporate one or more compounds of the present teachings as the donor and/or acceptor materials. As shown, a representative solar cell generally includes a substrate 20 (e.g., glass), an anode 22 (e.g., ITO), a cathode 26 (e.g., aluminium or calcium), and a photoactive layer 24 between the anode and the cathode which can incorporate one or more compounds of the present teachings as the electron donor (p-channel) and/or electron acceptor (n-channel) materials. FIG. 3 illustrates a representative structure of an OLED which can incorporate one or more compounds of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more compounds of the present teachings as hole-transporting (n-channel) (layer 34 as shown) and/or emissive (layer 36 as shown) and/or electron-transporting (p-channel) materials (layer 38 as shown). In embodiments where the present compounds only have one or two of the properties of hole transport, electron transport, and emission, the present compounds can be blended with one or more further organic compounds having the remaining required property or properties.

The following examples are provided to illustrate further and to facilitate the understanding of the present teachings and are not in any way intended to limit the invention.

All reagents were purchased from commercial sources and used without further purification unless otherwise noted. Anhydrous tetrahydrofuran (THF) was distilled from Na/benzophenone. Conventional schlenk techniques were used and reactions were carried out under nitrogen unless otherwise noted. Examples 1-6 describe the preparation of certain compounds of the present teachings and related intermediates. Characterization data are provided in some cases by $^1$H NMR, $^{13}$C NMR, elemental analysis, and/or electron spray ionization (ESI) mass spectroscopy. NMR spectra were recorded either on a Bruker Avance III 500 spectrometer or on a Varian Unity Plus 500 spectrometer ($^1$H., 500 MHz; $^{13}$C, 125 MHz). Electron spray mass spectrometry was performed with a Thermo Finnegan model LCQ Advantage mass spectrometer.

A. Preparation of Synthetic Building Blocks

Example 1

Preparation of (4,9-bis(dodecyloxy)naphtho[1,2-b:5,6-b']dithiophene-2,7-diyl)bis(trimethylstannane) (BB-1-Sn2)

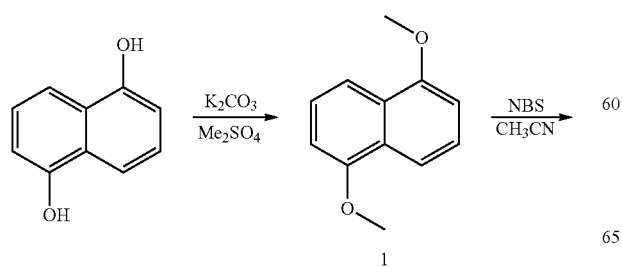

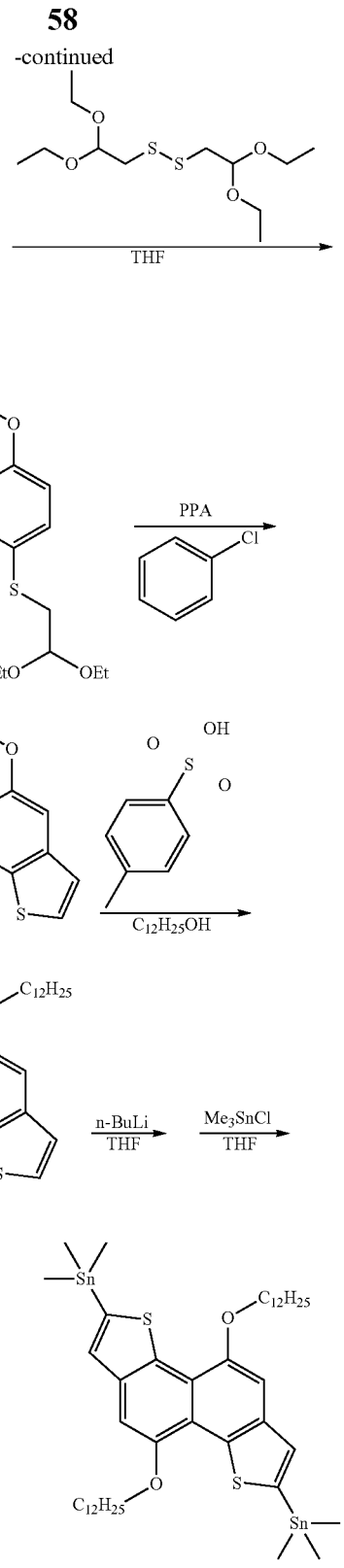

Synthesis of 1,5-dimethoxynaphthalene (1)

Naphthalene-1,5-diol (16.0 g, 100 mmol) and potassium carbonate (27.6 g, 200 mmol) were stirred in acetone (300 mL) and dimethyl sulfate (32 mL) was added using syringe. The mixture was then heated to reflux under nitrogen overnight. Water (300 mL) was added after the mixture was cooled to room temperature. The precipitate was collected by filtration and washed with water (4×50 mL), then methanol (3×50 mL). After drying under vacuum, the solid was heated at reflux in ethanol (300 mL) for 2 hours. After cooling to room temperature, the desired product was then collected by filtration to give a pale brown solid (17.9 g, 95.2%). $^1$H NMR (500 MHz, CDCl$_3$): δ 7.45 (d, J=8.5 Hz, 2H), 7.33 (t, J=8.5 Hz, 2H), 6.83 (d, J=8.5 Hz, 2H), 4.00 (s, 6H).

Synthesis of 1,5-dibromo-4,8-dimethoxynaphthalene (2)

1,5-Dimethoxynaphthalene (2.31 g, 12.3 mmol) was stirred in acetonitrile (30 mL) and cooled to 0° C. under nitrogen. The slurry of N-bromosuccinimide (4.81 g, 27.0 mmol) in acetonitrile (40 mL) was added dropwise. Upon the addition, the mixture was warmed to room temperature slowly and the mixture was stirred for another 3 hours. The precipitate that was formed was collected by filtration, and 1,5-dibromo-4,8-dimethoxynaphthalene (2) was obtained as a grey solid (1.70 g, 40%) after washing with acetonitrile (2×5 mL) and methanol (4×5 mL). $^1$H NMR (500 MHz, CDCl$_3$): δ 7.69 (d, J=8.5 Hz, 2H), 6.73 (d, J=8.5 Hz, 2H), 3.90 (s, 6H).

Synthesis of (4,8-dimethoxynaphthalene-1,5-diyl)bis ((2,2-diethoxyethyl)sulfane)) (3)

1,5-Dibromo-4,8-dimethoxynaphthalene (0.346 g, 1.00 mmol) was solubilised in anhydrous THF (10 mL) and cooled at −78° C. under nitrogen. N-Butyllithium (1.0 mL, 2.5M in hexane, 2.5 mmol) was then added and the stirring was continued for 30 minutes at −78° C. The reaction mixture was then warmed to room temperature and cooled down to −78° C. immediately. After another hour, the mixture was treated with bis(2,2-diethoxyethyl)disulfide (0.746 g, 2.50 mmol) and kept at −78° C. for 30 minutes before warming up to room temperature slowly and the resulted mixture was stirred overnight. The solvent was then removed and the residual was dissolved in dichloromethane (20 mL) and passed through a short silica plug eluting with dichloromethane/ethyl acetate (20:1). After the solvent was removed under vacuum, the residual was recrystallized from isopropanol (10 mL) to give 3 as a pale yellow solid (0.30 g, 62%). $^1$H NMR (500 MHz, CD$_2$Cl$_2$): δ 7.28 (d, J=8.5 Hz, 2H), 6.86 (d, J=8.5 Hz, 2H), 4.73 (t, J=5.0 Hz, 2H); 3.94 (s, 6H); 3.71 (m, 4H); 3.60 (m, 4H); 3.11 (d, J=5.5 Hz, 4H); 1.22 (t, J=7.0 Hz, 12H).

Synthesis of (4,9-dimethoxynaphtho[1,2-b:5,6-b'] dithiophene) (4)

Polyphosphoric acid (0.29 g) was solubilized in chlorobenzene (10.0 mL) and heated at reflux for 3 hours under nitrogen. A solution of compound 3 (0.225 g, 0.464 mmol) in chlorobenzene (3.0 mL) was added dropwise to the reaction mixture. The mixture was stirring was continued at reflux overnight. After the mixture was cooled down to room temperature, dichloromethane (100 mL) was added, and the mixture was washed with NaHCO$_3$ (saturated, 2×50 mL) and brine (50 mL). The solution was dried over Na$_2$SO$_4$ and concentrated under vacuum. The residual was refluxed in isopropanol (30 mL) for 2 hours. After cooling down to room temperature, compound 4 was obtained by filtration as a pale yellow solid (120 mg, 86%). $^1$H NMR (500 MHz, CDCl$_3$): δ 7.59 (d, J=5.5 Hz, 2H), 7.45 (d, J=5.5 Hz, 2H), 7.44 (s, 2H), 4.19 (s, 6H).

Synthesis of (4,9-bis(dodecyloxy)naphtho[1,2-b:5,6-b']dithiophene (BB-1)

Compound 4 (150 mg, 0.50 mmol) and p-toluenesulfonic acid monohydrate (15.2 mg, 0.080 mmol) were heated in dodecan-1-ol (3.7 g, 20 mmol) at 200° C. under nitrogen overnight. Upon cooling down to room temperature, the solvent was removed under vacuum and the residual was purified with silica gel column and eluted with CHCl$_3$/hexane (1:4 and then 2:3) to give compound BB1 as a white solid (110 mg, about 36% yield). $^1$H NMR (500 MHz, CDCl$_3$): δ 7.56 (d, J=5.0 Hz, 2H), 7.42 (d, J=5.0 Hz, 2H), 7.41 (s, 2H), 4.32 (t, J=6.5 Hz, 4H), 2.13 (quintet, J=7.5 Hz, 4H); 1.68 (quintet, J=7.5 Hz, 4H); 1.39 (m, 32H); 0.86 (t, J=6.0 Hz, 6H).

Synthesis of (4,9-bis(dodecyloxy)naphtho[1,2-b:5,6-b']dithiophene-2,7 diyl)bis(trimethylstannane) (BB-1-Sn2)

Compound BB-1 (608 mg, 1.00 mmol) was solubilized in anhydrous THF (30 mL) and cooled at −78° C. under nitrogen. N-Butyllithium (1.0 mL, 2.5M, 2.5 mmol) was added and stirring was continued for 30 minutes. The mixture was warmed to room temperature and stirred at this temperature for another 30 minutes. The mixture was cooled to −78° C. and stirring was continued for another hour. Trimethyltin chloride (0.50 g, 2.5 mmol) in anhydrous THF (5.0 mL) was added in one portion and the mixture was warmed to room temperature slowly and stirring was continued overnight. The solvent was removed under vacuum, and the residual was solubilized in dichloromethane (100 mL) and washed with water (100 mL) and brine (100 mL). The solution was dried over Na$_2$SO$_4$ and concentrated under vacuum. The residual was recrystallized from isopropanol (30 mL) to give compound BB-1-Sn2 as a pale yellow solid (0.80 g, about 85% yield). $^1$H NMR (500 MHz, CDCl$_3$): δ 7.49 (s, 2H), 7.40 (s, 2H), 4.32 (t, J=6.5 Hz, 4H), 2.12 (m, 4H); 1.72 (m, 4H); 1.39 (m, 32H); 0.86 (t, J=7.0 Hz, 6H), 0.43 (t, J=30 Hz, 18H).

Example 2

Preparation of (4,9-bis(2-octyldecyl)naphtho[1,2-b: 5,6-b']dithiophene-2,7-diyl)bis(trimethylstannane) (BB-2-Sn2)

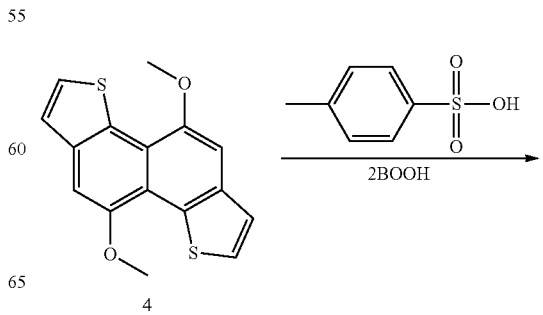

4

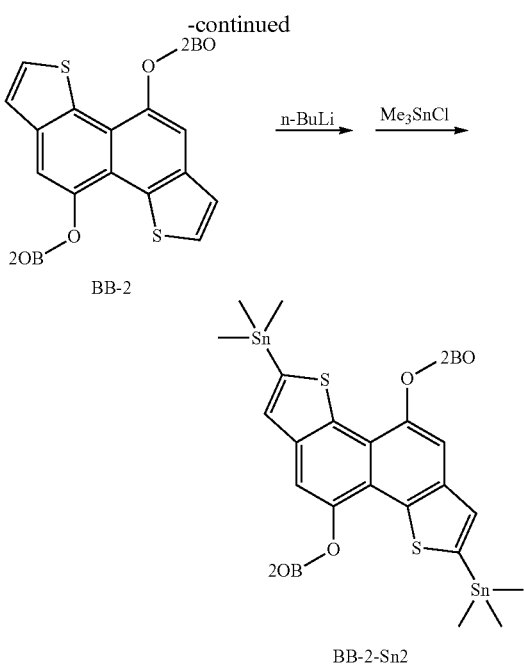

purified with silica gel column and eluted with hexane then CHCl₃/hexane (1:9) to give compound BB-2 as a pale yellow oil (1.80 g, 90%). ¹H NMR (500 MHz, CD₂Cl₂): δ 7.65 (d, J=5.0 Hz, 2H), 7.52 (s, 2H), 7.49 (d, J=5.5 Hz, 2H), 4.27 (d, J=5.5 Hz, 4H), 2.20 (m, 2H); 1.82 (m, 4H); 1.64 (m, 4H), 1.39 (m, 24H); 0.91 (m, 12H).

Synthesis of (4,9-bis(2-octyldecyl)naphtho[1,2-b:5,6-b']dithiophene-2,7 diyl)bis(trimethylstannane) (BB-2-Sn-2)

Compound BB-2 (608 mg, 1.00 mmol) was solubilized in anhydrous THF (30 mL) and cooled at −78° C. under nitrogen. N-Butyllithium (1.0 mL, 2.5M, 2.5 mmol) was added and stirring was continued for 30 minutes. The mixture was warmed to room temperature and stirring was continued for another 30 minutes. The mixture was cooled to −78° C. and stirring was continued for another hour. Trimethyltin chloride (0.50 g, 2.5 mmol) in anhydrous THF (5.0 mL) was added in one portion. The mixture was warmed to room temperature slowly and stirring was continued overnight. The solvent was removed under vacuum and the residual was dissolved in dichloromethane (100 mL) and washed with water (100 mL) and brine (100 mL). The solution was dried over Na₂SO₄ and concentrated under vacuo. The residual was recrystallized from isopropanol to give BB-2-Sn-2 as a pale yellow solid (0.75 g, ~80% yield). ¹H NMR (500 MHz, CDCl₃): δ 7.50 (s, 2H), 7.42 (s, 2H), 4.18 (t, J=5.5 Hz, 4H), 2.18 (m, 2H); 1.80 (m, 4H); 1.39 (m, 28H); 0.8-0.9 (m, 12H), 0.43 (t, J=30 Hz, 18H).

Synthesis of (4,9-bis(2-octyldecyl)naphtho[1,2-b:5,6-b']dithiophene (BB-2)

Compound 4 (1.0 g, 3.3 mmol) and p-toluenesulfonic acid monohydrate (0.63, 3.3 mmol) were heated in 2-butyl-1-octanol (25.0 mL) at 200° C. under nitrogen overnight. The solvent was removed under vacuum, and the residual was Example 3

Preparation of 5,10-bis-dodecyloxy-1,6-dithia-dicyclopenta[a,f]naphthalene (BB-3-Sn2)

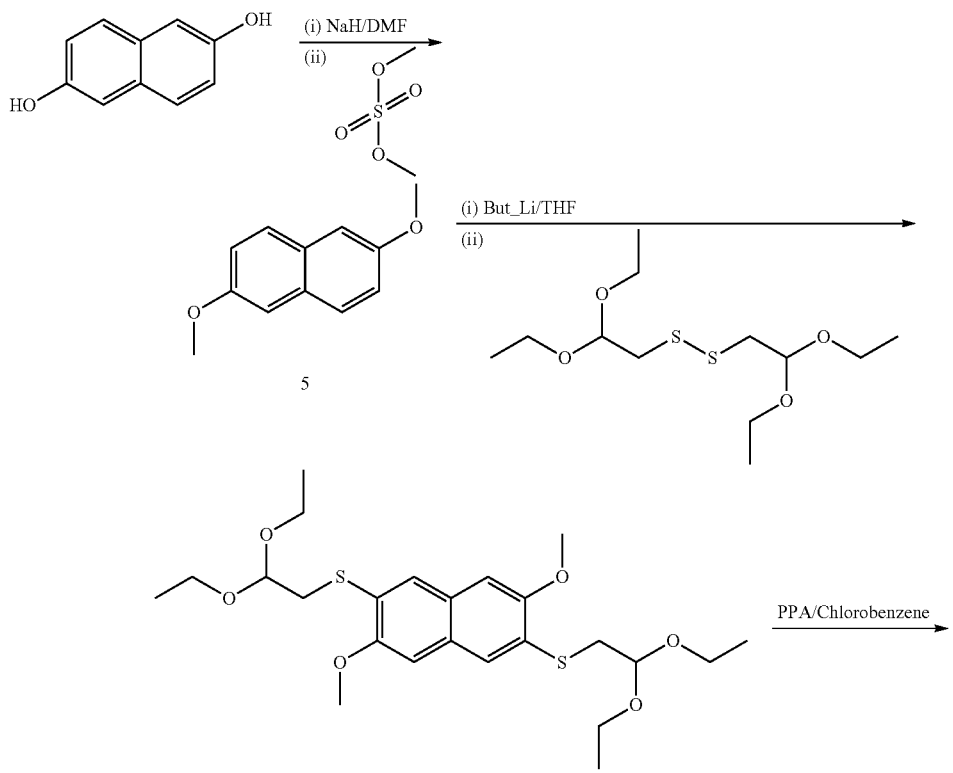

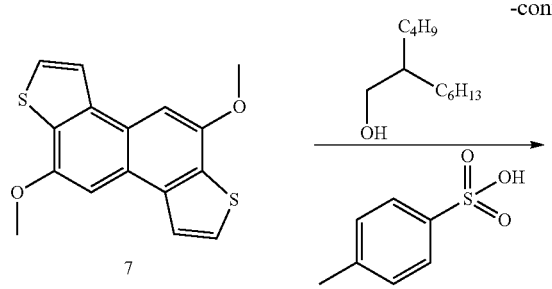
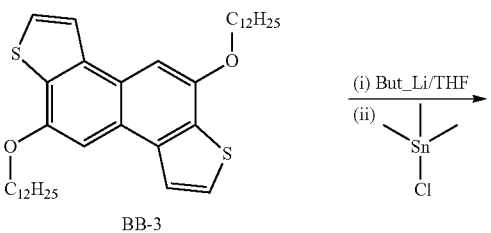

BB-3-Sn2

Synthesis of 2,6-dimethoxy-naphthalene (5)

Naphthalene-2,6-diol (16.0 g, 0.1 mol) and NaH (6.0 g, 0.25 mol) was combined together in a 500 mL flask under argon. The mixture was cooled to −78° C. before the addition of anhydrous DMF (200 mL) by injection. The mixture emitted a significant amount o gas. Stirring was continued at room temperature for 2 hours. Dimethyl sulfate (31.5 g, 0.25 mol) was added dropwise after the mixture was cooled to −78° C. again. The reaction was continued overnight at room temperature before 200 mL of anhydrous DMF was added. Compound 5 (16.0 g, ~85.1% yield) was collected as a white powder by filtration and washed with water and methanol before drying under vacuum. $^1$H NMR (CDCl$_3$, 500 MHz): δ 7.67 (d, 2H, J=8.5 Hz), δ 7.17 (d×d, 2H, J=8.5 Hz×2.5 Hz), δ 7.13 (d, 2H, J=2.5 Hz), δ 7.13 (d, 2H, J=2.5 Hz), δ 3.93 (s, 6H).

Synthesis of 2,6-bis-(2,2-diethoxy-ethylsulfanyl)-3,7-dimethoxy-naphthalene (6)

To a 200 mL Schlenk flask, compound 5 (3.76 g, 20.0 mmol) was added. The system was vacuumed and backfilled with argon 3 times before 100 mL of anhydrous THF was added. After the mixture was cooled to 0° C. for 30 minutes, n-butyllithium (34 mL, 2.5 M, 85.0 mmol) was injected dropwise. The resulting mixture was stirred at room temperature for 4 hours before being cooled to −78° C. 2-(2,2-Diethoxy-ethyldisulfanyl)-1,1-diethoxyethane (26.6 g, 103 mmol) was injected in one portion. The dry ice bath was removed 5 minutes later and the mixture was stirred overnight. Water (100 mL) was added to quench the reaction and the mixture was stirred at room temperature for 10 minutes. Hexane (150 mL×3) was used to extract the product and the combined organic layer was dried with anhydrous Na$_2$SO$_4$. Methanol (150 mL) was added and compound 6 (5.0 g, ~52.0% yield) as a yellow solid was collected by filtration and washed with methanol and dried under vacuum. $^1$H NMR (CDCl$_3$, 500 MHz): δ 7.62 (s, 2H), δ 7.00 (s, 2H), 6 (t, 2H, J=2.5 Hz), δ 3.99 (s, 6H), δ 3.73 (m, 4H), δ 3.60 (m, 4H), δ 3.23 (d, 4H, J=2.5 Hz), δ 1.23 (t, 12H, J=9.0 Hz).

Synthesis of 5,10-dimethoxy-1,6-dithia-dicyclopenta[a,f]naphthalene (7)

Compound 6 (5.0 g, 10.3 mmol) and 6.8 g of 84% polyphosphoric acid were added into a 250 mL 3-neck flask equipped with a condenser. The system was flashed with argon for 15 minutes before 50 mL of anhydrous chlorobenzene was added. The mixture was heated at 140° C. for 40 hours before it was cooled down to room temperature. Dichloromethane (100 mL) was added. The organic mixture was washed with saturated NaHCO$_3$ before the solvent was removed under vacuum. Methanol (100 mL) was added before compound 7 (2.0 g, ~66% yield) was collected as a white solid by filtration, washed with methanol and dried in vacuo. $^1$H NMR (CDCl$_3$, 500 MHz): δ 7.97 (d, 2H, J=5.5 Hz), δ 7.62 (d, 2H, J=5.5 Hz), 67.51 (s, 2H), δ 4.18 (s, 6H).

Synthesis of 5,10-bis-dodecyloxy-1,6-dithia-dicyclopenta[a,f]naphthalene (BB-3)

5,10-Dimethoxy-1,6-dithia-dicyclopenta[a,f]naphthalene 7 (230 mg, 0.77 mmol) and 145 mg (0.77 mmol) of toluene-4-sulfonic acid (CH$_3$C$_6$H$_4$SO$_3$H.H$_2$O) and 7 mL of 1-dodecanol was added into a 50 mL 3-neck flask equipped with a condenser. The system was heated at 180° C. overnight under argon before it was cooled down to room temperature. Hexane (50 mL) was added and the organic layer was washed with saturated NaHCO$_3$ before the solvent was removed under vacuum. Excess 1-dodecanol was distilled out under vacuum. Column chromatography (silica gel) with the eluent of hexane/dichloromethane (v/v, 4/1) yielded BB-3 as a white solid (320 mg, ~68.2% yield). $^1$H NMR (CDCl$_3$, 500 MHz): δ 7.95 (d, 2H, J=5.5 Hz), δ 7.61 (d, 2H, J=5.5 Hz), δ 7.50 (s, 2H), δ 4.35 (t, 4H, J=6.0 Hz), δ 1.99 (m, 4H), δ 1.61 (m, 4H), δ 1.29 (m, 32H), δ 0.90 (t, 6H, J=6.5 Hz).

Synthesis of 5,10-Bis-dodecyloxy-2,7-bis-trimethyl-stannanyl-1,6-dithia-dicyclopenta[a,f]naphthalene (BB-3-Sn2)

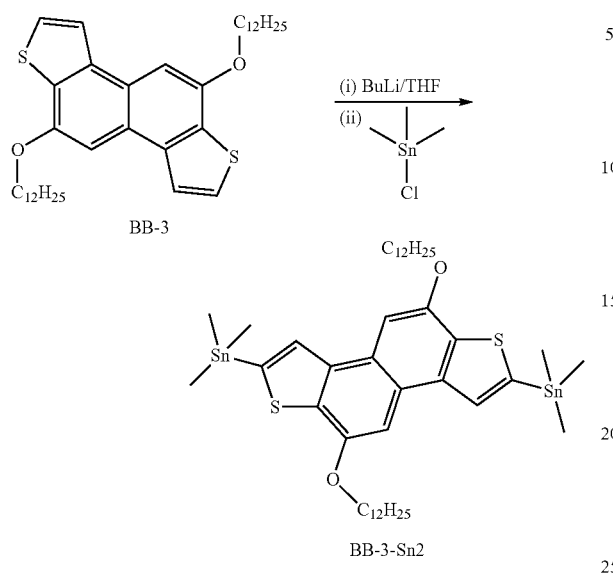

5,10-Bis-dodecyloxy-1,6-dithia-dicyclopenta[a,f]naphthalene (BB-3, 0.366 g, 0.6 mmol) was added into a 50 mL flask. The system was vacuumed and backfilled with argon 3 times before 17 mL of anhydrous THF was injected. N-Butyllithium (0.6 mL, 2.5 M in hexane, 1.5 mmol) was added after the mixture was cooled to −78° C. A white precipitate was observed after the mixture was stirred at −78° C. for 30 minutes. Stirring was continued at room temperature for one more hour before the mixture was cooled down to −78° C. again. Trimethyltin chloride (0.5 g, 2.5 mmol) was added in portions and stirring was continued overnight at room temperature. Hexane (100 mL) was added and the organic layer was washed with 150 mL of water. The aqueous layer was extracted with 50 mL of hexane twice. The combined organic layer was dried over anhydrous $Na_2SO_4$. Removal of the solvent under vacuum yielded a white solid. The colorless crystalline product (0.48 g, ~85.7% yield) was obtained after recrystallization from a hexane/iso-propanol mixture. $^1$H NMR ($CDCl_3$, 500 MHz): δ 7.80 (s, 2H), δ 7.51 (s, 2H), δ 4.37 (t, 4H, J=6.5 Hz), δ 2.00 (m, 4H), δ 1.63 (m, 4H), δ 1.46 (m, 4H), δ 1.30 (m, 28H), δ 0.90 (t, 6H, J=7.0 Hz), δ 0.51 (m, 18H).

Example 4

Preparation of (4,9-bis(2-octyldecyl)naphtho[1,2-b:5,6-b']dithiophene-2,7-diyl)bis(trimethylstannane) (BB-4-Sn2)

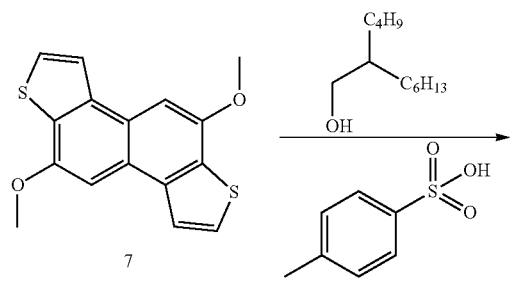

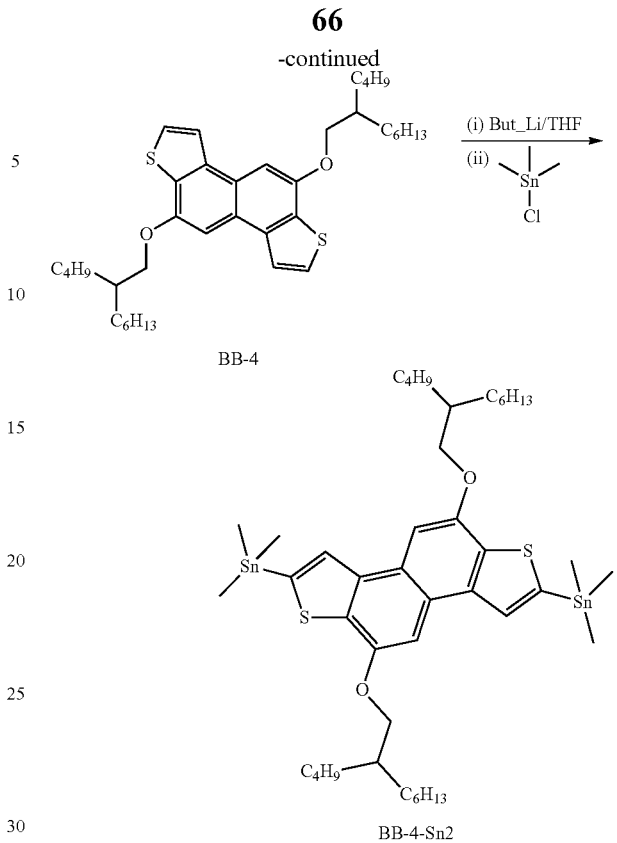

Synthesis of 5,10-bis-(2-butyl-octyloxy)-1,6-dithia-dicyclopenta[a,f]naphthalene (BB-4)

Compound 7 (1.80 g, 6.0 mmol), 1.14 g (6.0 mmol) of toluene-4-sulfonic acid ($CH_3C_6H_4SO_3H.H_2O$), and 35 mL of 2-butyloctanol were added into a 250 mL 3-neck flask equipped with a ondenser. The system was heated at 180° C. overnight under argon before the mixture was cooled down to room temperature. Hexane (200 mL) was added and the organic layer was washed with saturated $NaHCO_3$ before the solvent was removed under vacuum. Excess 2-butyloctanol was distilled out under vacuum. Column chromatography (silica gel) with an eluent of hexane/dichloromethane (v/v, 100/4) yielded product BB-4 as a colorless liquid (2.5 g, ~68.5% yield). $^1$H NMR ($CDCl_3$, 500 MHz): δ 7.96 (d, 2H, J=5.5 Hz), δ 7.60 (d, 2H, J=5.5 Hz), δ 7.50 (s, 2H), δ 4.23 (d, 4H, J=5.5 Hz), δ 1.99 (m, 2H), δ 1.33 (m, 32H), δ 0.96 (t, 6H, J=7.0 Hz), δ 0.90 (t, 6H, J=7.0 Hz).

Synthesis of 5,10-bis-(2-butyl-octyloxy)-2,7-bis-trimethylstannanyl-1,6-dithia-dicyclopenta[a,f]naphthalene (BB-4-Sn2)

Compound BB-4 (1.41 g, 2.3 mmol) was added into a 200 mL flask. The system was vacuumed and backfilled with argon 3 times before 60 mL of anhydrous THF was injected. N-Butyllithium (2.2 mL, 2.5 M in hexane, 5.09 mmol) was added after the mixture was cooled to −78° C. A white precipitate was observed after the mixture was stirred at −78° C. for 30 minutes. Stirring was continued at room temperature for one more hour before the mixture was cooled down to −78° C. again. Trimethyltin chloride (1.20 g, 5.75 mmol) was added in portions and stirring was continued overnight at room temperature. Hexane (100 mL) was added and the organic layer was washed with 150 mL of water. The aqueous layer was extracted with 100 mL of hexane twice. The combined organic layer was dried over anhydrous $Na_2SO_4$. Removal of solvent under vacuum yielded a white solid. The colorless crystalline product (1.70 g, ~79% yield) was obtained after recrystallization from a hexane/iso-propanol mixture. $^1$H NMR (CDCl$_3$, 500 MHz): δ 7.80 (s, 2H), δ 7.69 (s, 2H), δ 4.25 (d, 4H, J=5.5 Hz), δ 1.99 (m, 2H), δ 1.33 (m, 32H), δ 0.96 (t, 6H, J=7.0 Hz), δ 0.90 (t, 6H, J=7.0 Hz), δ 0.51 (m, 18H).

Example 5

Synthesis of (2-(4,9-bis(dodecyloxy)naphtho[1,2-b:5,6-b']dithiophen-2-yl)-4,4,5,5-tetramethyl-1,3,2-dioxaborolane) (BB-1-BOR)

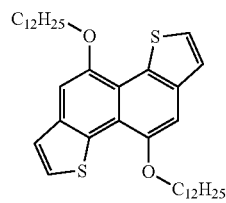
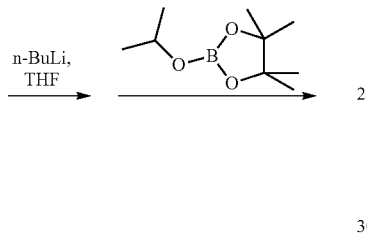

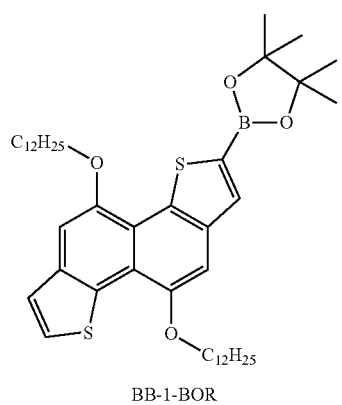

BB-1-BOR

Compound BB-1 (0.50 g, 0.82 mmol) and was solubilized in anhydrous THF (30 mL) and cooled at −78° C. under nitrogen. N-Butyllithium (0.32 mL, 2.5M, 0.82 mmol) was added and stirring was continued for 30 minutes. The mixture was then warmed to room temperature and stirring was continued for another 30 minutes. The mixture was cooled to −78° C. and stirring was continued for another hour. 2-Isopropoxy-4,4,5,5-tetramethyl-1,3,2-dioxaborolane (0.50 g, 2.7 mmol) in anhydrous THF (5.0 mL) was added in one portion and the mixture was warmed to room temperature slowly and stirring was continued overnight. The solvent was removed under vacuum and the residual was dissolved in a mixture of dichloromethane:hexane (1/1, 10 mL) and passed through a short silica plug eluenting with dichloromethane:hexane (1/1) to give compound BB-1-BOR as a pale yellow solid (0.19 g, 32%). $^1$H NMR (500 MHz, CDCl$_3$): δ 7.84 (s, 1H), 7.58 (d, J=5.0 Hz, 1H), 7.40 (m, 2H), 7.37 (s, H), 4.34 (t, J=6.5 Hz, 2H), 4.31 (t, J=6.5 Hz, 2H), 2.13 (m, 4H); 1.72 (m, 4H); 1.39 (m, 44H); 0.86 (m, 6H).

Example 6

Synthesis of 2-bromo-4,9-bis(dodecyloxy)naphtho[1,2-b:5,6-b']dithiophene (BB-1-Br)

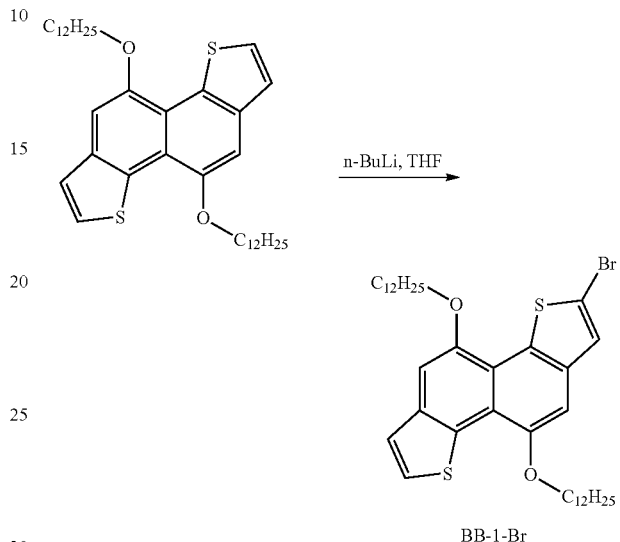
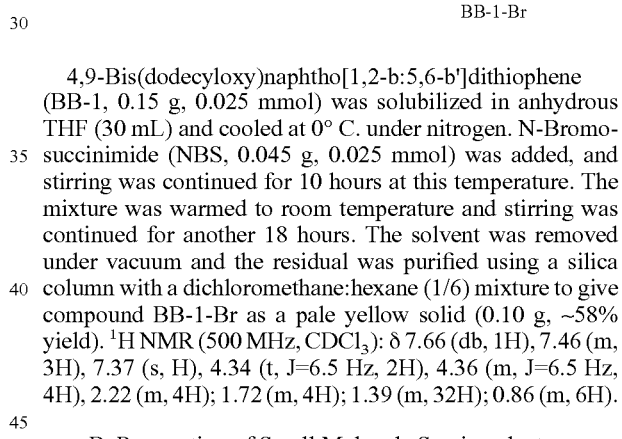

4,9-Bis(dodecyloxy)naphtho[1,2-b:5,6-b']dithiophene (BB-1, 0.15 g, 0.025 mmol) was solubilized in anhydrous THF (30 mL) and cooled at 0° C. under nitrogen. N-Bromosuccinimide (NBS, 0.045 g, 0.025 mmol) was added, and stirring was continued for 10 hours at this temperature. The mixture was warmed to room temperature and stirring was continued for another 18 hours. The solvent was removed under vacuum and the residual was purified using a silica column with a dichloromethane:hexane (1/6) mixture to give compound BB-1-Br as a pale yellow solid (0.10 g, ~58% yield). $^1$H NMR (500 MHz, CDCl$_3$): δ 7.66 (db, 1H), 7.46 (m, 3H), 7.37 (s, H), 4.34 (t, J=6.5 Hz, 2H), 4.36 (m, J=6.5 Hz, 4H), 2.22 (m, 4H); 1.72 (m, 4H); 1.39 (m, 32H); 0.86 (m, 6H).

B. Preparation of Small Molecule Semiconductors

Example 7

Preparation of (5,5'-bis(4,9-bis(dodecyloxy)naphtho[1,2-b:5,6-b']dithiophen-2-yl)-2,2'-bithiophene) (SM-1)

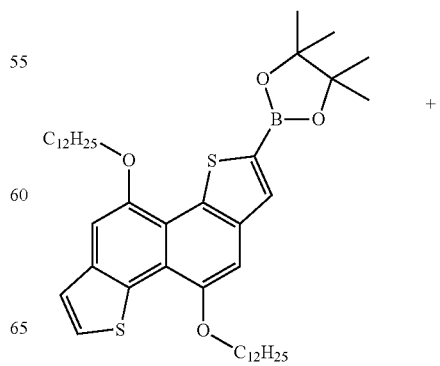

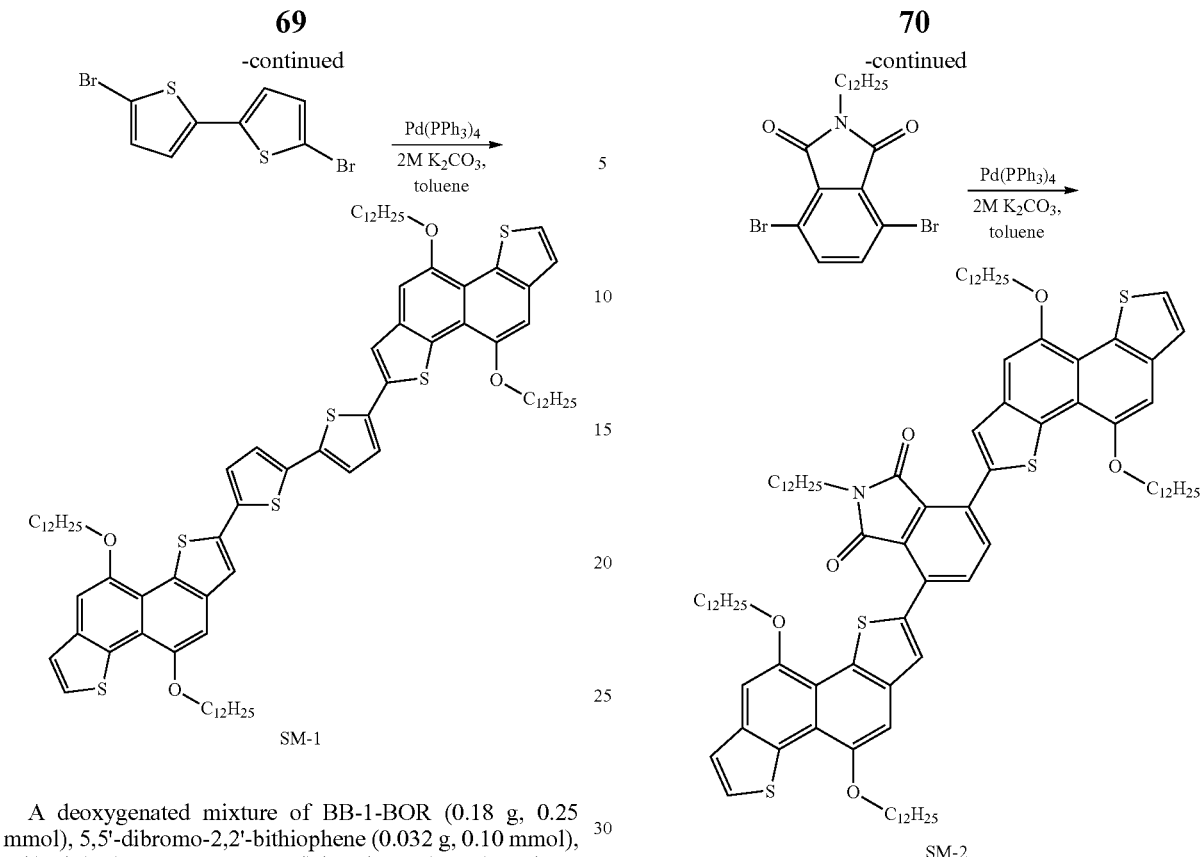

A deoxygenated mixture of BB-1-BOR (0.18 g, 0.25 mmol), 5,5'-dibromo-2,2'-bithiophene (0.032 g, 0.10 mmol), Pd(PPh$_3$)$_4$ (0.002 g, 0.02 mmol) in toluene (5 mL), and 2M aqueous K$_2$CO$_3$ (3 mL) was heated to 90° C. for 2 hours under nitrogen in a 2-neck round-bottomed flask with a reflux condenser attached. Methanol (30 mL) was added to the mixture and the resultant solid was filtered and washed with water (5 mL×3) and methanol (5 mL×3). The solid was recrystallized from isopropanol:toluene (3/1) to give SM-1 as an orange solid (0.089 g, ~64% yield). $^1$H NMR (500 MHz, CD$_2$Cl$_2$): δ 7.65 (d, J=5.5 Hz, 2H), 7.59 (s, 2H), 7.50 (m, 4H), 7.41 (s, 2H), 7.35 (d, J=4.0 Hz, 2H), 7.26 (d, J=4.0 Hz, 2H), 4.41 (m, 8H), 2.25 (m, 8H), 1.82 (m, 4H), 1.80 (m, 4H), 1.52-1.20 (m, 64H), 0.84 (m, 12H).

Example 8

Preparation of (4,7-bis(4,9-bis(dodecyloxy)naphtho [1,2-b:5,6-b']dithiophen-2-yl)-2-dodecylisoindoline-1,3-dione) (SM-2)

A deoxygenated mixture of compound BB-1-BOR (0.18 g, 0.25 mmol), 4,7-dibromo-2-dodecylisoindoline-1,3-dione (0.047 g, 0.10 mmol), Pd(PPh$_3$)$_4$ (0.002 g, 0.02 mmol) in toluene (8 mL), and 2M aqueous K$_2$CO$_3$ (5 mL) was heated to 90° C. for 16 hours under nitrogen in a 2-neck round-bottomed flask with a reflux condenser attached. Toluene (50 mL) was added to the mixture and the resultant mixture was washed with water (50 mL×2). The organic phase was dried with anhydrous Na$_2$SO$_4$. After the solid was removed via filtration and the solvent was removed by rotary evaporation, the residue was purified using column chromatography on silica gel, eluted with chloroform:hexane (1/2) to give SM-2 as a dark yellow solid (0.064 g, ~43% yield). $^1$H NMR (500 MHz, CD$_2$Cl$_2$): δ 8.28 (s, 2H), 8.07 (s, 2H), 7.68 (d, J=5.0 Hz, 2H), 7.55 (s, 2H), 7.53 (m, 4H), 4.43 (m, 8H), 3.75 (t, J=8.5 Hz, 2H), 2.25 (m, 8H), 1.80 (m, 10H), 1.52-1.20 (m, 82H), 0.90-0.80 (m, 15H).

Example 9

Preparation of (1,3-bis(4,9-bis(dodecyloxy)naphtho [1,2-b:5,6-b']dithiophen-2-yl)-5-dodecyl-4H-thieno [3,4-c]pyrrole-4,6(5H)-dione) (SM-3)

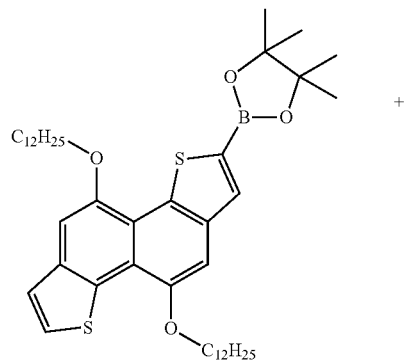 + 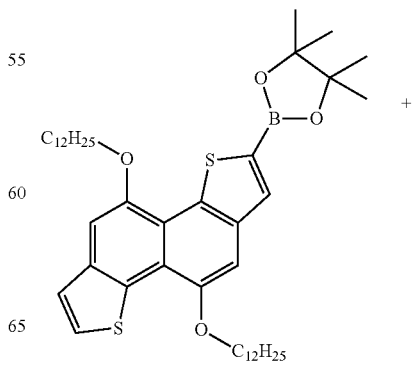 +

Example 10

Preparation of (5,5'-bis(4,9-bis(dodecyloxy)naphtho[1,2-b:5,6-b']dithiophen-2-yl)-2,2'-bithiophene) (SM-4)

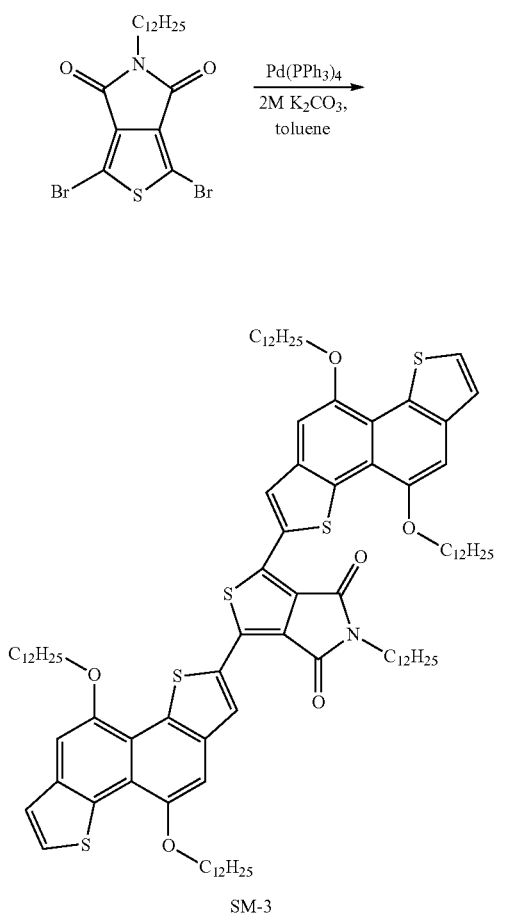

SM-3

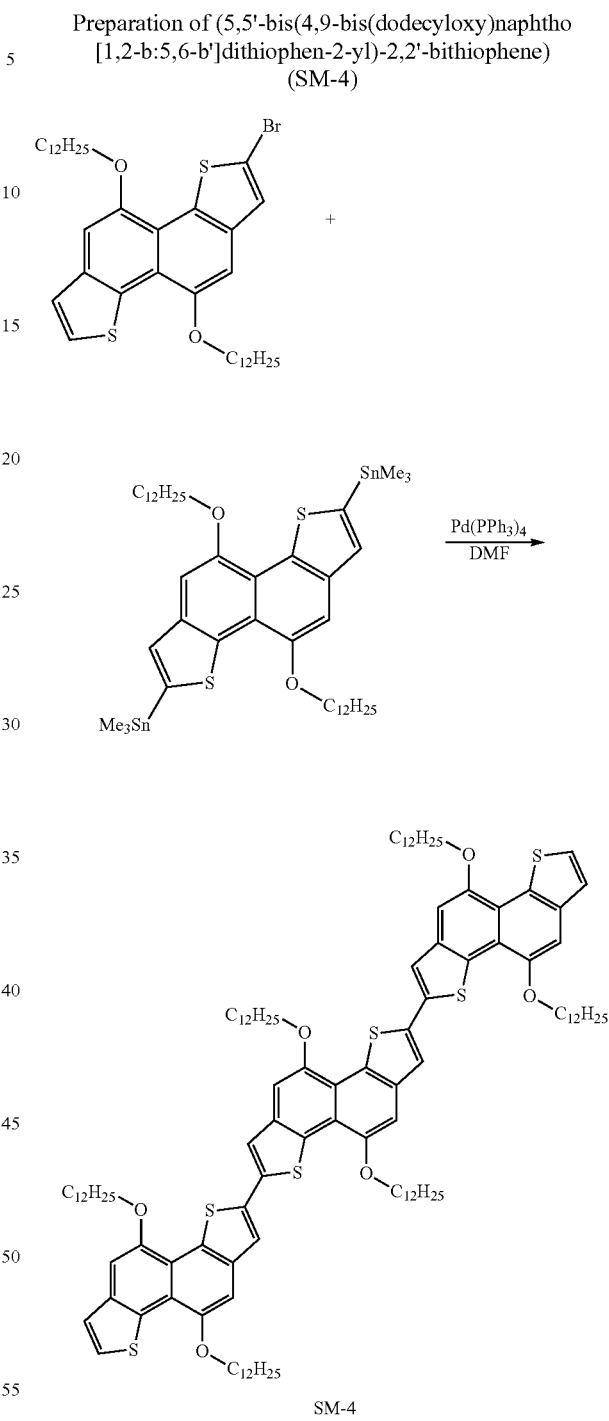

SM-4

A deoxygenated mixture of compound BB-1-BOR (0.18 g, 0.25 mmol), 1,3-dibromo-5-dodecyl-4H-thieno[3,4-c]pyrrole-4,6(5H)-dione (0.048 g, 0.10 mmol), Pd(PPh$_3$)$_4$ (0.002 g, 0.02 mmol) in toluene (8 mL), and 2M aqueous Na$_2$CO$_3$ (5 mL) was heated to 90° C. for 16 hours under nitrogen in a 2-neck round-bottomed flask with a reflux condenser attached. Toluene (50 mL) was added to the mixture and the resultant mixture was washed with water (50 mL×2). The organic phase was dried with anhydrous Na$_2$SO$_4$. After the solid was removed via filtration and the solvent was removed by rotary evaporation, the residue was purified using column chromatography on silica gel, eluted with chloroform:hexane (1/2) to give SM-3 as a red solid (0.077 g, ~51% yield). $^1$H NMR (500 MHz, CD$_2$Cl$_2$): δ 8.43 (s, 2H), 7.63 (d, J=5.0 Hz, 2H), 7.43 (d, J=5.0 Hz, 2H), 7.41 (s, 2H), 7.34 (s, 2H), 4.38 (t, J=6.5 Hz, 4H), 4.26 (t, J=6.5 Hz, 4H), 3.73 (t, J=4.5 Hz, 2H), 2.27 (m, 4H), 2.10 (m, 4H), 1.85-1.20 (m, 92H), 0.90-0.80 (m, 15H).

A deoxygenated mixture of compound BB-1-Br (0.023 g, 0.25 mmol), compound BB-1-Sn2 (0.050 g, 0.073 mmol), and Pd(PPh$_3$)$_4$ (0.002 g, 0.02 mmol) in DMF (5 mL) was heated to 140° C. for 4 hours under nitrogen in a sealed vessel. After it was cooled to room temperature, methanol (10 mL) was added to the mixture and the resultant solid was filtered and washed with water (5 mL×3) and methanol (5 mL×3). The solid was then recrystallized from toluene to give SM-4 (0.040 g, ~88% yield).

Example 11

Preparation of SM-5

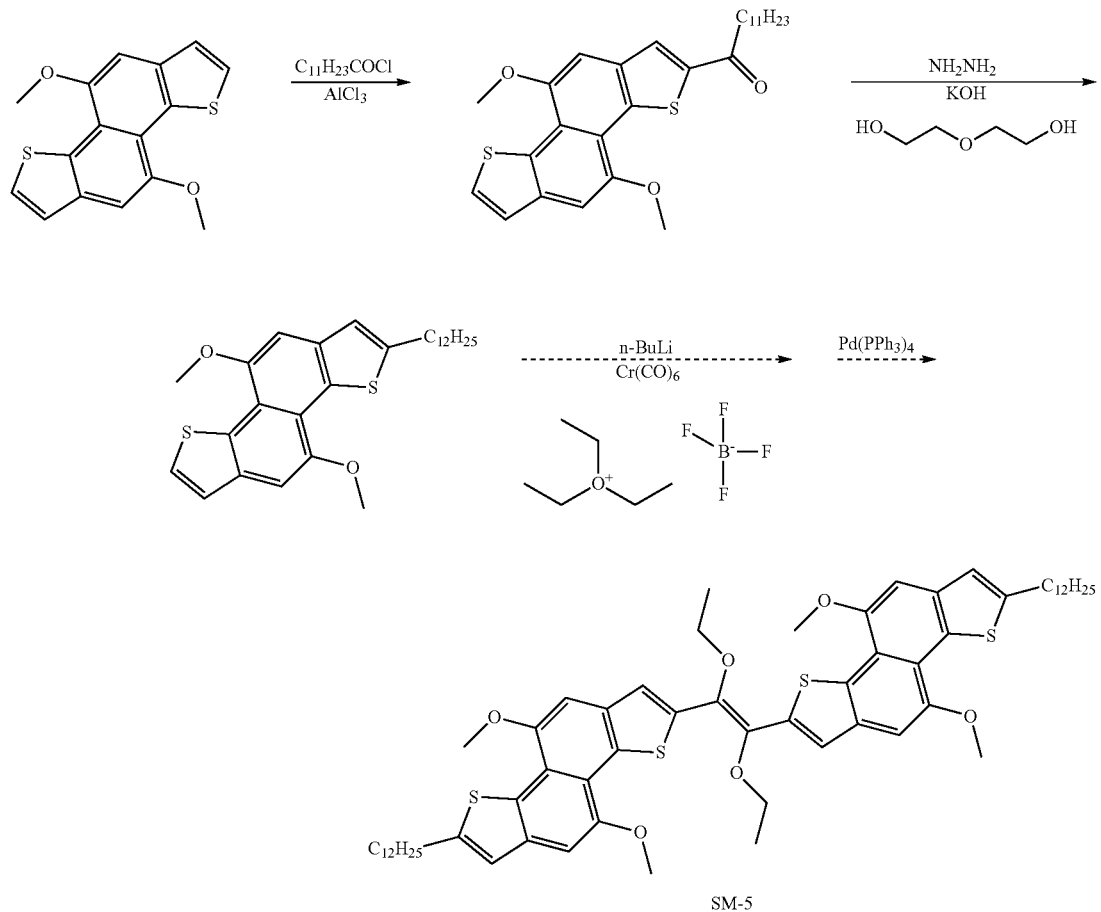

SM-5

4,9-Dimethoxynaphtho[1,2-b:5,6-b']dithiophene (0.90 g, 3.0 mmol) was solubilized in anhydrous dichloromethane (20 mL). Dodecanoyl chloride (0.765 g, 3.5 mmol) was then added and stirring was continued for 10 minutes at this temperature. Aluminum trichloride (0.465 g, 3.5 mmol) was then added in 3 portions. The mixture was stirred overnight at room temperature. The mixture was cooled in ice water and extracted with chloroform (200 mL) and washed with water (100 mL) and brine (50 mL). After the solvent was removed, the residual was purified using a silica column with dichloromethane:hexane (1/3) to give compound 1-(4,9-dimethoxynaphtho[1,2-b:5,6-b']dithiophen-2-yl)dodecan-1-one as a pale yellow solid (0.78 g, ~54% yield). $^1$H NMR (500 MHz, CDCl$_3$): δ 8.72 (s, 1H), 7.69 (d, J=5.5 Hz, 1H), 7.50 (m, 2H), 7.42 (s, 1H), 4.24 (s, 3H), 4.22 (s, 3H) 3.07. (t, J=7.0 Hz, 2H), 1.83 (m, 2H), 1.39 (m, 18H); 0.88 (m, J=6.0 Hz, 3H).

1-(4,9-Dimethoxynaphtho[1,2-b:5,6-b']dithiophen-2-yl)dodecan-1-one (0.70 g, 1.45 mmol), KOH (1.80 g, 32 mmol), and hydrazine monohydride (1.8 mL, 38 mmol) were heated in 2,2'-oxydiethanol (15 mL) at 200° C. under nitrogen overnight. After the mixture was cooled to room temperature, dichloromethane (100 mL) was added and washed with water (4×50 mL). Dried with Na$_2$SO$_4$, and after solvent was removed, 2-dodecyl-4,9-dimethoxynaphtho[1,2-b:5,6-b'] dithiophene was obtained.

Example 12

Preparation of 2,2'-(4,9-bis(dodecyloxy)naphtho[1,2-b:5,6-b']dithiophene-2,7-diyl)dithiazole (SM-6)

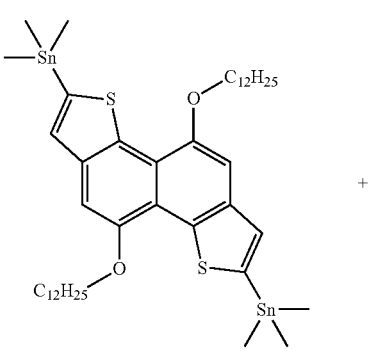

+

-continued

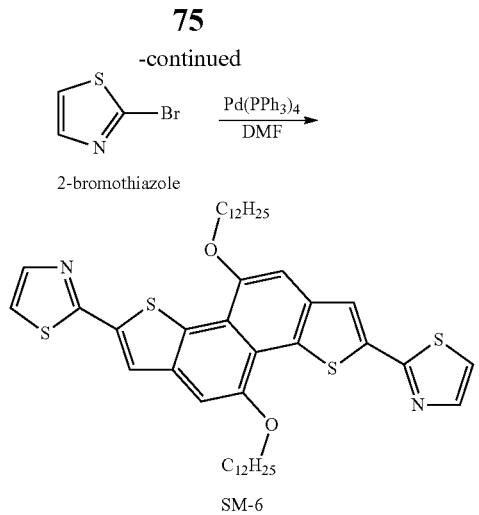

SM-6

Compound BB-1-Sn2 (187 mg, 0.200 mmol) and Pd(PPh$_3$)$_4$ (11.6 mg, 0.010 mmol) were charged to a Schlenk tube and the vessel was evacuated and refilled with nitrogen 4 times. 2-Bromothiazole (98 mg, 0.60 mmol) and anhydrous DMF (15.0 mL) was added before the mixture was heated to 140° C. and stirring was continued at this temperature overnight under nitrogen. After the mixture was cooled to room temperature, methanol (30 mL) was added. The solid obtained was filtered and washed with methanol. The solid was purified with a silica gel column and eluted with CHCl$_3$/hexane (1:1 and then 2:1) to give 2,2'-(4,9-bis(dodecyloxy)naphtho[1,2-b:5,6-b']dithiophene-2,7-diyl)dithiazole (SM-6) as a yellow solid (88 mg, ~56% yield). $^1$H NMR (500 MHz, CD$_2$Cl$_2$): δ 7.93 (s, 2H), 7.88 (d, J=3.0 Hz, 2H), 7.46 (s, 2H), 7.42 (d, J=3.0 Hz, 2H), 4.43 (t, J=6.5 Hz, 4H), 2.22 (quintet, J=8.0 Hz, 4H); 1.76 (quintet, J=8.0 Hz, 4H); 1.40 (m, 32H); 0.90 (t, J=7.0 Hz, 6H). Anal. Calcd for C$_{44}$H$_{58}$N$_2$O$_2$S$_4$: C, 68.17; H, 7.54; N, 3.61. Found: C, 68.21; H, 7.43; N, 3.49.

C. Preparation of Polymer Semiconductors

Example 13

Preparation of Polymer 1 (POL-1)

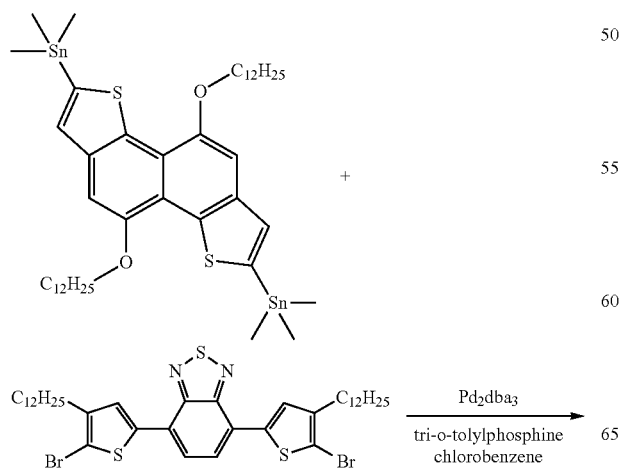

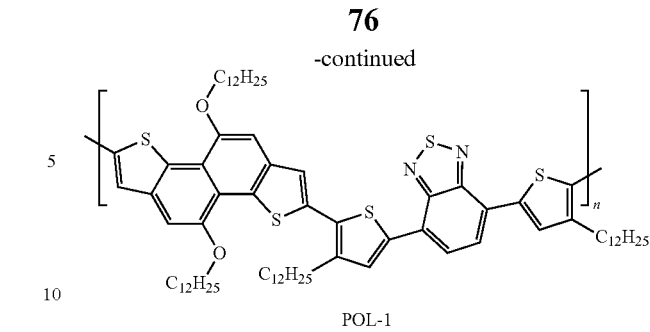

POL-1

Compound BB-1-Sn2 (0.1402 g, 0.1500 mmol), 4,7-bis(5-bromo-4-dodecylthiophen-2-yl)benzo[c][1,2,5]thiadiazole (0.1192 g, 0.1500 mmol), tri-o-tolylphosphine (9.1 mg, 0.030 mmol), and Pd$_2$dba$_3$ (3.7 mg, 0.0038 mmol) were charged to a schlenk tube and the vessel was then evacuated and refilled with nitrogen 4 times. Chlorobenzene (20.0 mL) was added before the mixture was heated to 130° C. and stirring was continued at this temperature for 2 days under nitrogen. After the mixture was cooled to room temperature, methanol (20.0 mL) was added. The solid obtained was filtered and washed with methanol. The solid then was washed sequentially with hot methanol (6 hours), hot ethyl acetate (12 hours), and dichloromethane (6 hours) using a Soxhlet apparatus under nitrogen. The residual was then collected and dried to give Polymer 1 (POL-1) as a black solid (152 mg, 82%). GPC (trichlorobenzene, 150° C.): M$_n$=4.6 kD, M$_w$/M$_n$=3.7. Anal. Calcd for POL-1 (C$_{76}$H$_{108}$N$_2$O$_2$S$_5$)$_n$: C, 73.49; H, 8.76; N, 2.26. Found: C, 72.51; H, 8.63; N, 2.25.

Example 14

Preparation of Polymer 2 (POL-2)

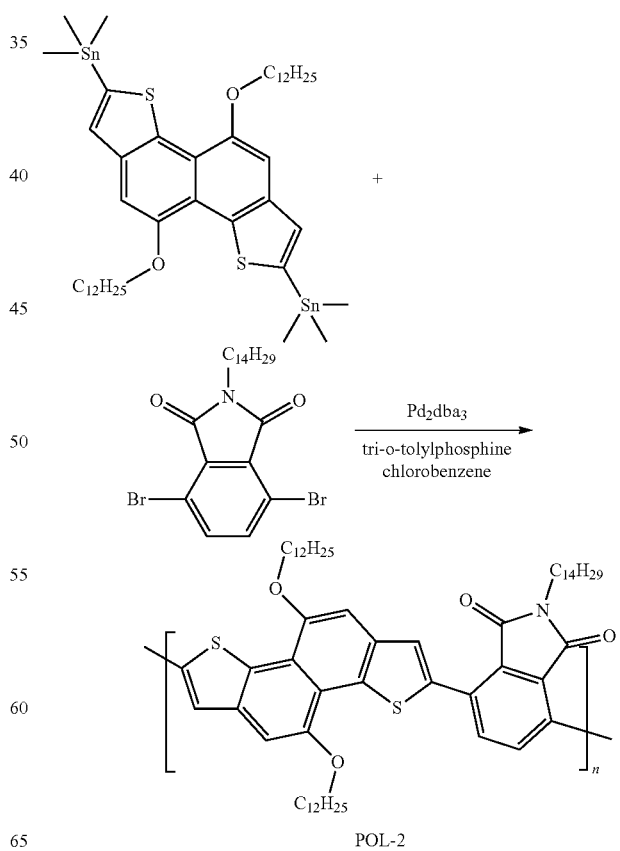

POL-2

Compound BB-1-Sn2 (0.1402 g, 0.1500 mmol), 4,7-dibromo-2-tetradecylisoindoline-1,3-dione (0.0752 g, 0.1500 mmol), tri-o-tolylphosphine (9.1 mg, 0.030 mmol), and $Pd_2dba_3$ (3.7 mg, 0.0038 mmol) were charged to a schlenk tube. The system was then evacuated and refilled with nitrogen 4 times. Chlorobenzene (20.0 mL) was added before the mixture was heated to 130° C. and stirring was continued at this temperature for 3 days under nitrogen. After the mixture was cooled to room temperature, methanol (20 mL) was added. The solid obtained was filtered and washed with methanol. The solid then was washed sequentially with hot methanol (6 hours) and hot ethyl acetate (12 hours) using a Soxhlet apparatus under nitrogen. The residual was then extracted with dichloromethane in a Soxhlet apparatus. The solvent was then removed, and the residual was dissolved in chloroform (3.0 mL) before it was precipitated into methanol (50 mL). The resulting solid was filtered and washed with methanol and dried under vacuum to give Polymer 2 (POL-2) as a red solid (130 mg, ~91% yield).

Example 15

Preparation of Polymer 3 (POL-3)

Compound BB-4-Sn2 (0.1869 g, 0.2000 mmol), 4,7-bis(5-bromo-4-dodecylthiophen-2-yl)benzo[c][1,2,5]thiadiazole (0.1192 g, 0.1500 mmol), 4,7-bis(5-bromothiophen-2-yl)benzo[c][1,2,5]thiadiazole (22.9 mg, 0.050 mmol), tri-o-tolylphosphine (20 mg, 0.066 mmol), and $Pd_2dba_3$ (7.5 mg, 0.0083 mmol) were charged to a schlenk tube. The vessel was then evacuated and refilled with nitrogen 4 times. Chlorobenzene (20.0 mL) was added before the mixture was heated to 130° C. and stirring was continued at this temperature for 2 days under nitrogen. After the mixture was cooled to room temperature, methanol (20.0 mL) was added. The solid obtained was filtered and washed with methanol. The solid then was washed sequentially with hot methanol (6 hours), hot ethyl acetate (12 hours), and dichloromethane (6 hours) using a Soxhlet apparatus under nitrogen. The residual was then collected and dried to give Polymer 3 (POL-3) as a black solid (155 mg, ~70% yield).

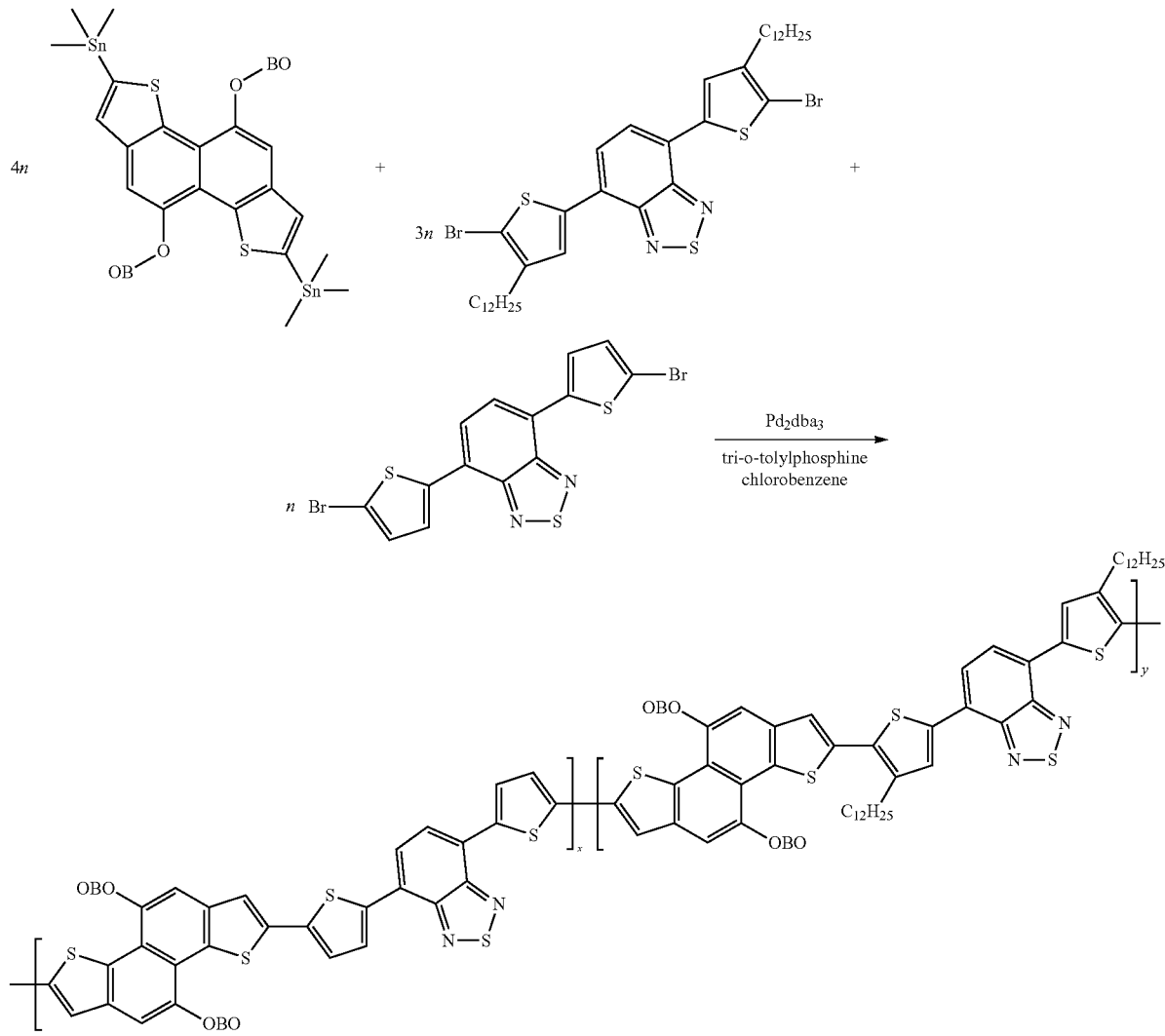

POL-3 x = 0.25, y = 0.75

Example 16

Preparation of Polymer 4 (POL-4)

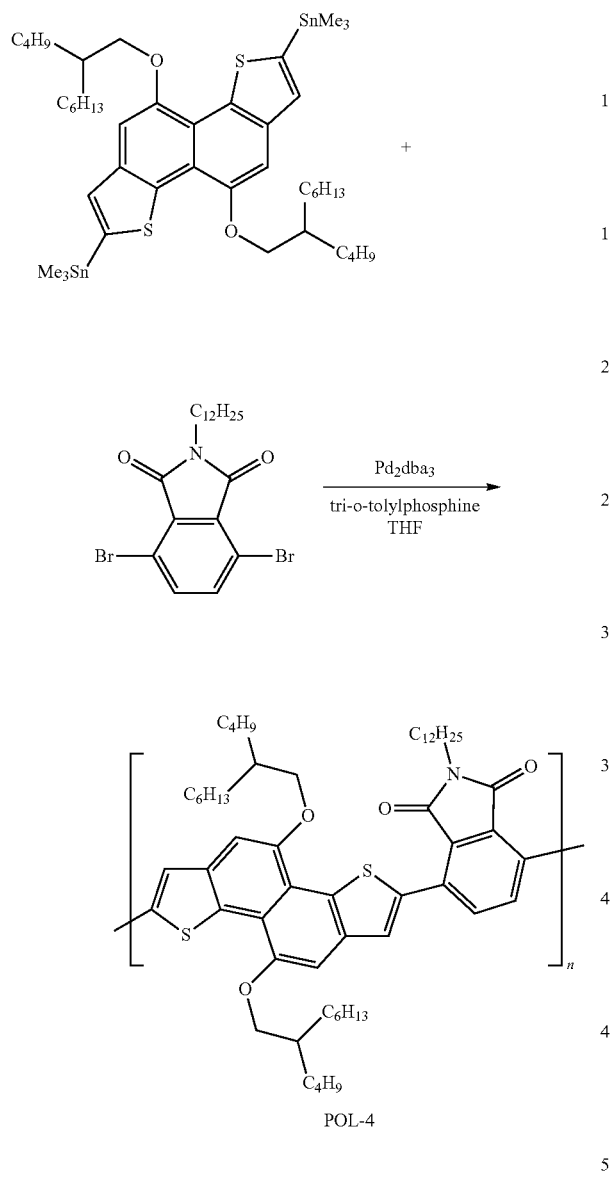

POL-4

Compound BB-2-Sn2 (0.1402 g, 0.1500 mmol), 4,7-dibromo-2-dodecylisoindoline-1,3-dione (0.0710 g, 0.1500 mmol), tri-o-tolylphosphine (11.0 mg 0.036 mmol), and Pd$_2$dba$_3$ (4.1 mg, 0.0045 mmol) were charged to a 50 mL schlenk tube. The system was then evacuated and refilled with nitrogen 4 times. THF (10.0 mL) was added before the mixture was heated to 80° C. and kept at this temperature for 18 hours under nitrogen in a sealed tube. After the mixture was cooled to room temperature, methanol (20 mL) was added. The solid obtained was filtered and washed with methanol. The solid then was washed sequentially with hot methanol (6 hours) and hot ethyl acetate (12 hours). The residual was then extracted with chloroform in a Soxhlet apparatus. The solvent was then removed, and the residual was dissolved in chloroform (5.0 mL) before precipitating in methanol (50 mL). The resulting solid was filtered and washed with MeOH and dried under vacuum to give Polymer 4 (POL-4) as a red solid (120 mg, ~87% yield).

Example 17

Preparation of Polymer 5 (POL-5)

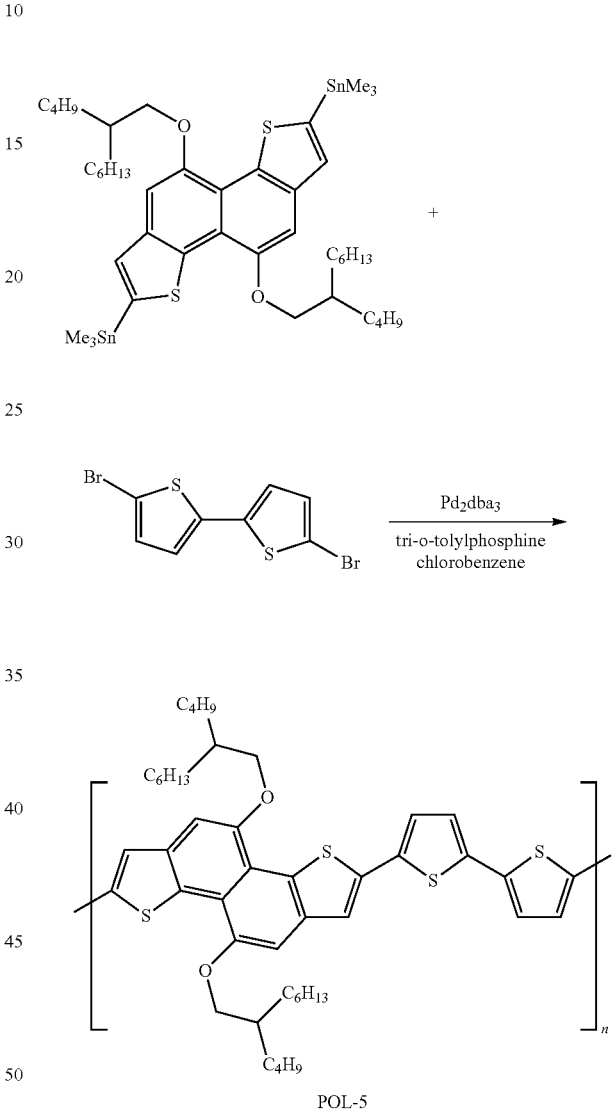

POL-5

Compound BB-2-Sn2 (0.1402 g, 0.1500 mmol), 5,5'-dibromo-2,2'-bithiophene (0.0456 g, 0.1500 mmol), tri-o-tolylphosphine (11.0 mg 0.036 mmol), and Pd$_2$dba$_3$ (4.1 mg, 0.0045 mmol) were charged to a 50 mL schlenk tube. The system was evacuated and refilled with nitrogen 4 times. Chlorobenzene (20.0 mL) was added before the mixture was heated to 130° C. and kept at this temperature for 24 hours under nitrogen. After the mixture was cooled to room temperature, methanol (20 mL) was added. The solid obtained was filtered and washed with methanol. The solid then was washed sequentially with hot methanol (6 hours), hot ethyl acetate (12 hours), and chloroform (6 hours) using a Soxhlet apparatus under nitrogen. The residue was then collected and dried to give Polymer 5 (POL-5) as a red solid (96 mg, ~83% yield).

Example 18

Preparation of Polymer 6 (POL-6)

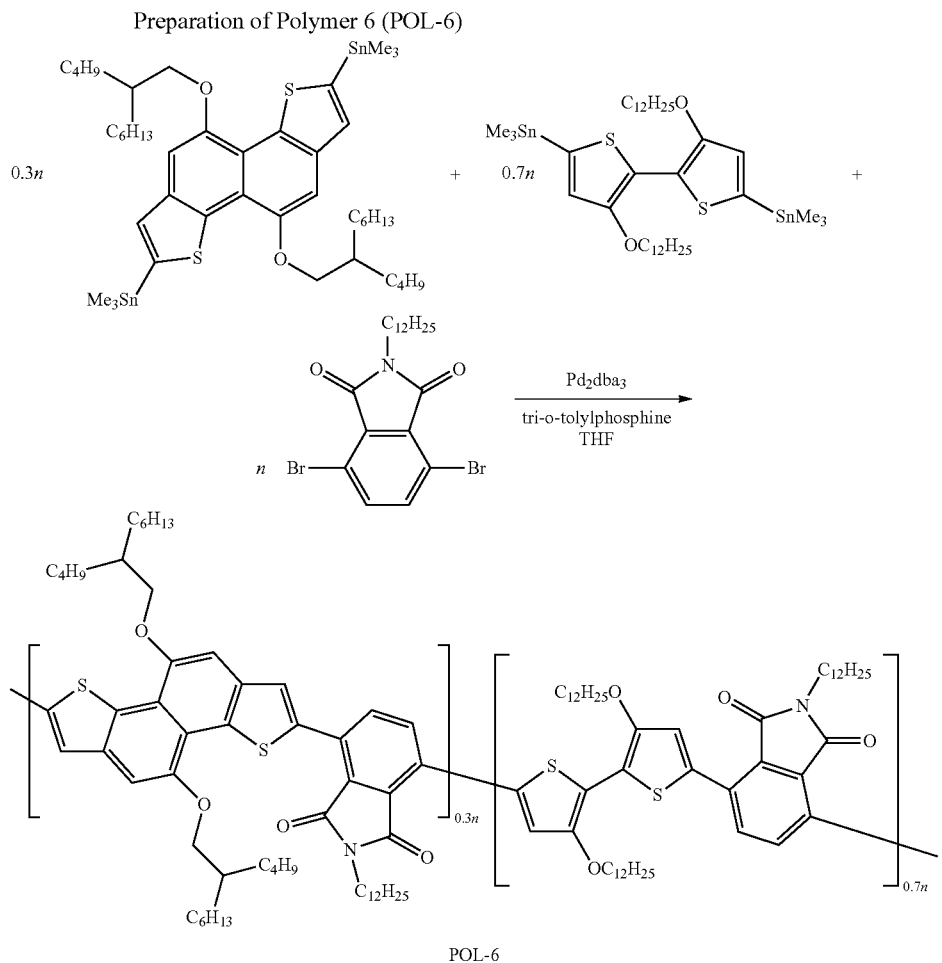

POL-6

Compound BB-2-Sn2 (0.0561 g, 0.0600 mmol), 4,7-dibromo-2-dodecylisoindoline-1,3-dione (0.0945 g, 0.2000 mmol), (3,3'-bis(dodecyloxy)-[2,2'-bithiophene]-5,5' diyl)bis(trimethylstannane) (0.1247 g, 0.140 mmol), tri-o-tolylphosphine (14.6 mg 0.048 mmol), and Pd$_2$dba$_3$ (5.5 mg, 0.0060 mmol) were charged to a 50 mL schlenk tube. The system was then evacuated and refilled with nitrogen four times. THF (20.0 mL) was added before the mixture was heated to 80° C. and kept at this temperature for 18 hours under nitrogen in a sealed tube. After the mixture was cooled to room temperature, methanol (20 mL) was added. The solid obtained was filtered and washed with methanol. The solid was washed sequentially with hot methanol (6 hours) and hot ethyl acetate (12 hours). The residual was extracted with chloroform in a Soxhlet apparatus. The solvent was removed, and the residual was dissolved in chloroform (15.0 mL) before precipitating in methanol (150 mL). The resulting solid was filtered and washed with MeOH and dried under vacuum to give Polymer 6 (POL-6) as a purple solid (123 mg, ~90% yield).

Example 19

Preparation of Polymer 7 (POL-7)

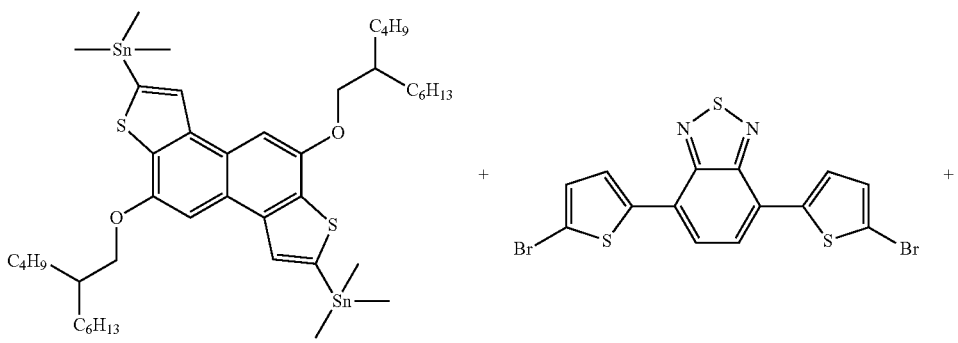

-continued

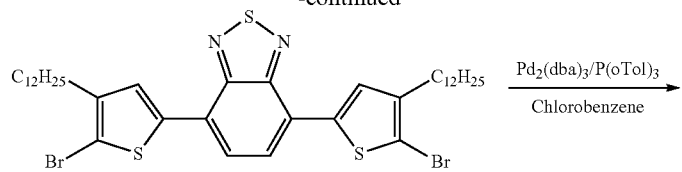

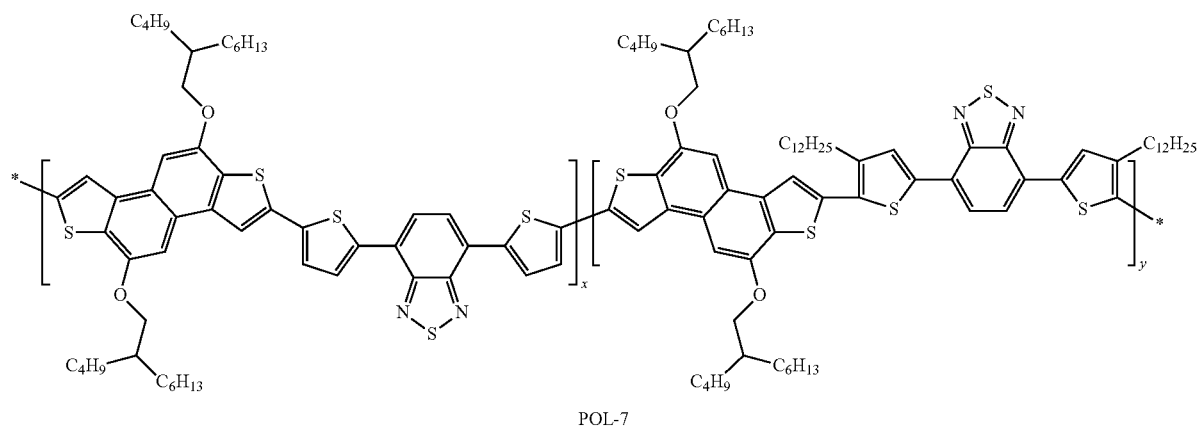

POL-7 x = 0.25, y = 0.75

4,7-Bis-(5-bromo-4-dodecyl-thiophen-2-yl)benzo[1,2,5]thiadiazole (47.69 mg, 0.06 mmol), 4,7-bis-(5-bromo-thiophen-2-yl)benzo[1,2,5]thiadiazole (9.16 mg, 0.02 mmol), and BB-4-Sn2 (74.77 mg, 0.08 mmol), $Pd_2(dba)_3$ (2.93 mg, 3.2 µmol), $P(o\text{-}Tol)_3$ (3.90 mg, 12.8 µmol) were combined in a 50 mL flask. The system was purged with argon before 16 mL of anhydrous chlorobenzene was added. The reaction mixture was heated at 135° C. for 18 hours. After cooling down to room temperature, the polymer was precipitated out from 80 ml of methanol and further purified by a Soxlet apparatus with methanol, ethyl acetate, dichloromethane. The residue weighed 49.0 mg (~81.6% yield) after removing the solvent and drying in vacuo.

Example 20

Preparation of Polymer 8 (POL-8)

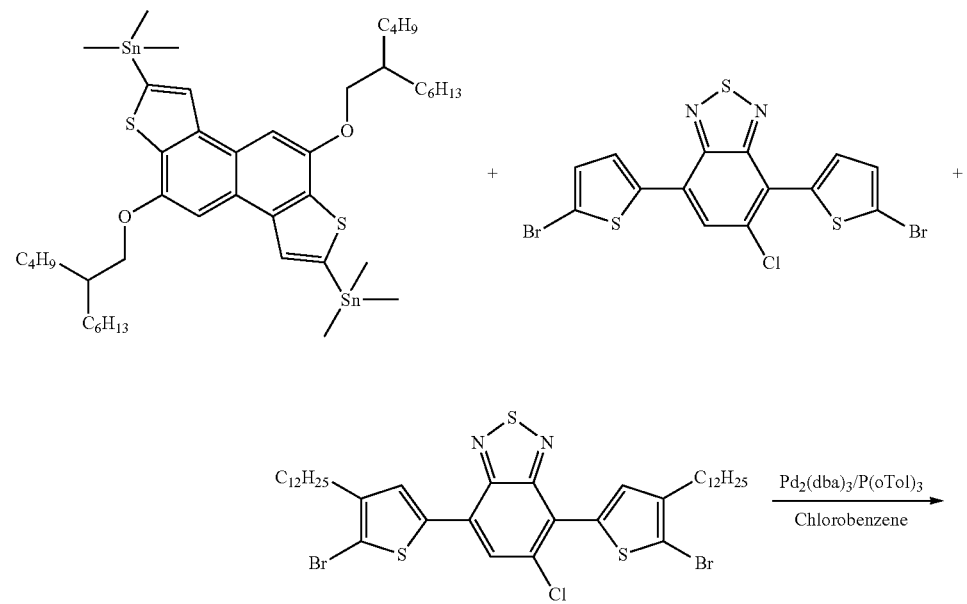

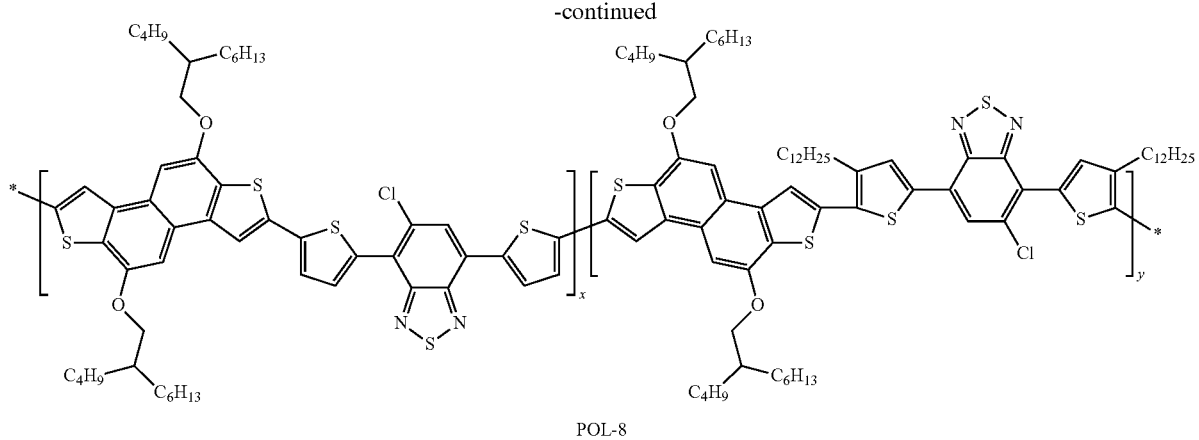

POL-8 x = 0.25, y = 0.75

4,7-Bis-(5-bromo-4-dodecyl-thiophen-2-yl)-5-chloro-benzo[1,2,5]thiadiazole (49.76 mg, 0.06 mmol), 4,7-bis-(5-bromo-thiophen-2-yl)-5-chloro-benzo[1,2,5]thiadiazole (9.85 mg, 0.02 mmol), BB-4-Sn2 (74.77 mg, 0.08 mmol), Pd$_2$(dba)$_3$ (2.93 mg, 3.2 μmol), and P(o-Tol)$_3$ (3.90 mg, 12.8 μmol) were combined in a 50 mL flask. The system was purged with argon before 16 mL of anhydrous chlorobenzene was added. The reaction mixture was heated at 135° C. for 18 hours. After cooling down to room temperature, the polymer was precipitated out from 80 ml of methanol and further purified by a Soxlet apparatus with methanol, ethyl acetate, and dichloromethane. The residue weighed 83.0 mg (~86.9% yield) after removing the solvent and drying in vacuo.

Example 21

Preparation of Polymer 9 (POL-9)

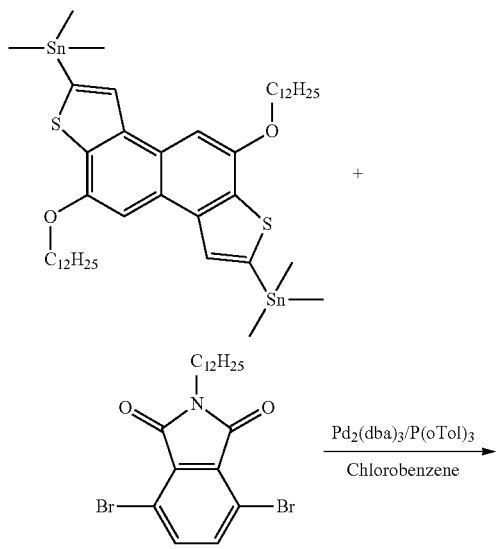

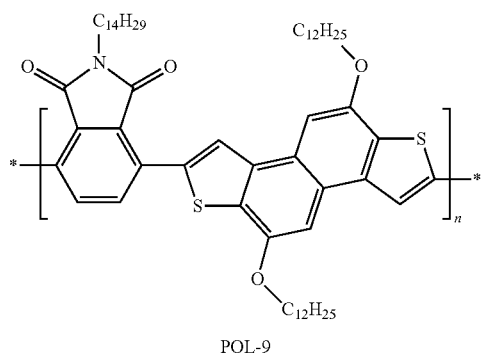

POL-9

Compound BB-3-Sn2 (0.935 g, 0.100 mmol), 4,7-dibromo-2-tetradecylisoindoline-1,3-dione (0.473 g, 0.100 mmol), Pd$_2$(dba)$_3$ (3.68 mg, 4.1 μmol), and P(o-Tol)$_3$ (4.86 mg, 16.4 μmol) were charged to a schlenk tube. The system was evacuated and refilled with argon 3 times. Anhydrous chlorobenzene (20.0 mL) was added before the mixture was heated to 135° C. and stirring was continued at this temperature for 18 hours. After cooling down to room temperature, the polymer was precipitated out from methanol and further purified by Soxhlet extraction with methanol, ethyl acetate, and dichloromethane. The product was extracted out with chlorobenzene and weighed 38.0 mg (40.0% yield) after drying in vacuo.

Example 22

Preparation of Polymer 10 (POL-10)

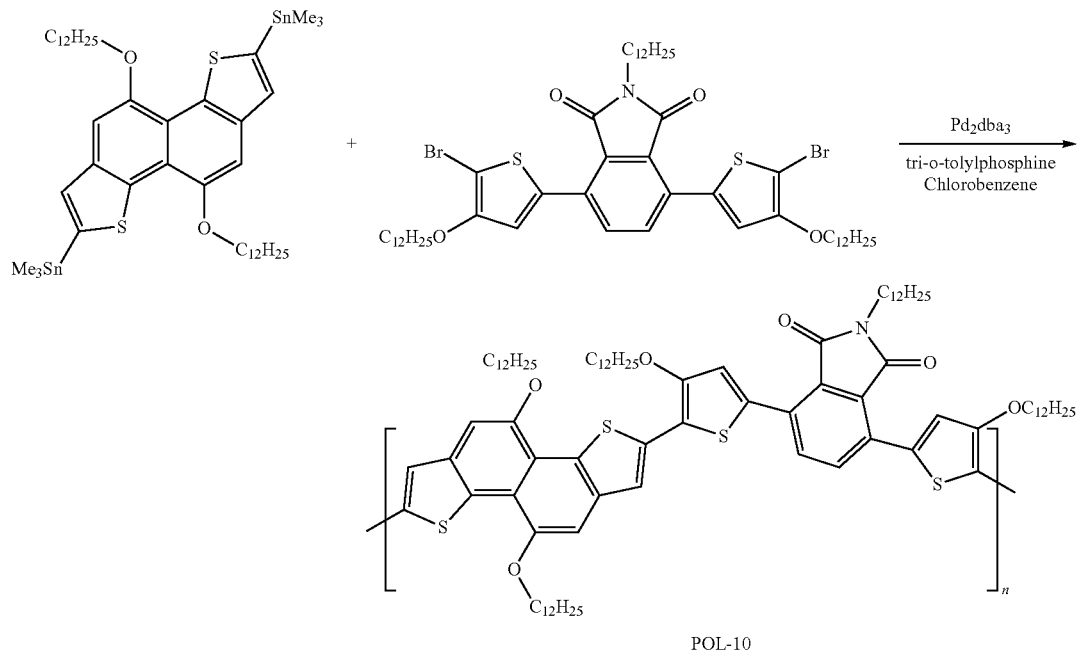

POL-10

Compound BB-1-Sn2 (0.0934 g, 0.1000 mmol), 4,7-bis(5-bromo-4-(dodecyloxy)thiophen-2-yl)-2-dodecylisoindoline-1,3-dione (0.1006 g, 0.1000 mmol), tri-o-tolylphosphine (11.0 mg 0.036 mmol), and $Pd_2dba_3$ (2.7 mg, 0.003 mmol) were charged to a 50 mL schlenk tube. The system was then evacuated and refilled with nitrogen four times. Chlorobenzene (10.0 mL) was added before the mixture was heated to 130° C. and kept at this temperature for 18 hours under nitrogen in a sealed tube. After the mixture was cooled to room temperature, methanol (20 mL) was added. The solid obtained was filtered and washed with methanol. The solid was washed sequentially with hot methanol (6 hours) and hot ethyl acetate (12 hours). The residual was then extracted with chloroform in a Soxhlet apparatus. The solvent was removed, and the residual was dissolved in chloroform (5.0 mL) before precipitating in methanol (50 mL). The resulting solid was filtered and washed with MeOH and dried under vacuum to give POL-10 as a black solid (100 mg, ~70% yield).

Example 23

Preparation of Polymer 11 (POL-11)

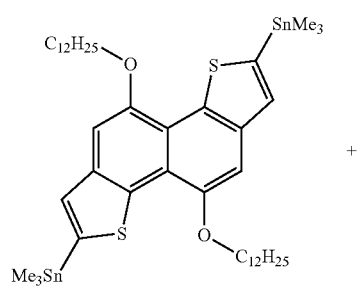

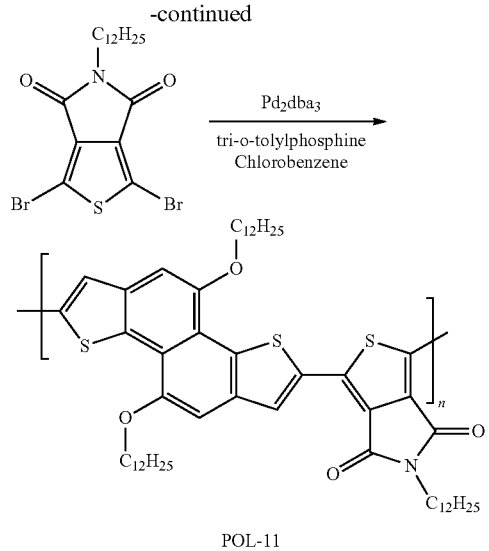

POL-11

Compound BB-1-Sn2 (0.0934 g, 0.1000 mmol), 1,3-dibromo-5-dodecyl-4H-thieno[3,4-c]pyrrole-4,6(5H)-dione (0.0479 g, 0.1000 mmol), tri-o-tolylphosphine (11.0 mg, 0.036 mmol), and $Pd_2dba_3$ (2.7 mg, 0.003 mmol) were charged to a 50 mL schlenk tube and the system was then evacuated and refilled with nitrogen 4 times. Chlorobenzene (10.0 mL) was added before the mixture was heated to 130° C. and kept at this temperature for 18 hours under nitrogen in a sealed tube. After the mixture was cooled to room temperature, methanol (20 mL) was added. The solid obtained was filtered and washed with methanol. The solid was washed sequentially with hot methanol (6 hours) and hot ethyl acetate (12 hours). The residual was then extracted with chloroform in a Soxhlet apparatus. The solvent was removed, and the residual was dissolved in chloroform (10.0 mL) before precipitating in methanol (50 mL). The resulting solid was filtered and washed with MeOH and dried under vacuum to give POL-11 as a red solid (40 mg, ~43% yield).

Example 24

Preparation of Polymer 12 (POL-12)

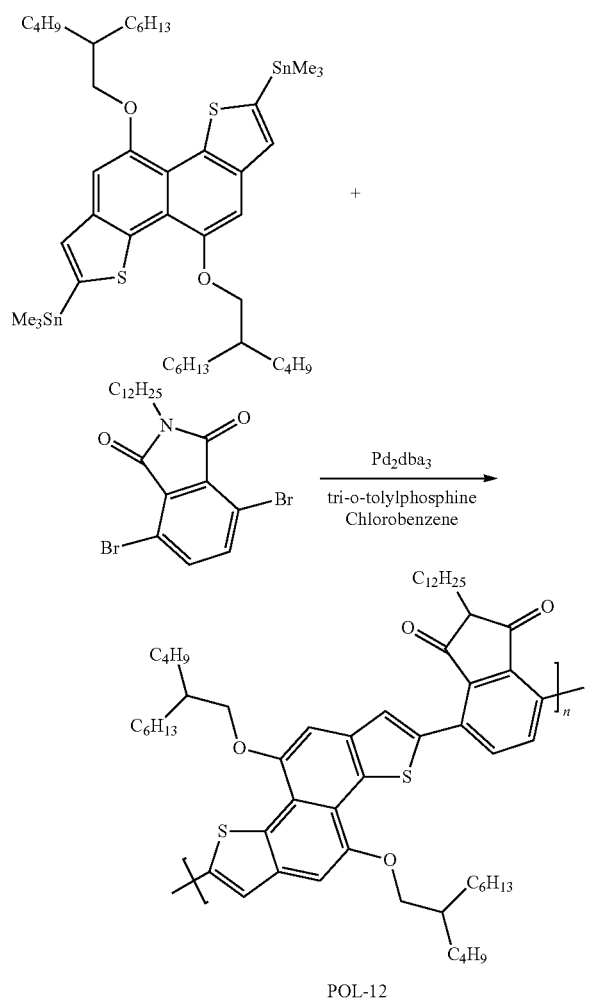

POL-12

Compound BB-2-Sn2 (0.0934 g, 0.1000 mmol), 4,7-dibromo-2-dodecylisoindoline-1,3-dione (0.0.0473 g, 0.1000 mmol), tri-o-tolylphosphine (11.0 mg 0.036 mmol), and Pd$_2$dba$_3$ (2.7 mg, 0.003 mmol) were charged to a 50 mL schlenk tube. The system was then evacuated and refilled with nitrogen 4 times. Chlorobenzene (10.0 mL) was added before the mixture was heated to 130° C. and kept at this temperature for 18 hours under nitrogen in a sealed tube. After the mixture was cooled to room temperature, methanol (20 mL) was added. The solid obtained was filtered and washed with methanol. The solid was washed sequentially with hot methanol (6 hours) and hot ethyl acetate (12 hours). The residual was extracted with chloroform in a Soxhlet apparatus. The solvent was removed, and the residual was dissolved in chloroform (5.0 mL) before precipitating in methanol (50 mL).

The resulting solid was filtered and washed with MeOH and dried under vacuum to give POL-12 as an orange solid (80 mg, ~87% yield).

Example 25

Preparation of Polymer 13 (POL-13)

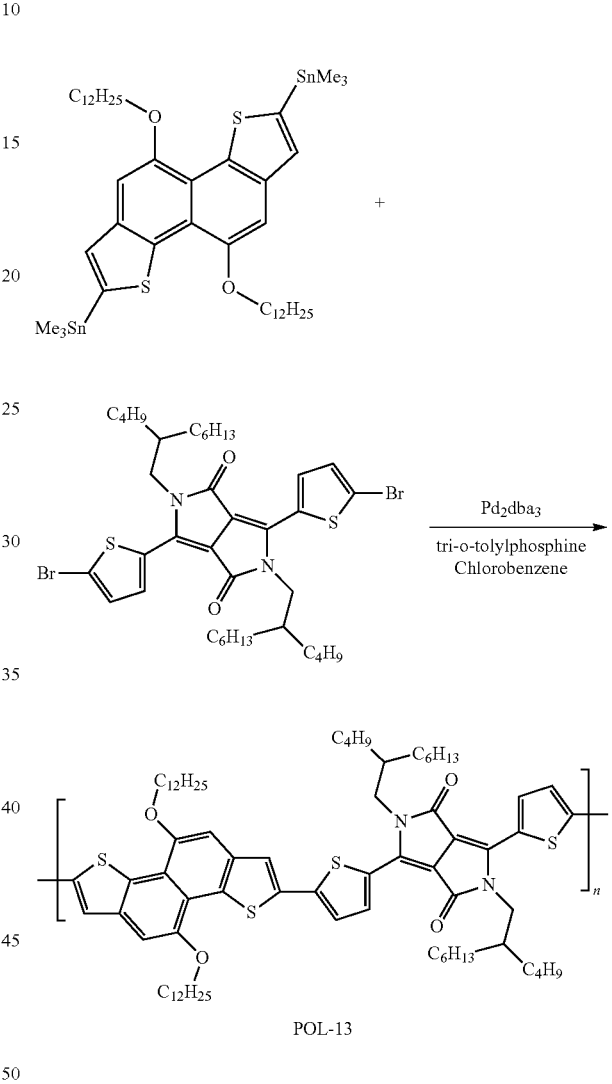

POL-13

Compound BB-2-Sn2 (0.0934 g, 0.1000 mmol), 3,6-bis(5-bromothiophen-2-yl)-2,5-bis(2-butyloctyl)pyrrolo[3,4-c]pyrrole-1,4(2H, 5H)-dione (0.0.0794 g, 0.1000 mmol), tri-o-tolylphosphine (11.0 mg 0.036 mmol), and Pd$_2$dba$_3$ (2.7 mg, 0.003 mmol) were charged to a 50 mL schlenk tube and the system was then evacuated and refilled with nitrogen 4 times. Chlorobenzene (10.0 mL) was added before the mixture was heated to 130° C. and kept at this temperature for 18 hours under nitrogen in a sealed tube. After the mixture was cooled to room temperature, methanol (20 mL) was added. The solid obtained was filtered and washed with methanol. The solid was washed sequentially with hot methanol (6 hours) and hot ethyl acetate (12 hours). The residual was then extracted with chloroform in a Soxhlet apparatus. The solvent was then removed, and the residual was dissolved in chloroform (5.0 mL) before precipitating in methanol (50 mL). The resulting solid was filtered and washed with MeOH and dried under vacuum to give POL-13 as a green solid (98 mg, ~79% yield).

Example 26

Preparation of Polymer 14 (POL-14)

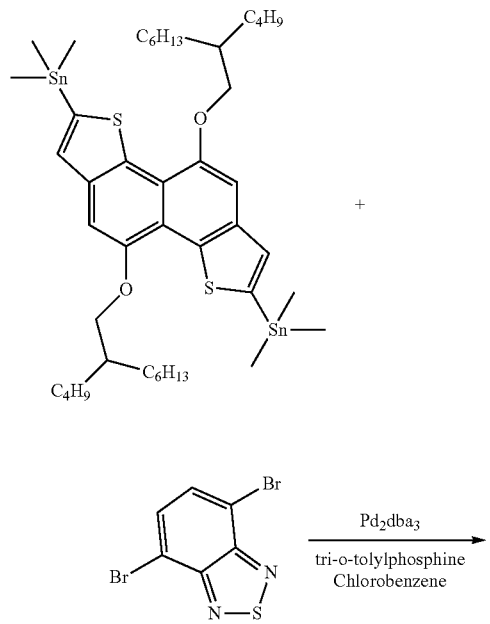

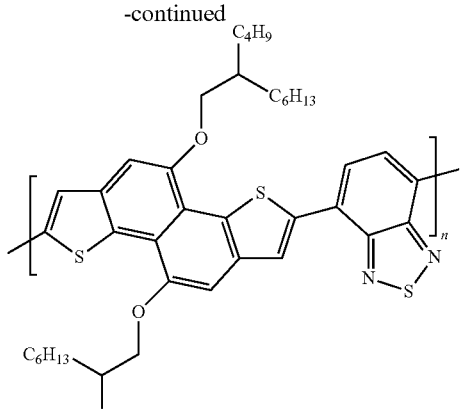

POL-14

Compound BB-2-Sn2 (0.1402 g, 0.1500 mmol), 4,7-dibromobenzo[c][1,2,5]thiadiazole (0.0440 g, 0.1500 mmol), tri-o-tolylphosphine (9.1 mg, 0.030 mmol), and Pd$_2$dba$_3$ (3.7 mg, 0.0038 mmol) were charged to a schlenk tube, and the vessel was then evacuated and refilled with nitrogen 4 times. Chlorobenzene (20.0 mL) was added before the mixture was heated to 130° C. and stirring was continued at this temperature for 2 days under nitrogen. After the mixture was cooled to room temperature, methanol (20.0 mL) was added. The solid obtained was filtered and washed with methanol. The solid was washed sequentially with hot methanol (6 hours), hot ethyl acetate (12 hours) and dichloromethane (6 hours) using a Soxhlet apparatus under nitrogen. The residual was then collected and dried to give POL-14 as a deep blue solid (101 mg, ~91% yield).

Example 27

Preparation of Polymer 15 (POL-15)

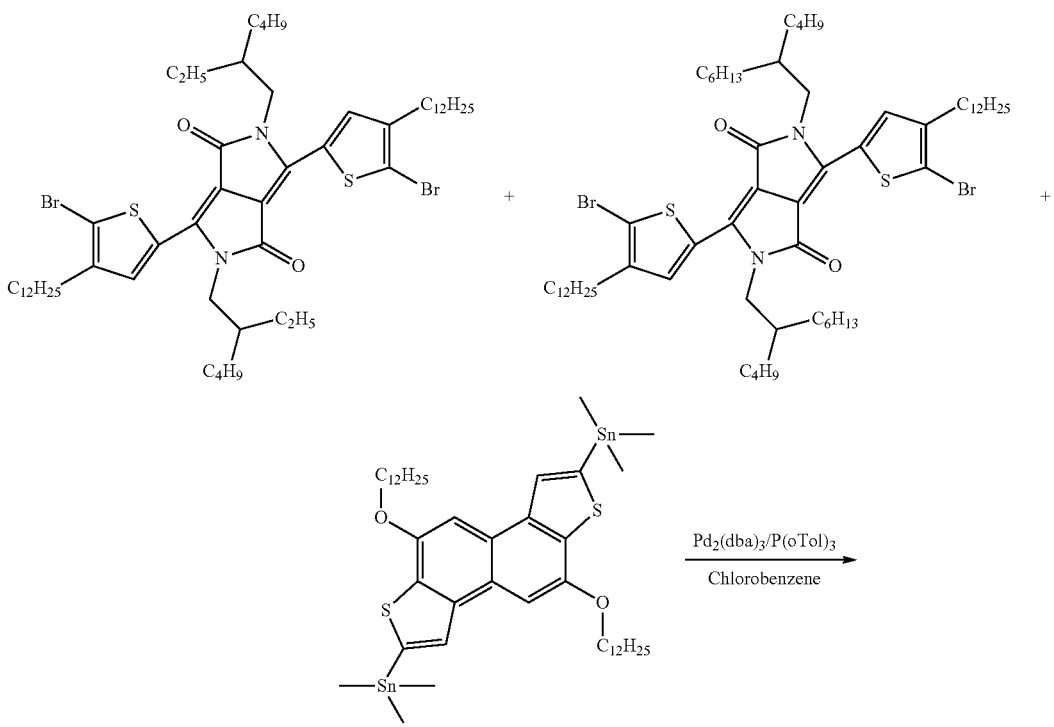

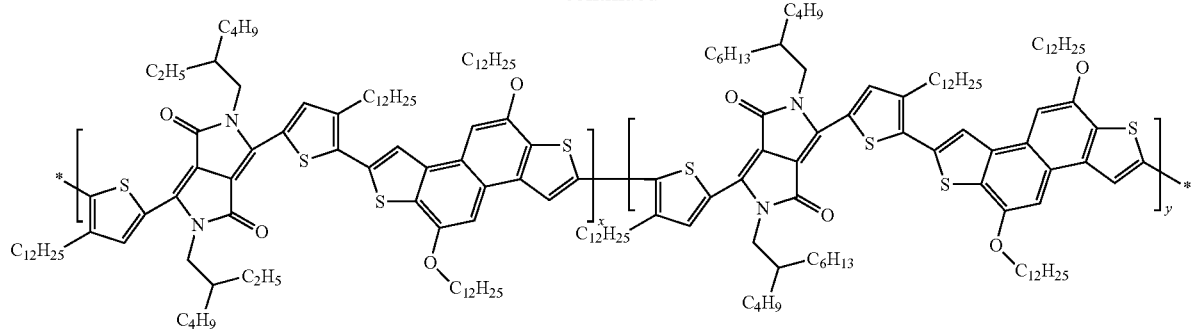

POL-15

Compound BB-3-Sn2 (74.76 mg, 0.08 mmol), 3,6-bis-(4-dodecyl-thiophen-2-yl)-2,5-bis-(2-ethylhexyl)-2,5-dihydro-pyrrolo[3,4-c]pyrrole-1,4-dione (40.77 mg, 0.04 mmol), 3,6-bis-(4-dodecyl-thiophen-2-yl)-2,5-bis-(2-butyloctyl)-2,5-dihydro-pyrrolo[3,4-c]pyrrole-1,4-dione (45.26 mg, 0.04 mmol), Pd$_2$(dba)$_3$ (2.94 mg, 3.2 µmol), and P(o-Tol)$_3$ (3.89 mg, 12.8 µmol) were charged to a 50 mL schlenk flask. The system was then evacuated and refilled with argon 3 times. Anhydrous chlorobenzene (16.0 mL) was added before the mixture was heated to 135° C. and stirring was continued at this temperature for 18 hours. After cooling down to room temperature, the polymer was precipitated out from methanol and further purified by Soxhlet extraction with methanol, ethyl acetate, and dichloromethane. The product was extracted out with chlorobenzene and weighed 58.0 mg (47.2% yield) after drying in vacuo.

Chemical Stability

Example 28

Chemical Stability as Assessed by $^1$H NMR Spectroscopy

Figure 6:
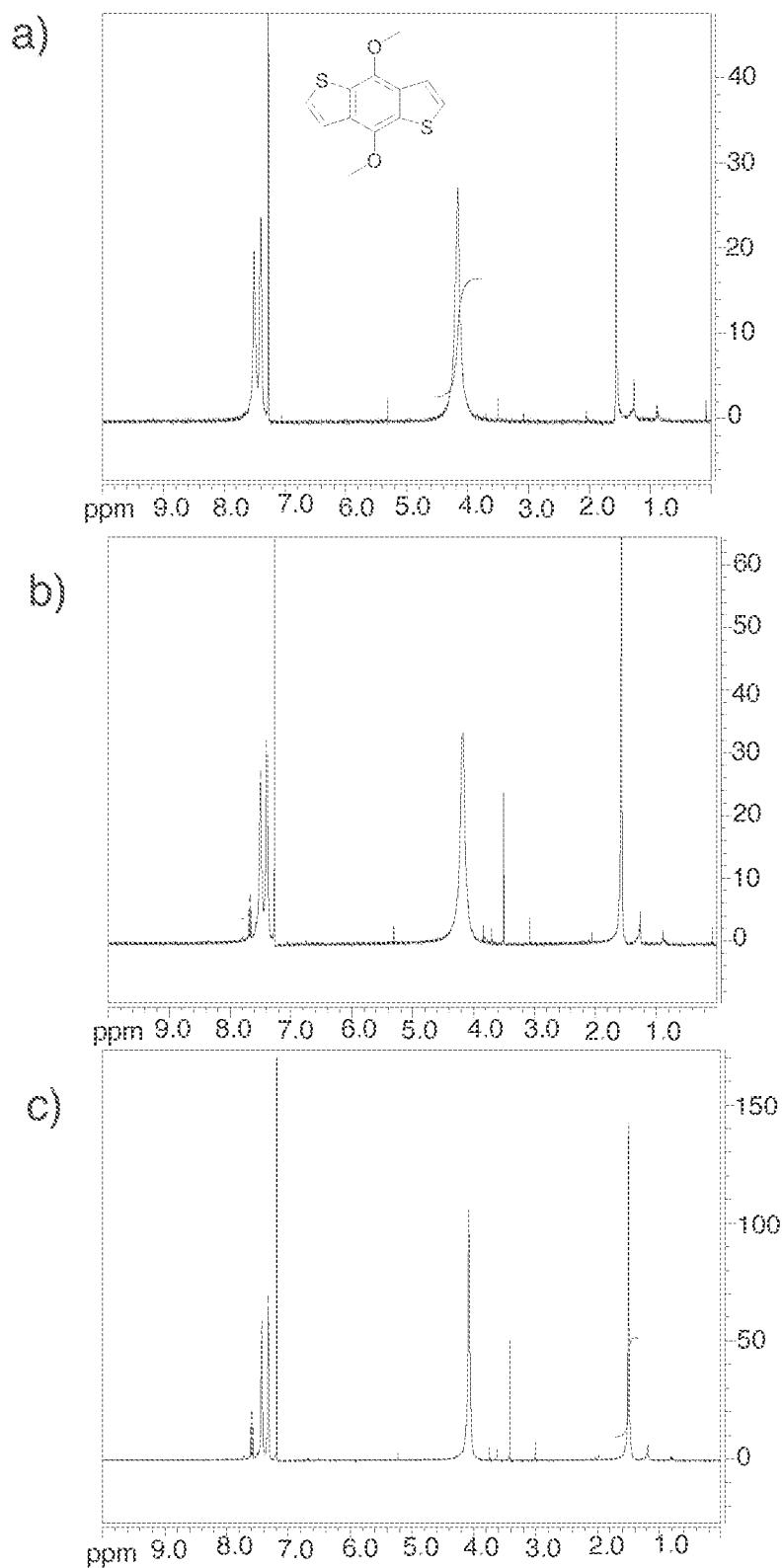
FIG. 6 shows the $^1$H NMR spectra of compound TBT-OMe$_2$ in CDCl$_3$ (a) immediately after sample preparation (before exposure), (b) after exposure to ambient air (dark) for 6 days, and (c) after 1 sun (light) exposure for 18 hours.
Figure 7:
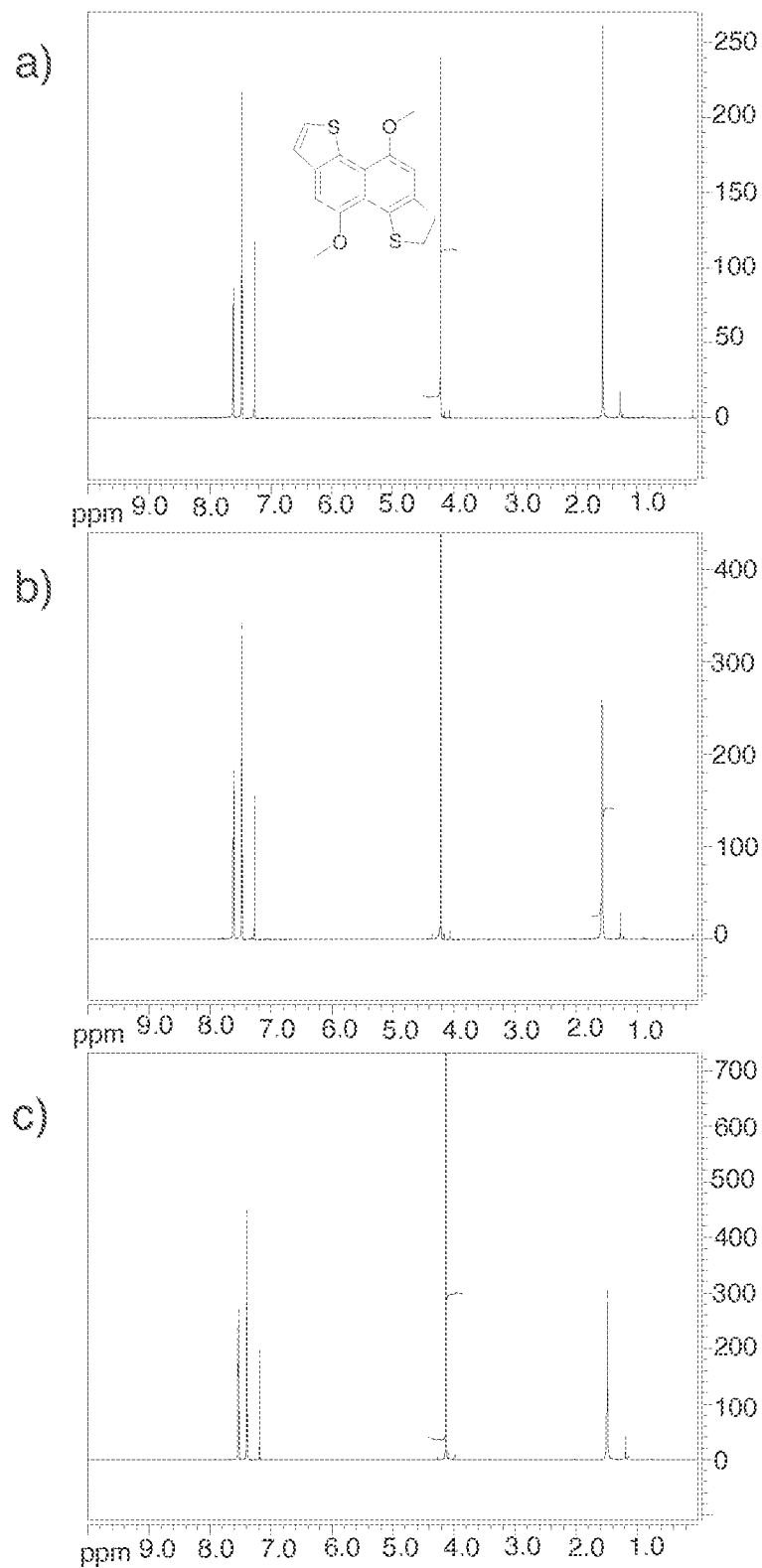
FIG. 7 shows the $^1$H NMR spectra of compound 4 in CDCl$_3$ (a) immediately after sample preparation (before exposure), (b) after exposure to ambient air (dark) for 6 days, and (c) after 1 sun (light) exposure for 18 hours.
Figure 8:
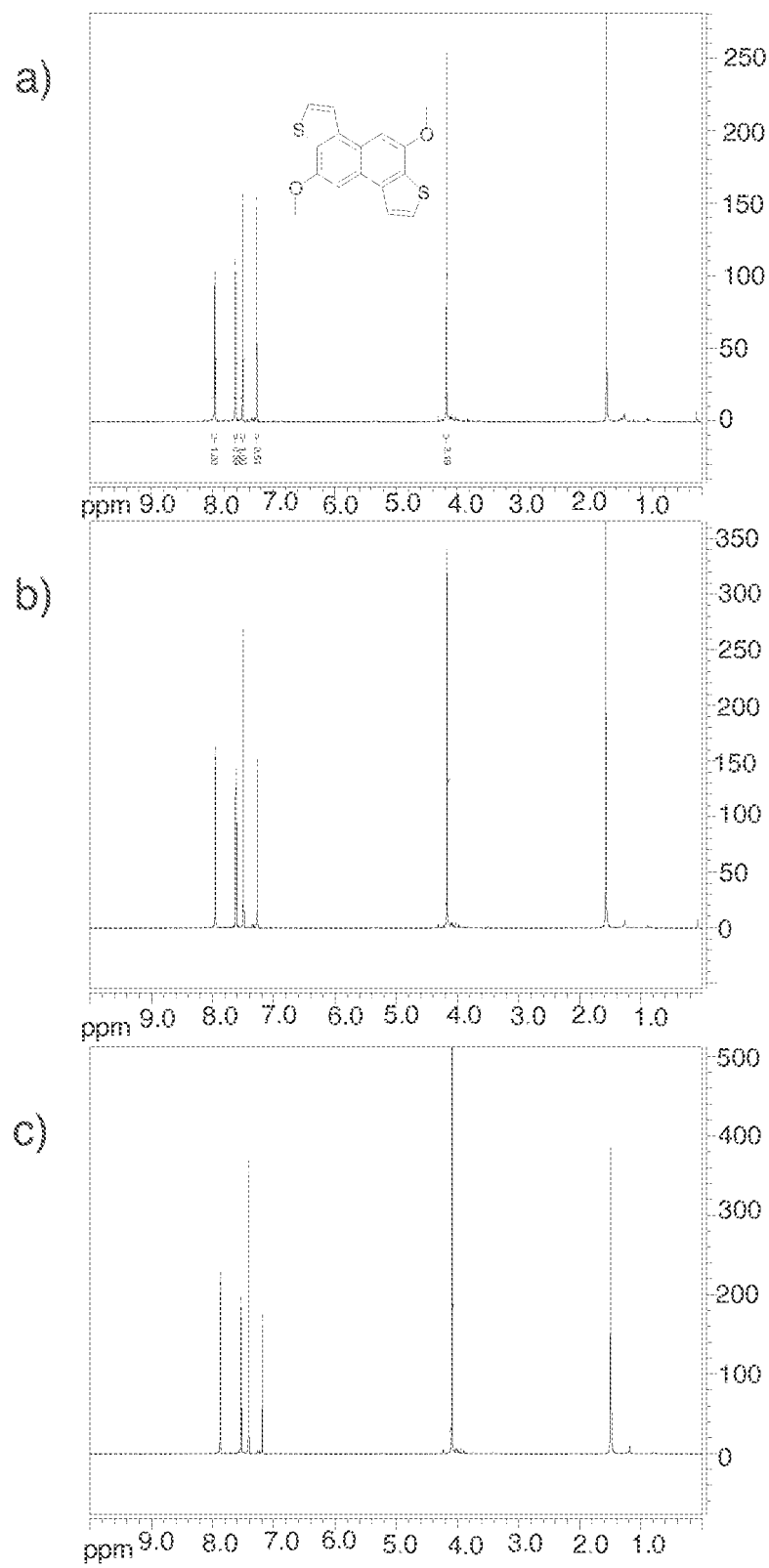
FIG. 8 shows the $^1$H NMR spectra of compound 7 in CDCl$_3$ (a) immediately after sample preparation (before exposure), (b) after exposure to ambient air (dark) for 6 days, and (c) after 1 sun (light) exposure for 18 hours.
Figure 9:
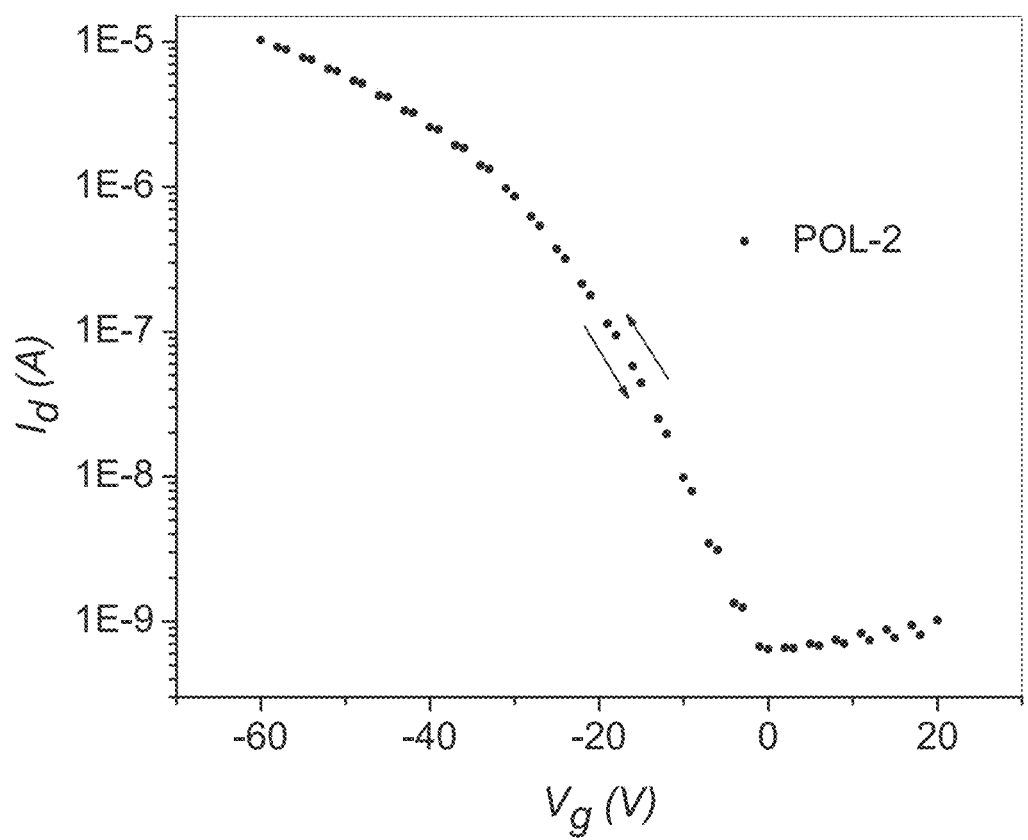
FIG. 9 shows the FET transfer I-V curve for a representative polymer of the present teachings (POL-2).
Figure 10:
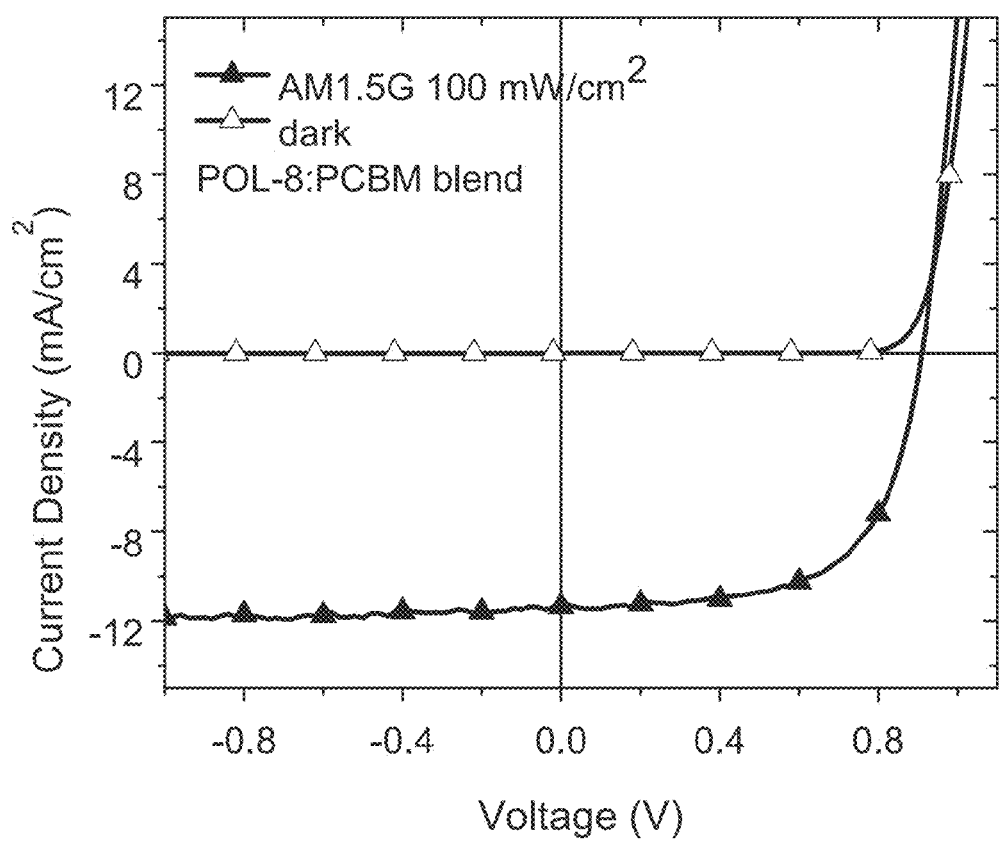
FIG. 10 illustrates the OPV J-V curve for a representative polymer of the present teachings (POL-8).

To test the chemical stability of the present compounds which are characterized with a bent core, solutions of compound 4 (Example 2) and compound 7 (Example 4) were prepared with CDCl$_3$ and tested versus that of linear TBT-OMe$_2$ first under ambient atmosphere in the dark and then upon light exposure. The TBT-OMe$_2$ core was selected as a comparison because it is more stable than the corresponding larger dialkoxy linear acenes. FIGS. 6, 7, and 8 show the $^1$H NMR spectra.

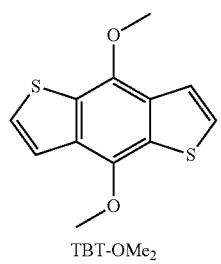 [SMILES: COc1c2ccsc2c(OC)c2ccsc12]

TBT-OMe$_2$

As shown in FIGS. 6, 7, and 8, the new building blocks are far more stable than the linear TBT-OMe$_2$, in ambient both in the dark and upon light exposure. No significant decomposition peaks can be detected for compound 4 or compound 7; however, TBT-OMe$_2$ spectra exhibit the presence of >20% of decomposed materials.

Device Fabrication and Characterization

Example 29

Transistor Device Fabrication and Characterization

Top-gate bottom-contact (TGBC) thin film transistors were prepared as follows: Step 1. Glass or plastic substrates were optionally covered with a thin-film of ActivInk™ D1400 (Polyera Corp., Skokie, Ill.), which was spin-coated from 1:1 anisole/1,4-dioxane (80 mg/mL) at 4000 rpm, followed by UV irradiation for 10 minutes. Step 2. Gold or silver (30 nm) were thermally evaporated as S/D electrodes. Step 3. S/D electrodes were optionally treated with 1-propanethiol vapor for 30 minutes., followed by 10 minutes. baking in a 110° C. vacuum oven. Step 4. The semiconductor was dissolved in a proper solvent such as DCB, CHCl$_3$, 1-methyl-naphthalene at a concentration of ~5-20 mg/mL and then it was spin-coated at 1000-3000 rpm, then dried at 100-200° C. Step 5. The dielectric was deposited by spin coating. Examples of dielectric include PMMA, PS, PtBS, and CYTOP. Gold or silver (30 nm) was thermally evaporated as gate electrode.

All electrical measurement were performed in ambient. To allow comparison with other organic FETs, mobilities (µ) were calculated by standard field effect transistor equations. In traditional metal-insulator-semiconductor FETs (MISFETs), there is typically a linear and saturated regime in the $I_{DS}$ vs $V_{DS}$ curves at different $V_G$ (where $I_{DS}$ is the source-drain saturation current, $V_{DS}$ is the potential between the source and drain, and $V_G$ is the gate voltage). At large $V_{DS}$, the current saturates and is given by:

$$(I_{DS})_{sat}=(WC_i/2L)\mu(V_G-V_t)^2 \quad (1)$$

where L and W are the device channel length and width, respectively, $C_i$ is the capacitance of the oxide insulator (~10 nF/cm$^2$ for ~300 nm SiO$_2$), and $V_t$ is the threshold voltage. Mobilities (µ) were calculated in the saturation regime by rearranging equation (1):

$$\mu_{sat}=(2I_{DS}L)/[WC_i(V_G-V_t)^2] \quad (2)$$

The threshold voltage ($V_t$) can be estimated as the X-axis intercept of the linear section of the plot of $V_G$ versus $(I_{DS})^{1/2}$ (at $V_{DS}$=−100 V).

Table 1 shows device characteristics (including field effect mobility and current on/off ratio) of certain OFETs fabricated with semiconductor materials of current teachings.

TABLE 1

TFT Device Performance

| Compounds | TFT performances | | |
|---|---|---|---|
| | Mobility (cm$^2$/(Vs)) | $I_{ON}/I_{OFF}$ | $V_{ON}$ (V) |
| POL-2 | 0.2 | 10$^5$ | −7 to 10 |
| POL-6 | 2.2E−03 | N/A | −20 |
| POL-12 | 5.3E−02 | 10$^4$ | −20 |
| SM-1 | 2.0E−03 | 10$^4$ | 0 to 5 |

Example 30

Photovoltaic Device Fabrication and Characterization

Photovoltaic devices were fabricated and the characteristics of these devices were tested. The current-voltage curves were measured using a class A solar cell simulator from Spectra-Nova Technologies. The instrument utilizes a xenon lamp passing through a filter that simulates AM1.5G light from 400-1100 nm at 1000 Wm$^{-2}$.

Photovoltaic devices were fabricated incorporating the donor semiconductor of the present teaching and the bucky ball compound PCBM. Other acceptors can be used. Before device fabrication, patterned ITO-coated glass substrates were cleaned by ultrasonic treatment in detergent, de-ionized water, methanol, isopropyl alcohol, acetone sequentially, and UV-ozone treatment for 15 minutes. A PEDOT:PSS layer of about 40 nm thickness was spin-coated from an aqueous solution onto ITO coated glass substrates, followed by baking at 150° C. for 30 minutes in the air. The semiconductor/PCBM mixture solution in chlorinated solvents (such as chloroform) was prepared at a concentration of 2-20(donor semiconductor):2-20(PCBM or other acceptors) mg/ml. The solution was then spin-coated on top of the PEDOT:PSS layer. To complete the device fabrication, a thin layer of lithium fluoride (LiF) and 100 nm thickness of aluminum were successively deposited thermally under vacuum. The active area of the device was about 0.06 cm$^2$. The devices were then encapsulated with a cover glass using a UV curable epoxy in the glove box.

Table 2 shows device characteristics (including PCE, Voc, Jsc, and FF) of certain OPVs fabricated with semiconductor materials according to the present teachings.

TABLE 2

OPV Device Performance

| | Compound | | | |
|---|---|---|---|---|
| | POL-1 | POL-3 | POL-7 | POL-8 |
| PCE [%] | 0.6 | 0.8 | 4.5 | 4.2 |
| Voc [V] | 0.45 | 0.954 | 0.82 | 0.90 |
| Jsc [mA/cm$^2$] | 2.9 | 3.2 | 11.9 | 11.0 |
| FF [%] | 45.8 | 43.8 | 46.1 | 42.4 |

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An electronic, optical or optoelectronic device comprising a polymeric semiconductor component, the polymeric semiconductor component comprising a polymer having the formula:

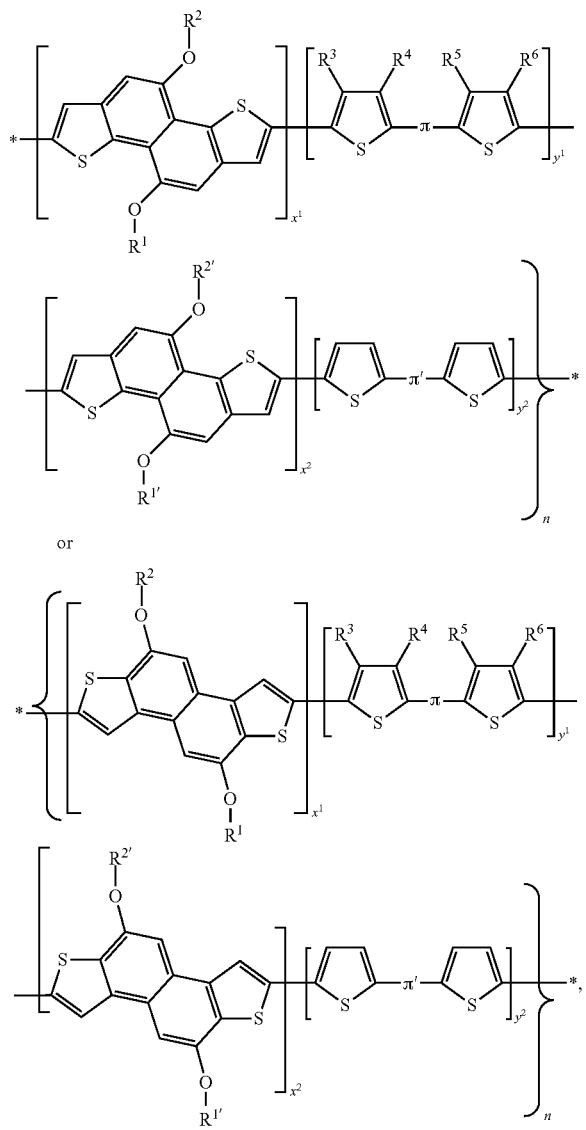

wherein:
R$^1$, R$^{1'}$, R$^2$, and R$^{2'}$ independently are a C$_{1-20}$ alkyl group or a C$_{1-20}$ haloalkyl group;
R$^3$, R$^4$, R$^5$, and R$^6$ independently are H or R$^7$, wherein R$^7$, at each occurrence, independently is selected from the group consisting of a halogen, CN, a C$_{1-20}$ alkyl group, a C$_{1-20}$ haloalkyl group, a C$_{1-20}$ alkoxy group, and a C$_{1-20}$ alkylthio group;
π and π' independently are an optionally substituted polycyclic aryl group, an optionally substituted polycyclic heteroaryl group, or an optionally substituted conjugated linear linker;

n is an integer ranging from 5 to 10,000; and $x^1$, $x^2$, $y^1$, and $y^2$ are real numbers representing mole fractions, wherein $0<x^1<1$, $0<x^2<1$, $0<y^1<1$, $0<y^2<1$, $x^1+x^2=x$, $y^1+y^2=y$, and $x+y=1$; and provided that at least one of the following is true: $R^1$ and $R^2$ are different from $R^{1'}$ and $R^{2'}$, $\pi$ is different from $\pi'$, and $R^3$ and $R^6$ are $R^7$.

2. The device of claim 1, wherein $\pi$ and $\pi'$ independently are an optionally substituted heteroaryl group represented by a formula selected from the group consisting of:

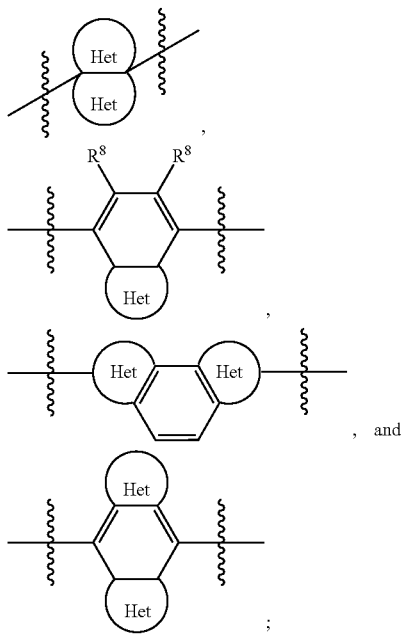

wherein:

$R^8$, at each occurrence, independently is H or $R^7$, wherein $R^7$, at each occurrence, independently is selected from the group consisting of a halogen, CN, a $C_{1-20}$ alkyl group, a $C_{1-20}$ haloalkyl group, a $C_{1-20}$ alkoxy group, and a $C_{1-20}$ alkylthio group; and Het, at each occurrence, is a monocyclic moiety including at least one heteroatom in its ring and optionally substituted with 1-3 $R^9$ groups, wherein $R^9$, at each occurrence, independently is selected from the group consisting of a halogen, CN, an oxo group, a $C_{1-20}$ alkyl group, a $C_{1-20}$ haloalkyl group, a $C_{1-20}$ alkoxy group, and a $C_{1-20}$ alkylthio group.

3. The device of claim 1, wherein $\pi$ and $\pi'$ independently are selected from the group consisting of:

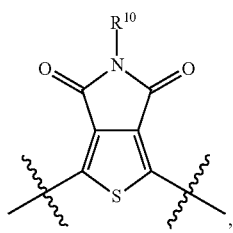

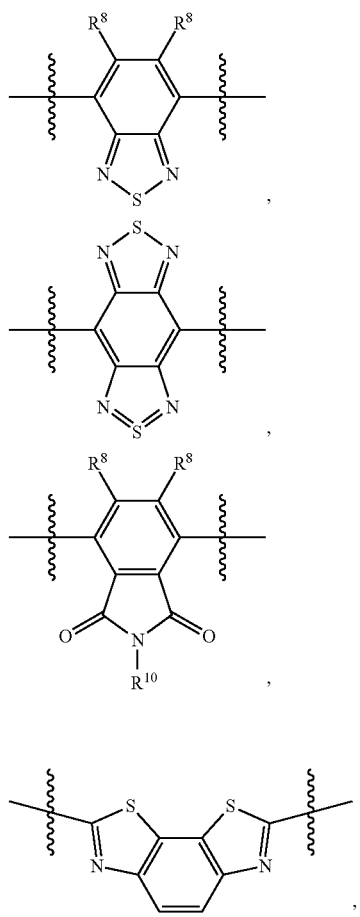

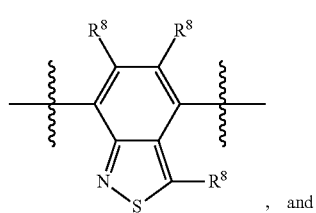

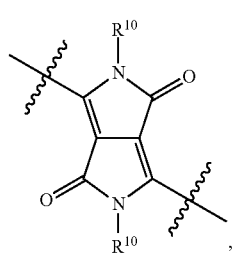

wherein:

$R^8$, at each occurrence, independently is selected from the group consisting of H, a halogen, CN, a $C_{1-20}$ alkyl group, a $C_{1-20}$ haloalkyl group, a $C_{1-20}$ alkoxy group, and a $C_{1-20}$ alkylthio group; and $R^{10}$, at each occurrence, independently is a $C_{1-20}$ alkyl group or a $C_{1-20}$ haloalkyl group.

4. The device of claim 1, wherein π and π' independently are selected from the group consisting of:

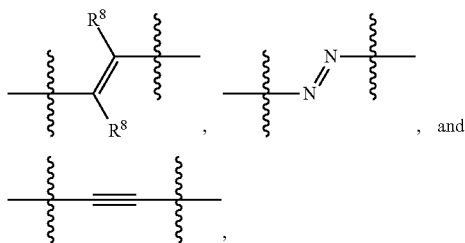

wherein $R^8$, at each occurrence, independently is H or $R^7$, wherein $R^7$, at each occurrence, independently is selected from the group consisting of a halogen, CN, a $C_{1-20}$ alkyl group, a $C_{1-20}$ haloalkyl group, a $C_{1-20}$ alkoxy group, and a $C_{1-20}$ alkylthio group.

5. The device of claim 1, wherein x and y are real numbers representing mole fractions and wherein $0.2<x<0.8$ and $0.2<y<0.8$, provided that the sum of x and y is about 1.

6. The device of claim 5, wherein $R^3$ and $R^6$ are selected from the group consisting of a $C_{1-20}$ alkyl group, a $C_{1-20}$ haloalkyl group, a $C_{1-20}$ alkoxy group, and a $C_{1-20}$ alkylthio group; and $R^4$ and $R^5$ are H.

7. The device of claim 6, wherein π and π' are

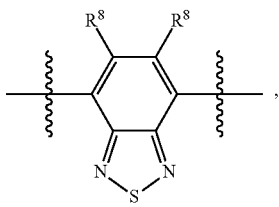

wherein $R^8$, at each occurrence, independently is H or a halogen.

8. The device of claim 6, wherein π and π' are

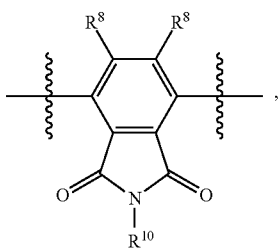

wherein $R^8$, at each occurrence, independently is selected from the group consisting of H, a halogen, CN, a $C_{1-20}$ alkyl group, a $C_{1-20}$ haloalkyl group, a $C_{1-20}$ alkoxy group, and a $C_{1-20}$ alkylthio group; and $R^{10}$, at each occurrence, independently is a $C_{1-20}$ alkyl group or a $C_{1-20}$ haloalkyl group.

9. The device of claim 6, wherein π and π' are

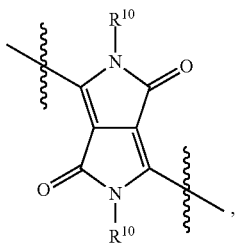

wherein $R^{10}$, at each occurrence, independently is a $C_{1-20}$ alkyl group or a $C_{1-20}$ haloalkyl group.

10. The device of claim 6, wherein π and π' are

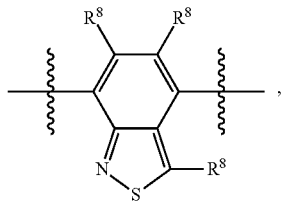

wherein $R^8$, at each occurrence, independently is selected from the group consisting of H, a halogen, CN, a $C_{1-20}$ alkyl group, a $C_{1-20}$ haloalkyl group, a $C_{1-20}$ alkoxy group, and a $C_{1-20}$ alkylthio group.

11. The device of claim 6, wherein π and π' are

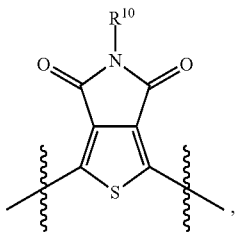

wherein $R^{10}$, at each occurrence, independently is a $C_{1-20}$ alkyl group or a $C_{1-20}$ haloalkyl group.

12. The device of claim 1 configured as a thin film transistor comprising a substrate, a source electrode, a drain electrode, a gate electrode, a gate dielectric component, and a polymeric semiconductor component according to claim 1, wherein the polymeric semiconductor component is in contact with the source electrode and the drain electrode, and the gate dielectric component is in contact with the polymeric semiconductor component on one side and the gate electrode on an opposite side.

13. The device of claim 1, wherein the polymeric semiconductor component is photoactive.

14. The device of claim 13 configured as a photovoltaic device comprising a substrate, an anode, a cathode, and a photoactive semiconductor component according to claim 11 disposed between the anode and the cathode.

15. The device of claim 14, wherein the photoactive semiconductor component comprises a blend material comprising an electron acceptor material.

* * * * *